United States Patent
Ando et al.

(10) Patent No.: US 8,232,039 B2
(45) Date of Patent: *Jul. 31, 2012

(54) POLYMER AND RESIST COMPOSITION COMPRISING THE SAME

(75) Inventors: Nobuo Ando, Toyonaka (JP); Kazuhiko Hashimoto, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 166 days.

This patent is subject to a terminal disclaimer.

(21) Appl. No.: 12/612,557

(22) Filed: Nov. 4, 2009

(65) Prior Publication Data

US 2010/0124719 A1 May 20, 2010

(30) Foreign Application Priority Data

Nov. 14, 2008 (JP) ................................. 2008-291963

(51) Int. Cl.
G03F 7/004 (2006.01)
C08F 232/08 (2006.01)
C08F 224/00 (2006.01)

(52) U.S. Cl. ..................... 430/270.1; 430/905; 430/910; 526/270; 526/281; 526/282; 526/308; 526/346

(58) Field of Classification Search ............... 430/270.1, 430/326, 910, 905; 526/270, 281, 282, 308, 526/346
See application file for complete search history.

(56) References Cited

U.S. PATENT DOCUMENTS

| | | | |
|---|---|---|---|
| 6,479,211 B1 | 11/2002 | Sato | |
| 7,202,010 B2 | 4/2007 | Yamada et al. | 430/270.1 |
| 7,439,006 B2 | 10/2008 | Yoshida | |
| 7,556,908 B2 | 7/2009 | Takemoto | |
| 2003/0054286 A1 | 3/2003 | Sato | |
| 2003/0099900 A1 | 5/2003 | Yamada | |
| 2003/0180663 A1 | 9/2003 | Namba | |
| 2003/0219680 A1 | 11/2003 | Nishimura | |
| 2005/0078269 A1 | 4/2005 | Hsiao | |
| 2005/0130058 A1 | 6/2005 | Rahman | |
| 2007/0027336 A1 | 2/2007 | Yoshida | |
| 2007/0249192 A1 | 10/2007 | Tsurumi | |
| 2008/0081293 A1 | 4/2008 | Harada | |
| 2009/0214982 A1* | 8/2009 | Shimizu et al. | 430/285.1 |
| 2010/0075257 A1* | 3/2010 | Takemoto et al. | 430/286.1 |

FOREIGN PATENT DOCUMENTS

| | | |
|---|---|---|
| JP | 11-052575 | 2/1999 |
| JP | 11-218924 A | 8/1999 |
| JP | 2000-178325 | 6/2000 |
| JP | 2003-005374 | 1/2003 |
| JP | 2003-107708 | 4/2003 |
| JP | 2003-147019 A | 5/2003 |
| JP | 2007-249192 | 9/2007 |

* cited by examiner

Primary Examiner — John Chu
(74) Attorney, Agent, or Firm — Hogan Lovells US LLP

(57) ABSTRACT

A polymer comprising a structural unit represented by the formula (I):

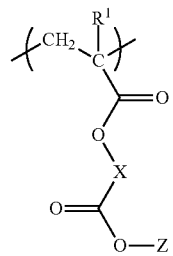

(I)

wherein $R^1$ represents a hydrogen atom or a methyl group, X represents a linear or branched chain C1-C6 alkylene group, Z represents a group represented by the formula (Ia):

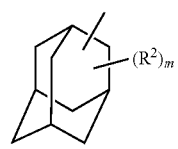

(Ia)

wherein $R^2$ is independently in each occurrence a linear or branched chain C1-C6 alkyl group and m represents an integer of 0 to 15, and a structural unit represented by the formula (II):

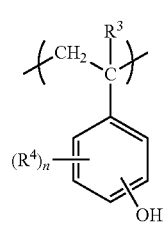

(II)

wherein $R^3$ represents a hydrogen atom or a methyl group, $R^4$ is independently in each occurrence a linear or branched chain C1-C6 alkyl group and n represents an integer of 0 to 4.

9 Claims, No Drawings

POLYMER AND RESIST COMPOSITION COMPRISING THE SAME

This nonprovisional application, claims priority under 35 U.S.C. §119(a) on Patent Application No. 2008-291963 filed in JAPAN on Nov. 14, 2008, the entire contents of which are hereby incorporated by reference.

FIELD OF THE INVENTION

The present invention relates to a polymer and a resist composition comprising the same.

BACKGROUND OF THE INVENTION

A resist composition used for semiconductor microfabrication employing a lithography process contains an acid generator comprising a compound generating an acid by irradiation.

In semiconductor microfabrication, it is desirable to form patterns having high sensitivity and high resolution and good pattern profile such as shape of the pattern, and it is expected for a chemically amplified resist composition to give such patterns.

US 2003/0099900 A1 discloses a polymer having a structural unit derived from 2-ethyl-2-adamantyl methacrylate and a structural unit derived from p-hydroxystyrene, and a resist composition comprising the polymer.

SUMMARY OF THE INVENTION

The present invention is to provide a polymer and a resist composition containing the same.

The present invention relates to the followings:

<1> A polymer comprising a structural unit represented by the formula (I):

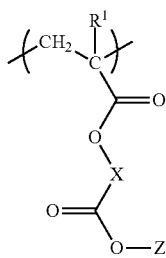

(I)

wherein $R^1$ represents a hydrogen atom or a methyl group, X represents a linear or branched chain C1-C6 alkylene group, Z represents a group represented by the formula (Ia):

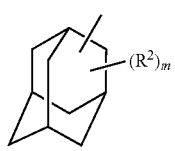

(Ia)

wherein $R^2$ is independently in each occurrence a linear or branched chain C1-C6 alkyl group and m represents an integer of 0 to 15, and a structural unit represented by the formula (II):

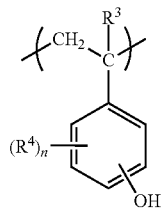

(II)

wherein $R^3$ represents a hydrogen atom or a methyl group, $R^4$ is independently in each occurrence a linear or branched chain C1-C6 alkyl group and n represents an integer of 0 to 4;

<2> The polymer according to <1>, wherein the polymer further contains at least one structural unit selected from the group consisting of a structural unit derived from styrene, a structural units having one or more hydroxyl groups in its side chain other than the structural unit represented by the formula (II) and a structural unit having a lactone ring;

<3> The polymer according to <2>, wherein the structural units having one or more hydroxyl groups in its side chain other than the structural unit represented by the formula (II) is a structural unit represented by the formula (III):

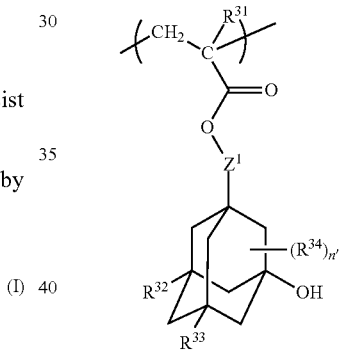

(III)

wherein $R^{31}$ represents a hydrogen atom or a methyl group, $R^{32}$ and $R^{33}$ each independently represents a hydrogen atom, a methyl group or a hydroxyl group, $R^{34}$ represents a methyl group, n' represents an integer of 0 to 10, $Z^1$ represents a single bond or $-(CH_2)_y-CO-O-$ and y represents an integer of 1 to 4;

<4> The polymer according to <2> or <3>, wherein the structural unit having a lactone ring is a structural unit represented by the formula (IVa), (IVb) or (IVc):

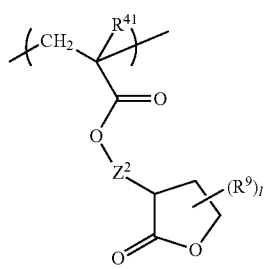

(IVa)

-continued

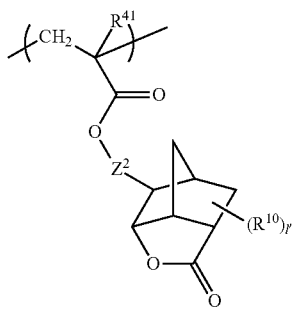
(IVb)

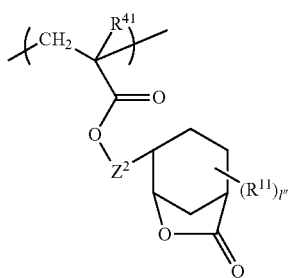
(IVc)

wherein $R^{41}$ represents a hydrogen atom or a methyl group, $R^9$ represents a methyl group, $Z^2$ represents a single bond or —$(CH_2)_z$—CO—O—, z represents an integer of 1 to 4, $R^{10}$ is independently in each occurrence a carboxyl group, a cyano group, or a C1-C4 aliphatic hydrocarbon group, l represents an integer of 0 to 5, l' represents an integer of 0 to 9 and l" represents an integer of 0 to 9;

<5> The polymer according to <2> or <3>, wherein the structural unit having a lactone ring is a structural unit represented by the formula (IVb):

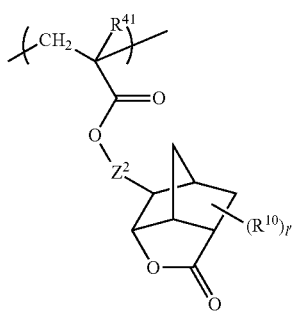
(IVb)

wherein $R^{41}$ represents a hydrogen atom or a methyl group, $Z^2$ represents a single bond or —$(CH_2)_z$—CO—O—, z represents an integer of 1 to 4, is independently in each occurrence a carboxyl group, a cyano group, or a C1-C4 aliphatic hydrocarbon group, and l' represents an integer of 0 to 9;

<6> A resist composition comprising the polymer according to any one of <1> to <5> and an acid generator;

<7> The resist composition according to <6>, wherein the acid generator is a salt represented by the formula (V):

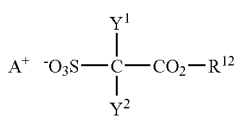
(V)

wherein $A^+$ represents an organic counter ion, $Y^1$ and $Y^2$ each independently represent a fluorine atom or a C1-C6 perfluoroalkyl group, $R^{12}$ represents a C1-C30 hydrocarbon group which may have one or more substituents selected from the group consisting of a C1-C6 alkoxy group, a C1-C4 perfluoroalkyl group, a C1-C6 hydroxyalkyl group, a hydroxyl group and a cyano group, and in which one or more —$CH_2$— may be replace by —CO— or —O—;

<8> Use of the polymer according to any one of <1> to <5> for producing a resist composition for extreme ultraviolet lithography or electron beam lithography;

<9> Use of the resist composition according to <6> or <7> for extreme ultraviolet lithography or electron beam lithography.

DESCRIPTION OF PREFERRED EMBODIMENTS

The present polymer comprises a structural unit represented by the formula (I):

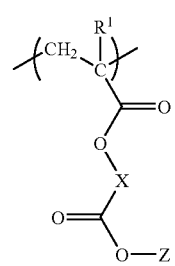
(I)

(hereinafter, simply referred to as the structural unit (I)) and a structural unit represented by the formula (II):

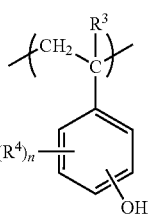
(II)

(hereinafter, simply referred to as the structural unit (II)).

In the formula (I), $R^1$ represents a hydrogen atom or a methyl group, and X represents a linear or branched chain C1-C6 alkylene group. Examples of the linear or branched chain C1-C6 alkylene group include a methylene group, an ethylene group, a trimethylene group, a tetramethylene group, a 2-methylbutylene group, a pentamethylene group and a hexamethylene group, and a methylene group and an ethylene group are preferable.

In the formula (I), Z represents a group represented by the formula (Ia):

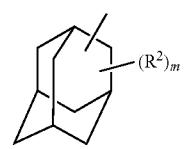
(Ia)

In the formula (Ia), $R^2$ is independently in each occurrence a linear or branched chain C1-C6 alkyl group and examples thereof include a methyl group, an ethyl group, a propyl group, an isopropyl group, a butyl group, an isobutyl group, a sec-butyl group, a tert-butyl group, a pentyl group and a hexyl group, and a C1-C3 alkyl group is preferable and a methyl group and an ethyl group are more preferable, and a methyl group is especially preferable. In the formula (Ia), m represents an integer of 0 to 15, and m is preferably 0 or 1, and more preferably 0.

Z is preferably a group represented by the formula (Ib):

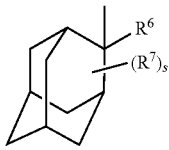

(Ib)

wherein $R^6$ represents a linear or branched chain C1-C6 alkyl group, $R^7$ is independently in each occurrence a linear or branched chain C1-C6 alkyl group and s represents an integer of 0 to 14. The group represented by the formula (Ib) wherein s is 0 is preferable. The group represented by the formula (Ib) wherein $R^6$ is a methyl group, an ethyl group or an isopropyl group is preferable. The group represented by the formula (Ib) wherein s is 0 and $R^6$ is a methyl group, an ethyl group or an isopropyl group is more preferable.

Examples of the structural unit (I) include the followings.

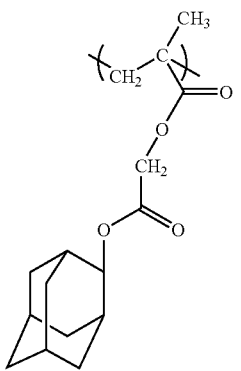

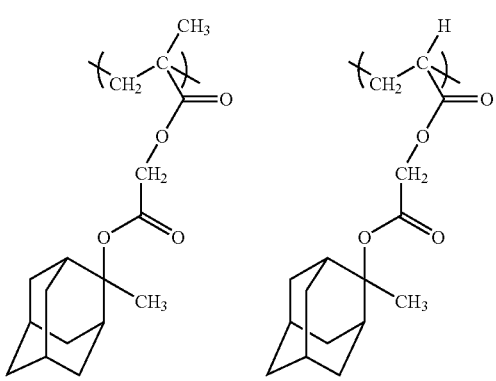

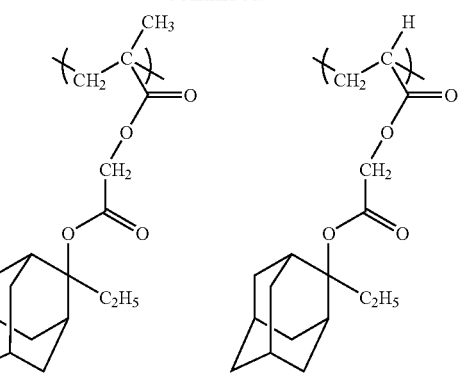

-continued

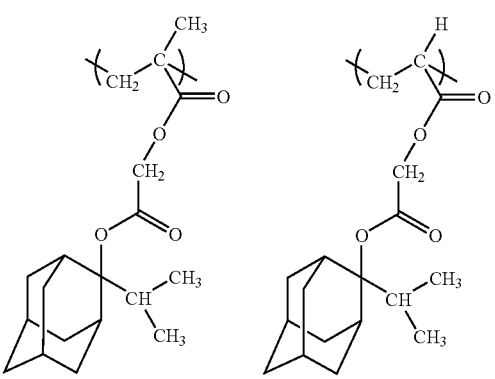

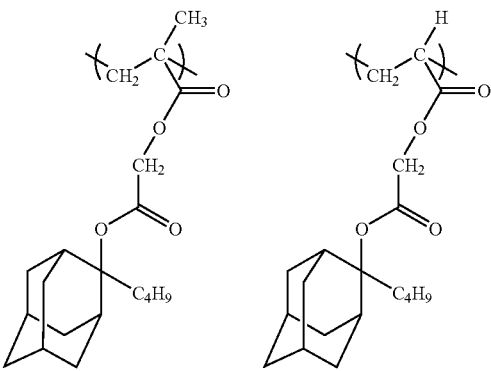

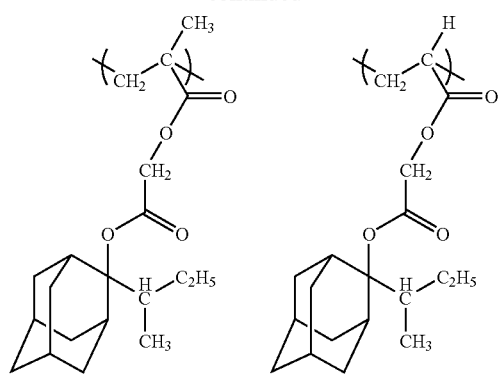
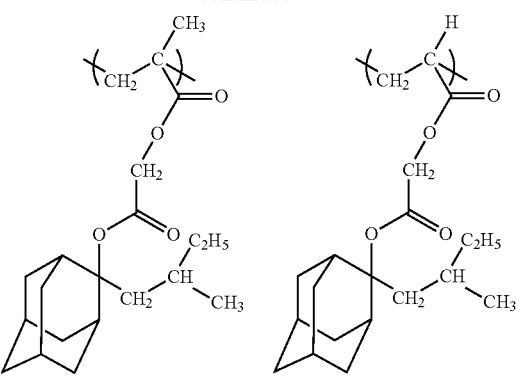
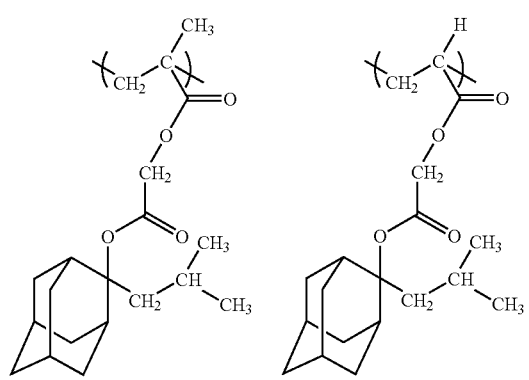
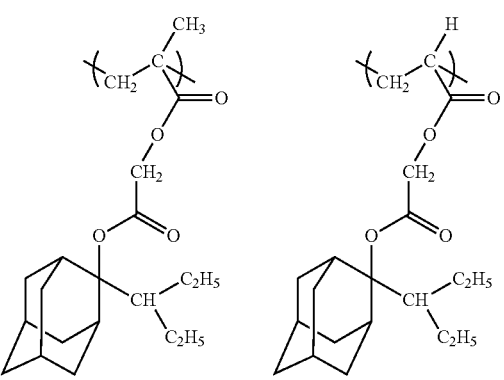
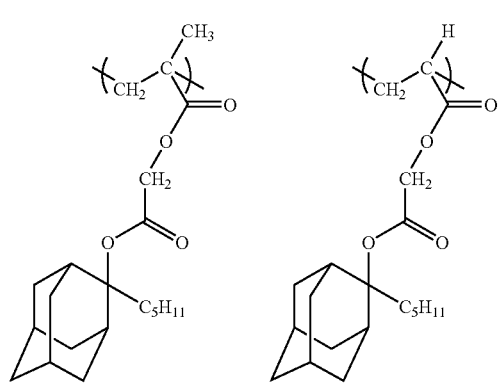
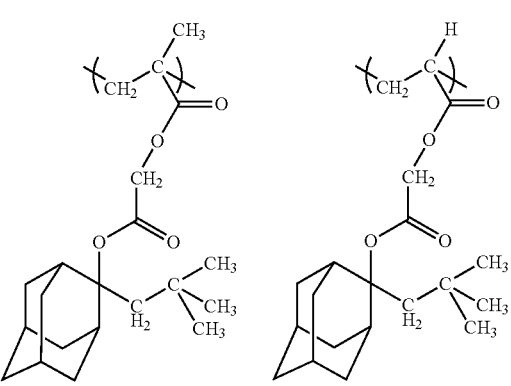
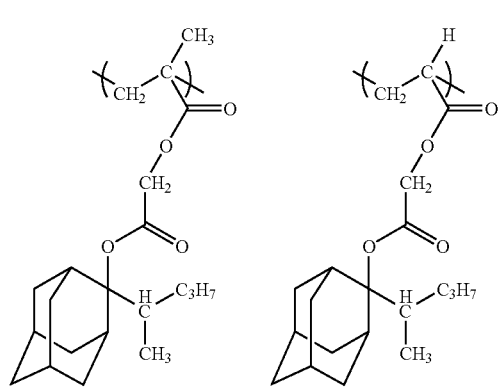
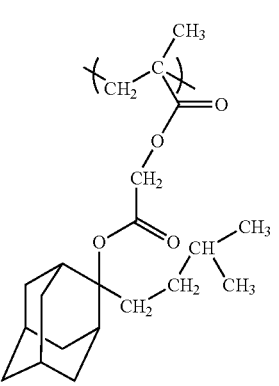

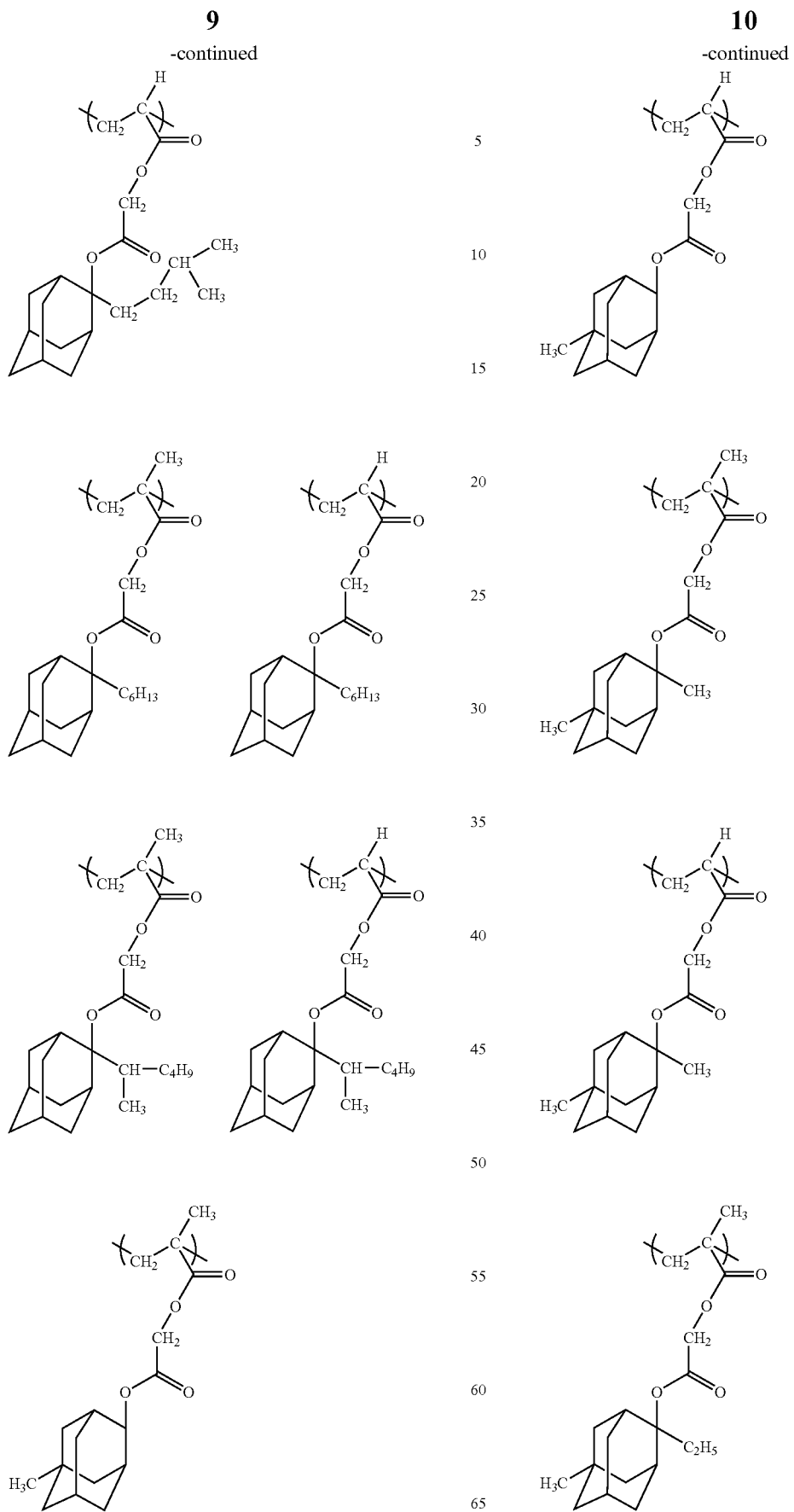

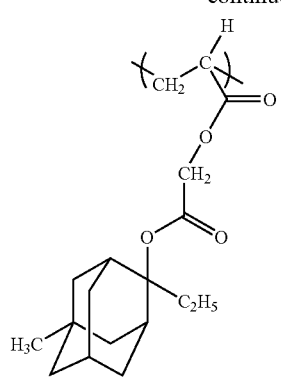
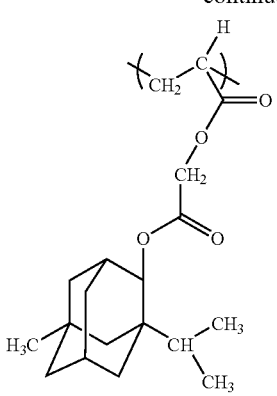
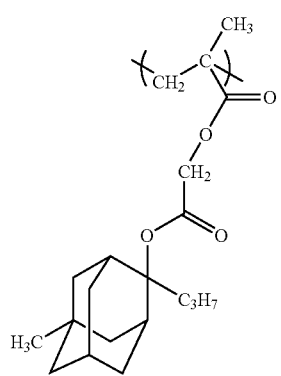
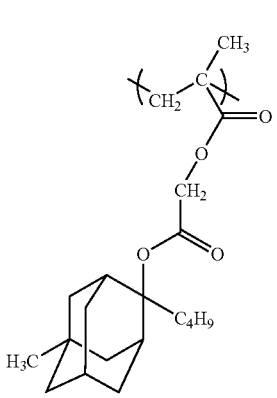
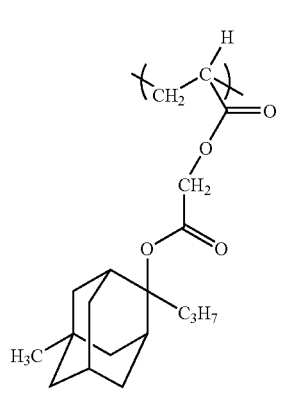
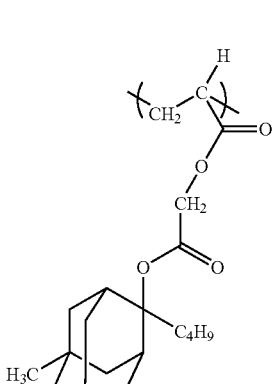
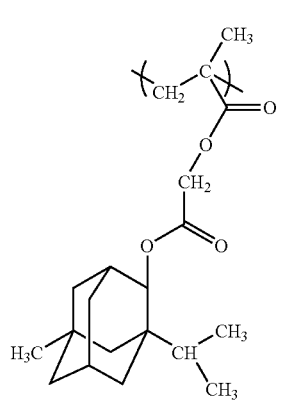
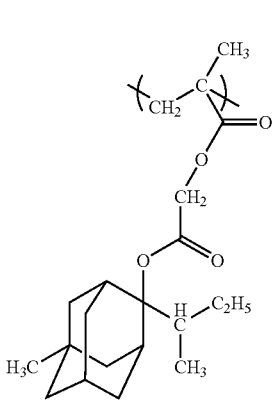

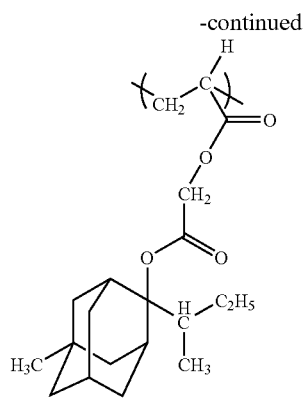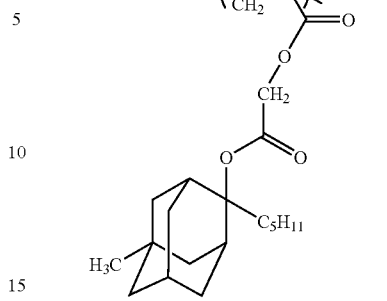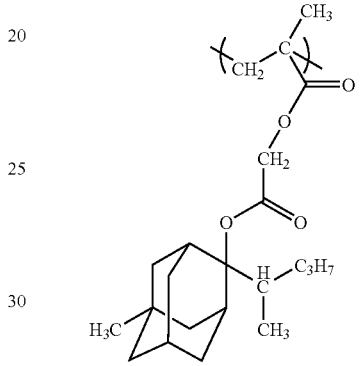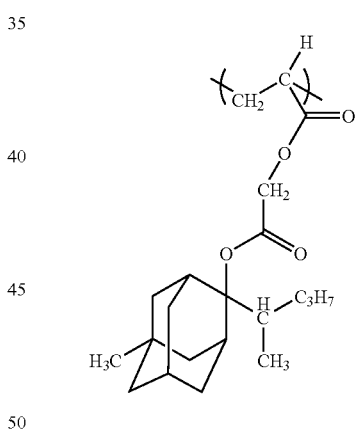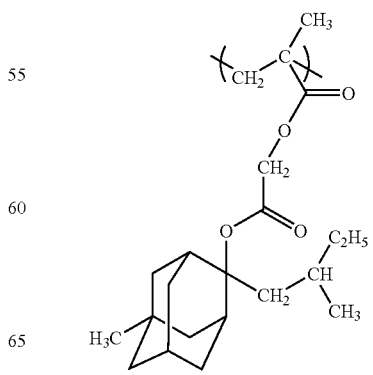

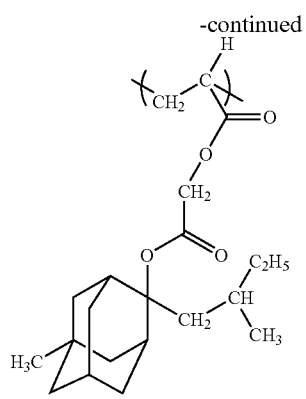
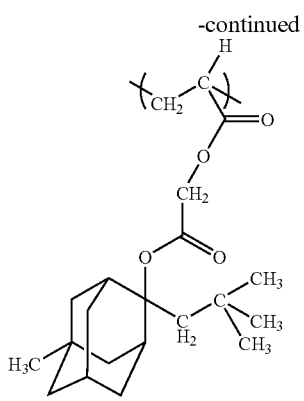
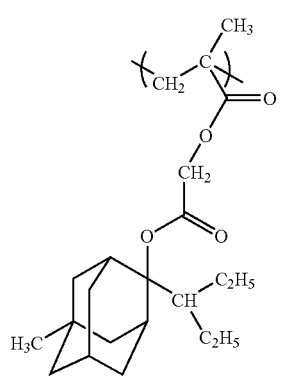
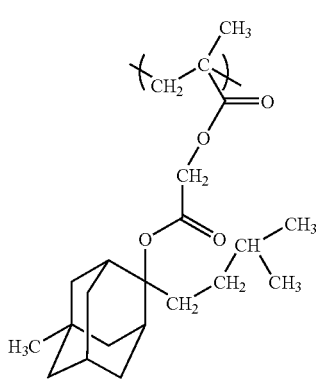
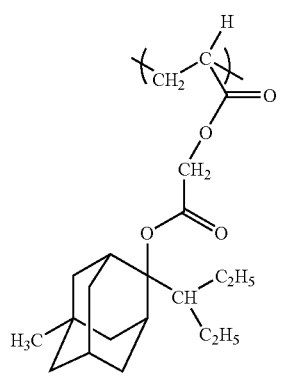
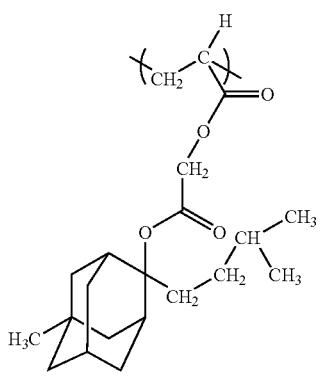
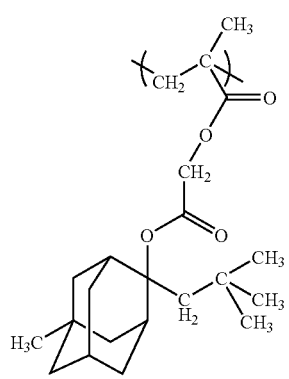
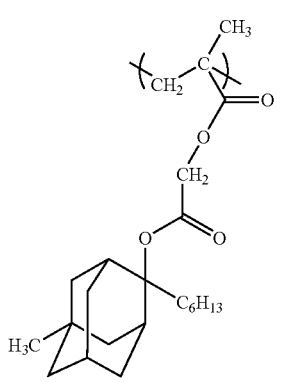

-continued
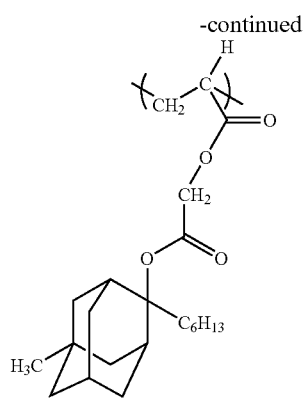
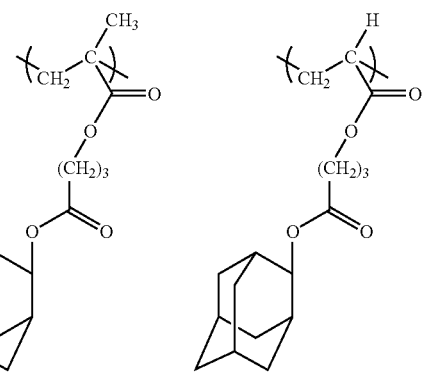
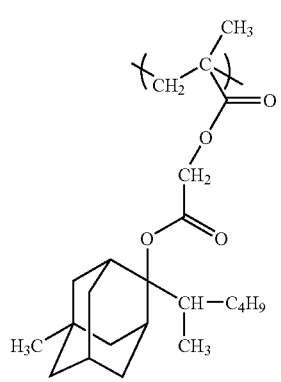
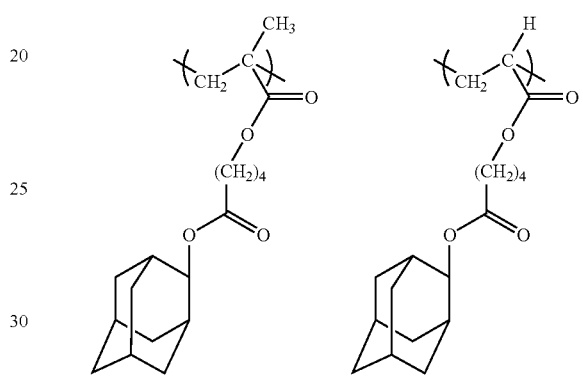
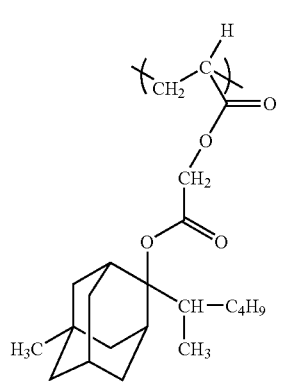
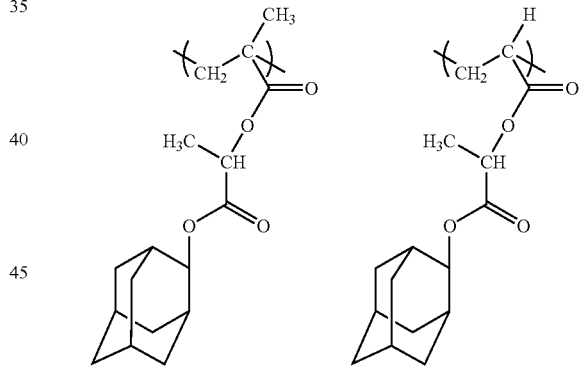
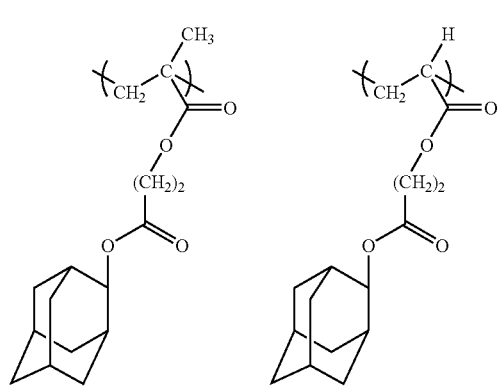
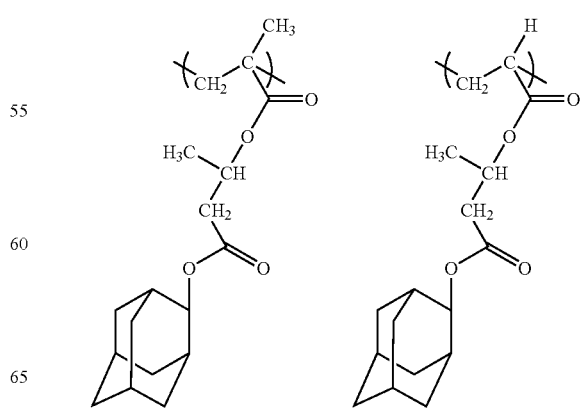

-continued
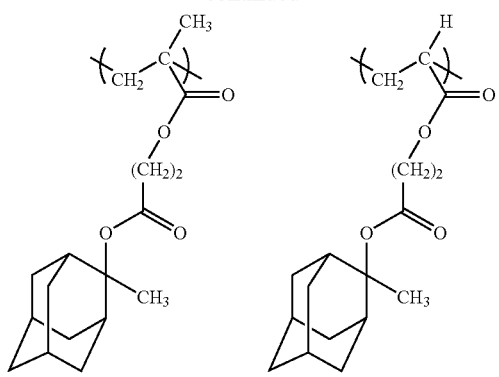
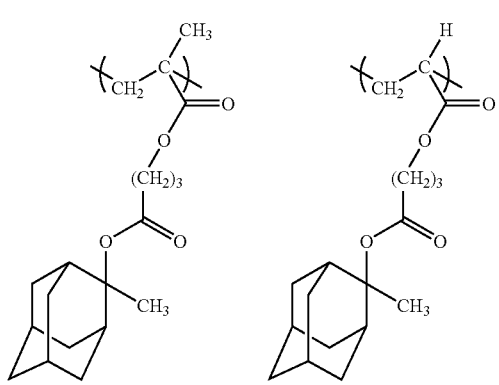
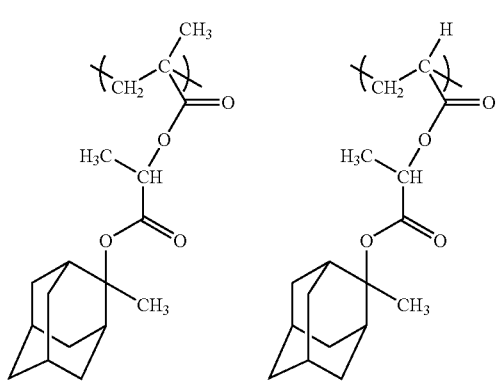
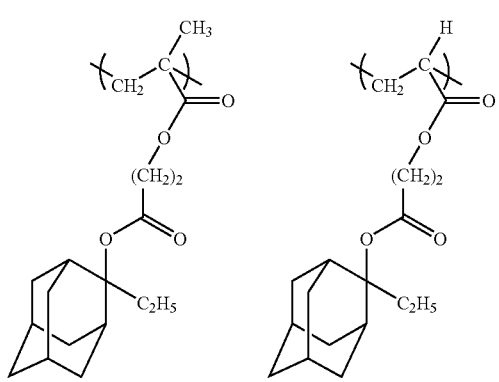
-continued
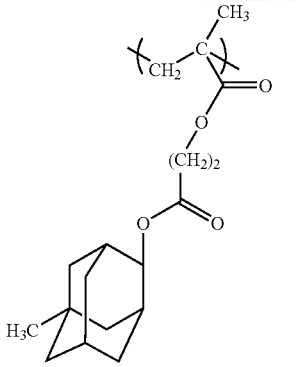
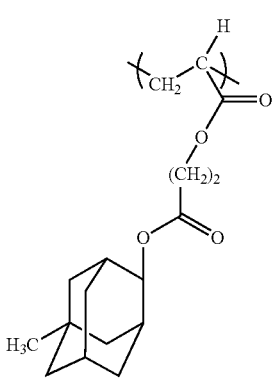
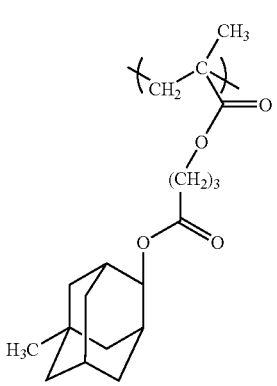
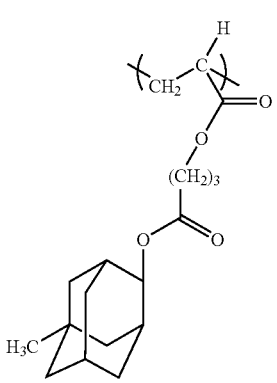

-continued

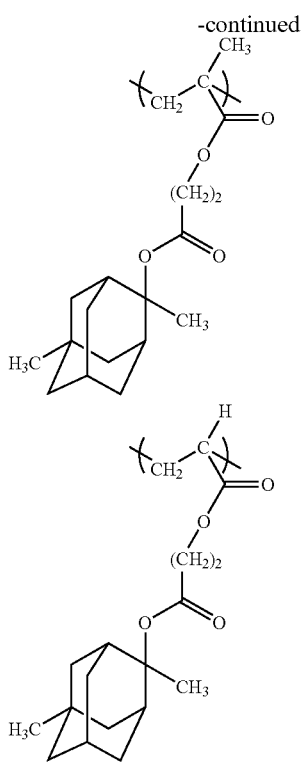

Among them, a structural unit derived from 2-alkyl-2-adamantyloxycarbonylmethyl acrylate and a structural unit derived from 2-alkyl-2-adamantyloxycarbonylmethyl methacrylate are preferable, and 2-methyl-2-adamantyloxycarbonylmethyl acrylate, a structural unit derived from 2-methyl-2-adamantyloxycarbonylmethyl methacrylate, 2-ethyl-2-adamantyloxycarbonylmethyl acrylate and a structural unit derived from 2-ethyl-2-adamantyloxycarbonylmethyl methacrylate are more preferable.

The structural unit (I) can be derived from a monomer represented by the formula (I-1):

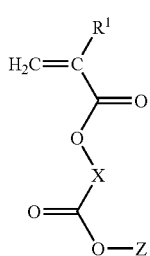

(I-1)

wherein $R^1$, X and Z are the same as defined above. The monomer represented by the formula (I-1) can be produced by reacting a haloalkanoic acid adamantyl ester with acrylic acid or methacrylic acid in the presence of a base. The monomer represented by the formula (I-1) can be also produced by reacting a hydroxyalkanoic adamantyl ester with acrylic acid halide or methacrylic acid halide in the presence of a base.

In the formula (II), $R^3$ represents a hydrogen atom or a methyl group, $R^4$ is independently in each occurrence a linear or branched chain C1-C6 alkyl group. Examples of the linear or branched chain C1-C6 alkyl group include the same as described above, and a methyl group is preferable. In the formula (II), n represents an integer of 0 to 4, and n is preferably 0 or 1, and more preferably 0.

In the formula (II), a hydroxyl group may be bonded at ortho-position, meta-position or para-position.

The structural unit represented by the following formula:

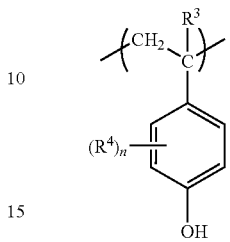

wherein $R^3$, $R^4$ and n are the same meanings as defined above, is preferable.

Examples of the structural unit (II) include the followings.

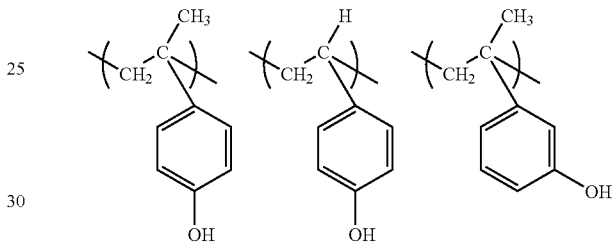

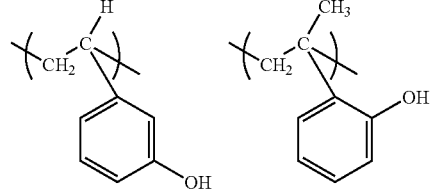

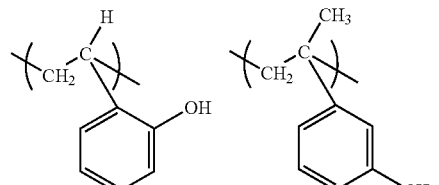

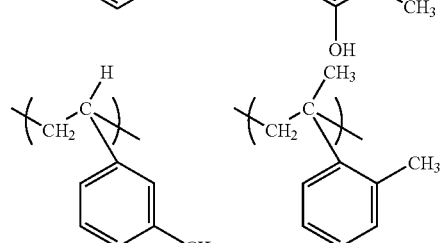

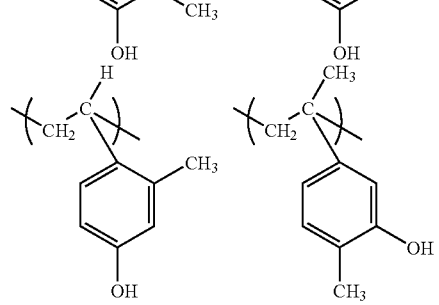

-continued

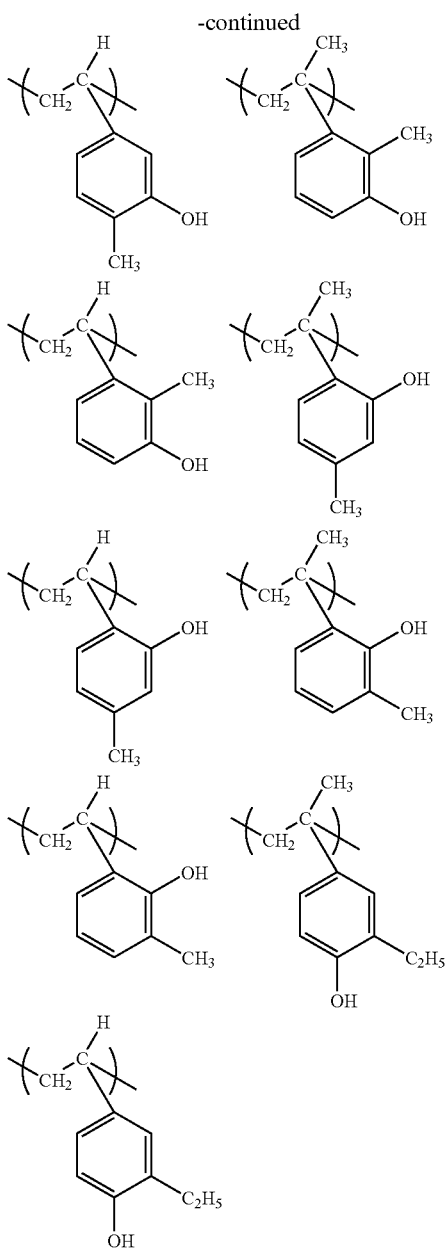

Among them, a structural unit derived from 4-hydroxystyrene and a structural unit derived from 4-hydroxy-α-styrene are preferable.

The structural unit (II) can be derived from a monomer represented by the formula (II-1):

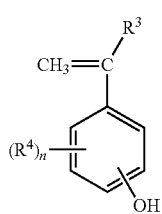

(II-1)

wherein $R^3$, $R^4$ and n are the same as defined above.

The polymer of the present invention may contain two or more kinds of the structural unit (I) and may contain two or more kinds of the structural unit (II).

The molar ratio of the structural unit (I) to the structural unit (II) in the present polymer (the structural unit (I)/the structural unit (II)) is usually 10/90 to 90/10 and preferably 20/80 to 70/30 from the viewpoint of resolution and pattern profile.

The weight-average molecular weight of the present polymer is usually 1,000 to 500,000 and preferably 2,000 to 50,000.

The polymer of the present invention may contain one or more structural units in addition to the structural units (I) and (II). Examples of said structural unit include a structural unit derived from styrene, a structural unit having one or more hydroxyl groups in its side chain other than the structural unit (II), and a structural unit having a lactone ring. The content of said structural units is usually 5 to 90 mol %, preferably 10 to 85 mol % and more preferably 15 to 80 mol % based on the total molar of all structural units. In this specification, —OH of a carboxyl group is not a hydroxyl group.

The polymer of the present invention preferably contains at least one structural unit selected from the group consisting of a structural unit derived from styrene, a structural unit having one or more hydroxyl groups in its side chain other than the structural unit (II), and a structural unit having a lactone ring.

When the present polymer contains the structural unit derived from styrene, the content of the structural unit derived from styrene in the present polymer is usually 5 to 90 mol %, preferably 10 to 85 mol % and more preferably 15 to 80 mol % based on the total molar of all structural units.

Examples of the structural unit having one or more hydroxyl groups in its side chain include a structural unit derived from an acrylic acid hydroxyl-substituted cycloalkyl ester such as acrylic acid hydroxycyclopentyl ester and acrylic acid hydroxycyclohexy ester, a structural unit derived from a methacrylic acid hydroxyl-substituted cycloalkyl ester such as methacrylic acid hydroxycyclopentyl ester and methacrylic acid hydroxycyclohexy ester, a structural unit derived from an acrylic acid hydroxyl-substituted polycyclic hydrocarbon ester such as acrylic acid hydroxynorbornyl ester, acrylic acid hydroxyl-1-adamantyl ester and acrylic acid hydroxyl-2-adamantyl ester, and a structural unit derived from a methacrylic acid hydroxyl-substituted polycyclic hydrocarbon ester such as methacrylic acid hydroxynorbornyl ester, methacrylic acid hydroxyl-1-adamantyl ester and methacrylic acid hydroxyl-2-adamantyl ester.

Among the structural units having one or more hydroxyl groups in its side chain, a structural unit represented by the formula (III):

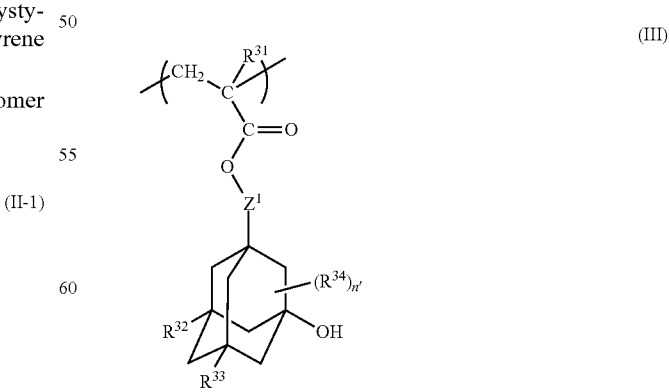

(III)

wherein $R^{31}$ represents a hydrogen atom or a methyl group, $R^{32}$ and $R^{33}$ each independently represents a hydrogen atom, a methyl group or a hydroxyl group, $R^{34}$ represents a methyl group, n' represents an integer of 0 to 10, $Z^1$ represents a single bond or $-(CH_2)_y-CO-O-$ and y represents an integer of 1 to 4, is preferable, and a structural unit represented by the formula (III) wherein n' is 0 or 1 is more preferable.
Examples of the structural unit represented by the formula (III) include the followings.
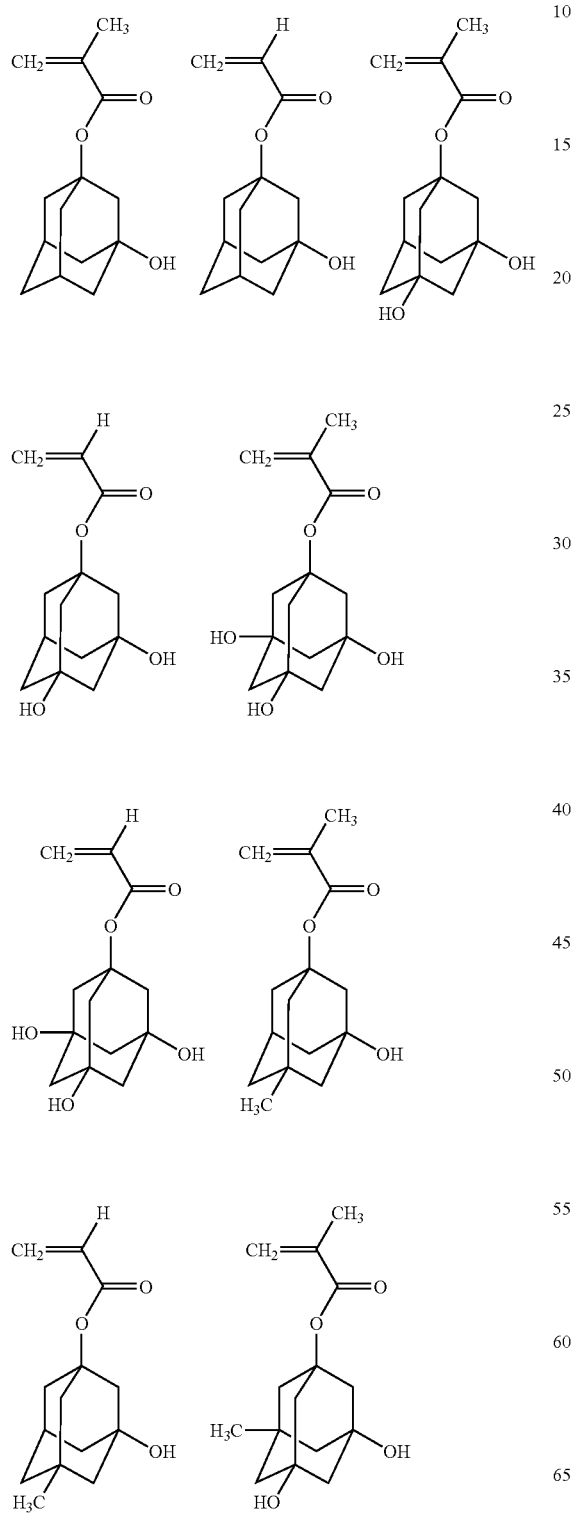
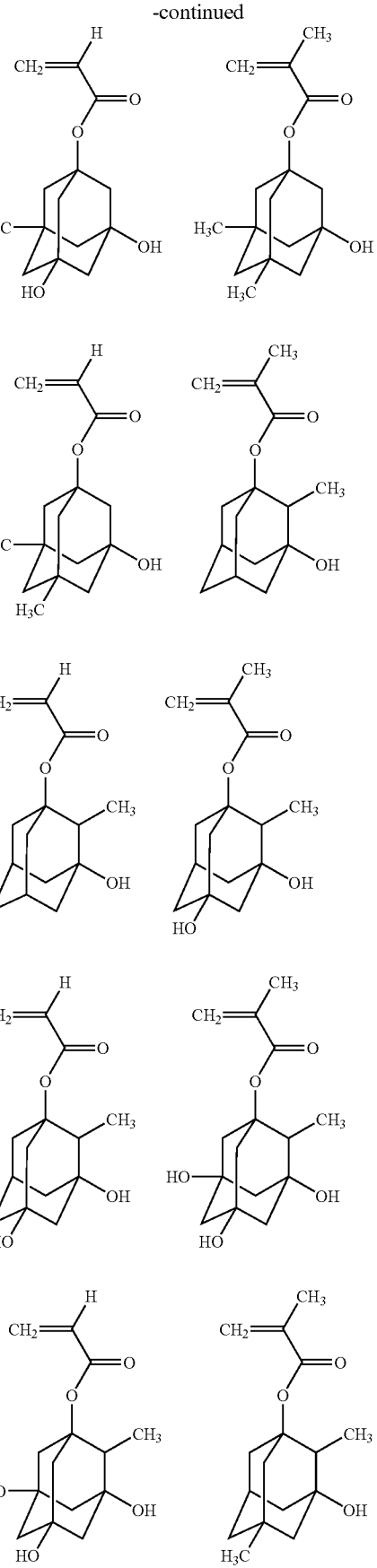

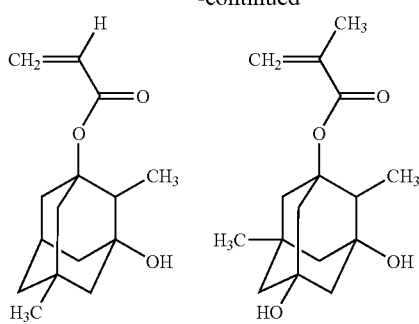
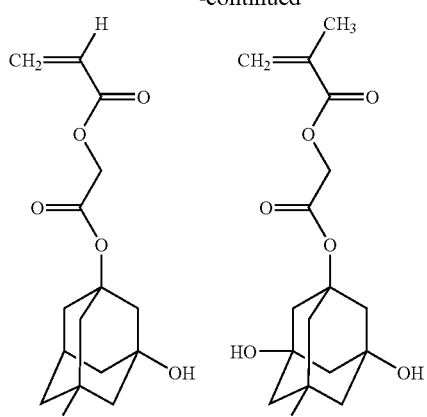
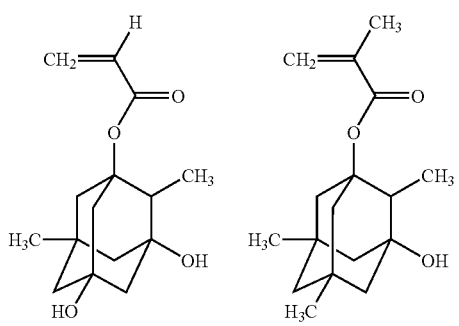
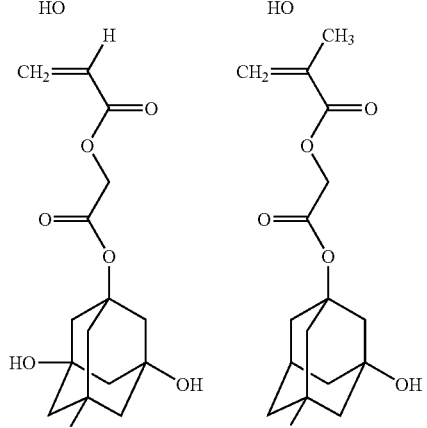
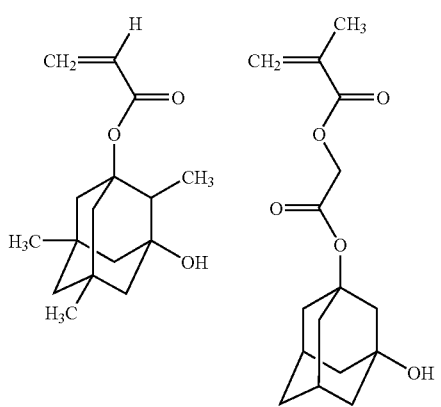
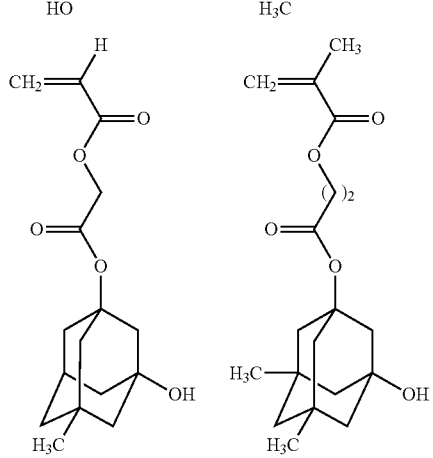
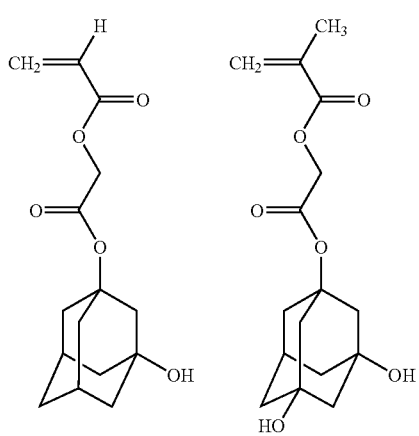
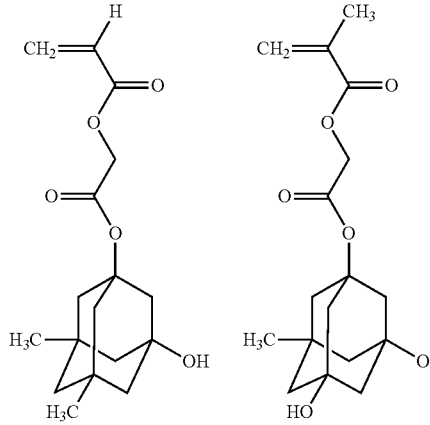

-continued

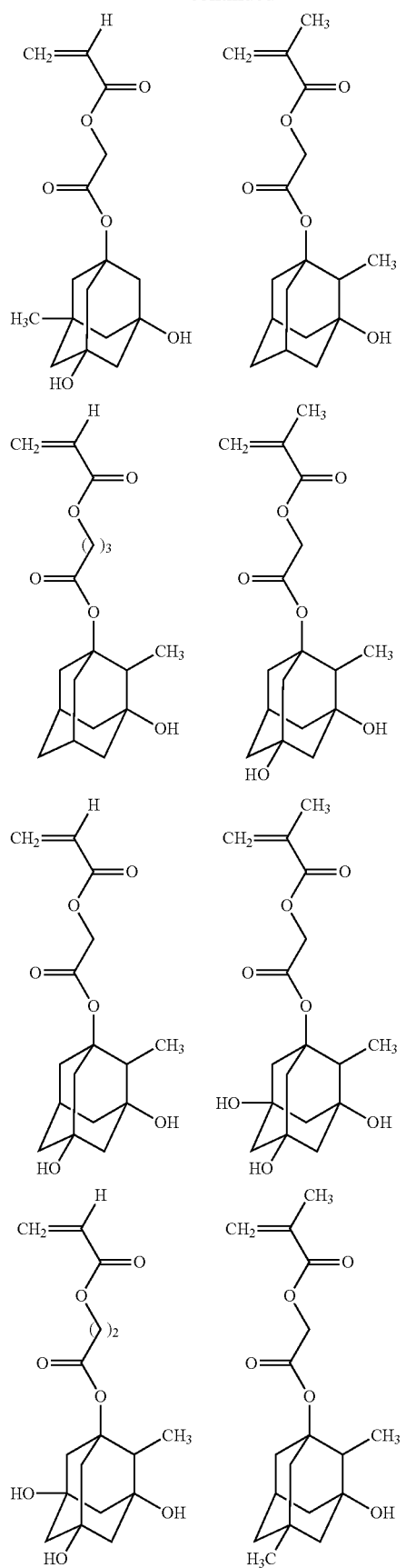
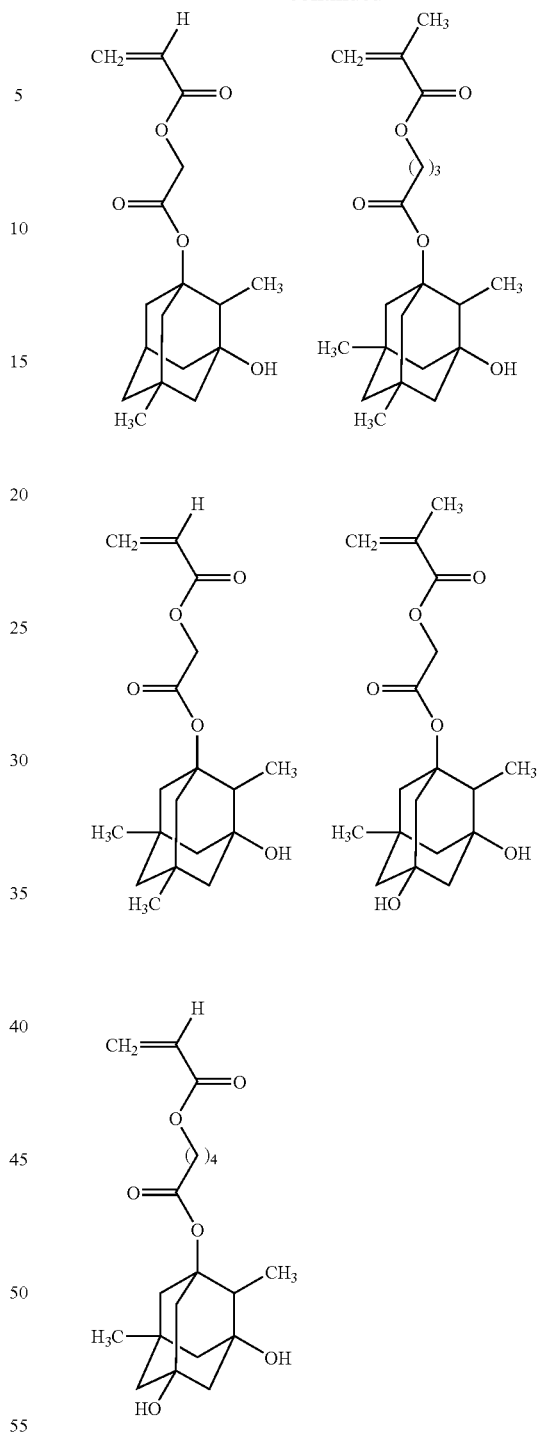

Among them, 3-hydroxy-1-adamantyl acrylate, 3-hydroxy-1-adamantyl methacrylate, 3,5-dihydroxy-1-adamantyl acrylate, 3,5-dihydroxy-1-adamantyl methacrylate, (3,5-dihydroxy-1-adamantyloxycarbonyl)methyl acrylate and (3,5-dihydroxy-1-adamantyloxycarbonyl)methyl methacrylate are preferable from the viewpoint of resolution.

The structural unit represented by the formula (III) can be derived from a monomer represented by the following formula:

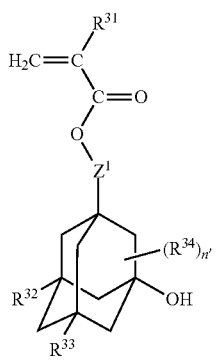

wherein $R^{31}$, $R^{32}$, $R^{33}$, $R^{34}$, $Z^1$ and n' are the same as defined above.

The present invention may have two or more kinds of the structural unit represented by the formula (III).

The monomer represented by the above-mentioned formula can be produced by a reaction of the corresponding hydroxyl-containing adamantane compound with an acrylic halide or a methacrylic halide.

When the present polymer contains the structural unit having one or more hydroxyl groups in its side chain such as the structural unit represented by the formula (III), the content of the structural unit having one or more hydroxyl groups in its side chain in the present polymer is usually 3 to 40 mol %, preferably 5 to 35 mol %, and more preferably 5 to 40 mol % based on the total molar of all structural units.

Examples of the structural unit having a lactone ring include a structural unit having a β-butyrolactone ring, a structural unit having a γ-butyrolactone ring, a structural unit having a condensed ring composed of a cycloalkane ring and a lactone ring, and a structural unit having a condensed ring composed of a norbornane ring and a lactone ring.

Among the structural units having a lactone ring, a structural unit represented by the formulae (IVa), (IVb) and (IVc):

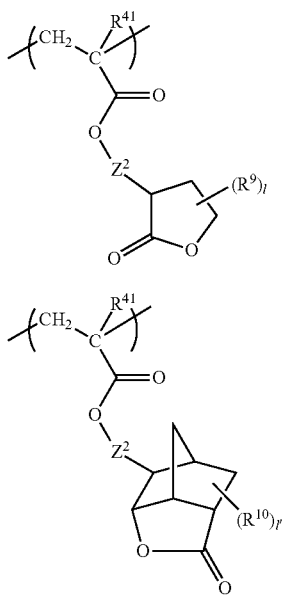

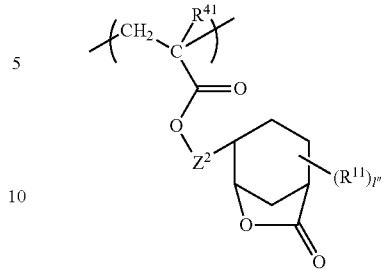

wherein $R^{41}$ represents a hydrogen atom or a methyl group, $R^9$ represents a methyl group, $Z^2$ represents a single bond or —$(CH_2)_z$—CO—O—, z represents an integer of 1 to 4, $R^{10}$ is independently in each occurrence a carboxyl group, a cyano group, or a C1-C4 aliphatic hydrocarbon group, l represents an integer of 0 to 5, l' represents an integer of 0 to 9 and l" represents an integer of 0 to 9.

$Z^2$ is preferably a single bond or —$CH_2$—CO—O—, and is more preferably a single bond.

In the formula (IVa), p is preferably 0 to 2, and is more preferably 0 or 1. R" is preferably a methyl group, a carboxyl group or a cyano group, and l' is preferably 0 to 2, and is more preferably 0 or 1. $R^{11}$ is preferably a methyl group, a carboxyl group or a cyano group, and l' is preferably 0 to 2, and is more preferably 0 or 1.

Among the structural units represented by the formulae (IVa), (IVb) and (IVc), the structural unit represented by the formula (IVb) is preferable.

Examples of the structural unit represented by the formula (IVa) include the followings.

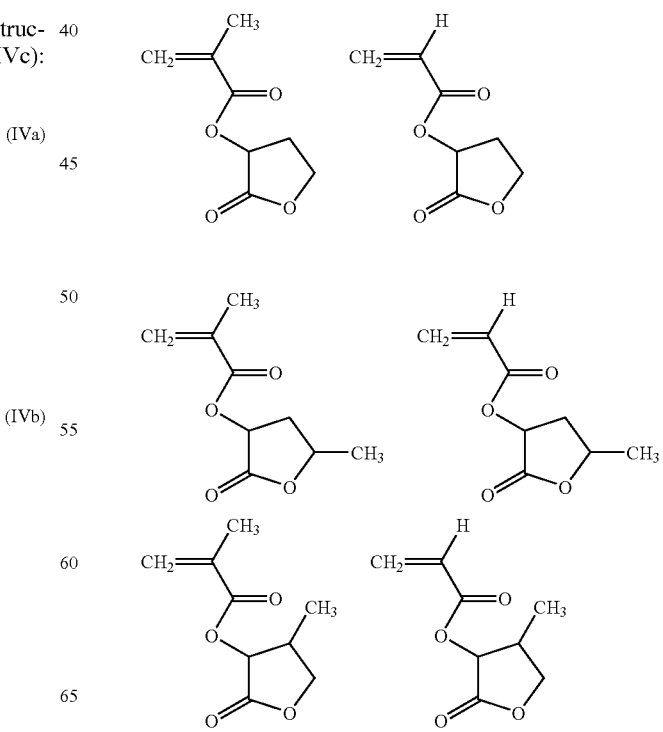

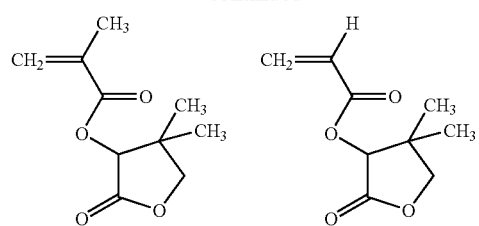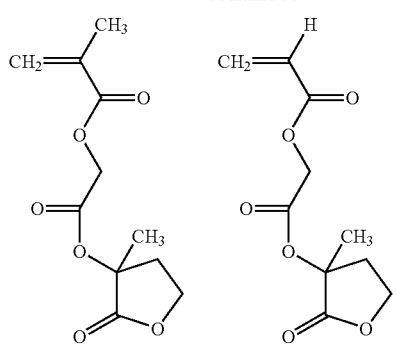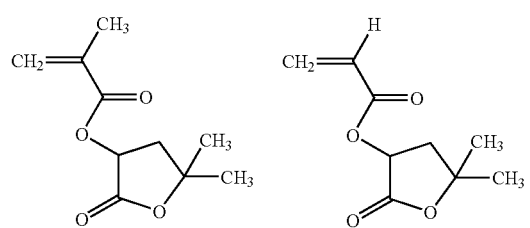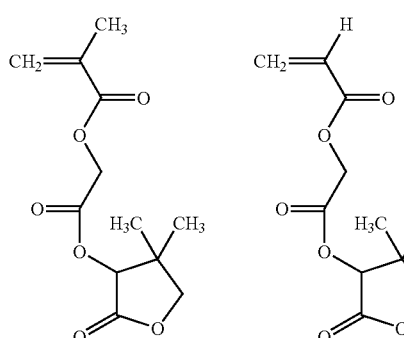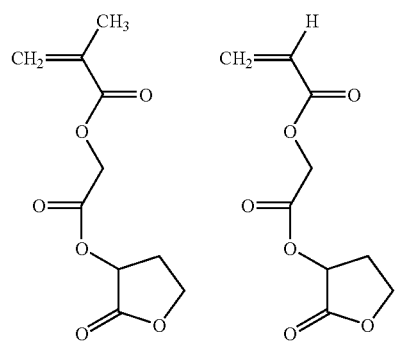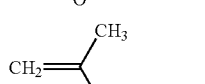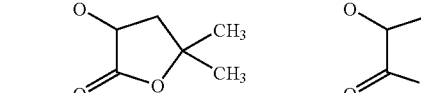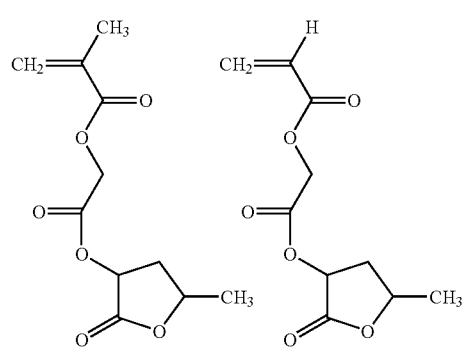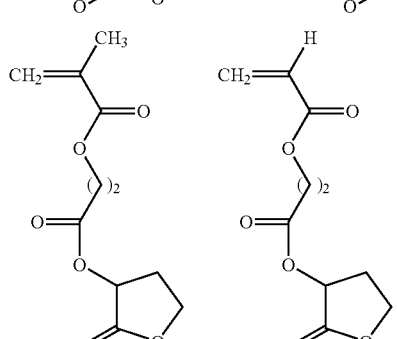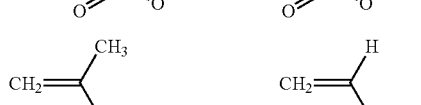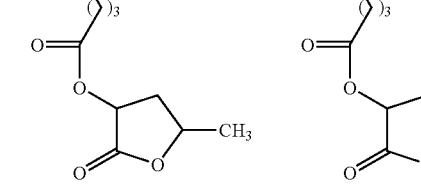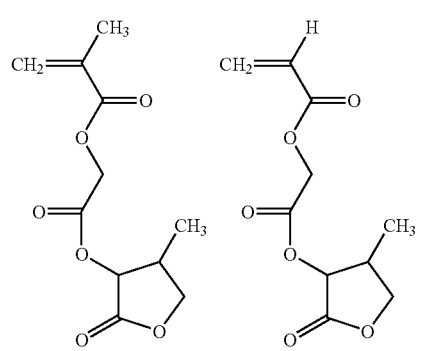

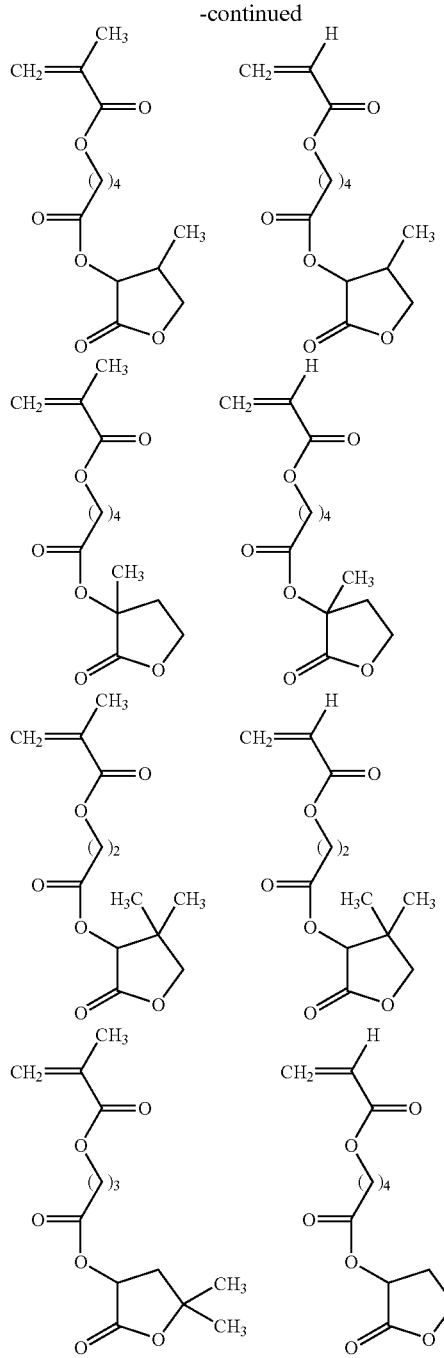
Examples of the structural unit represented by the formula (IVb) include the followings.
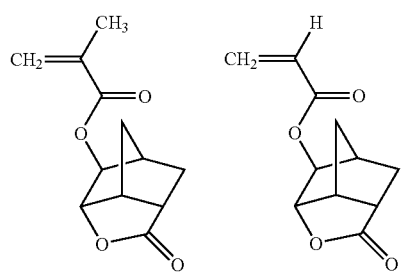
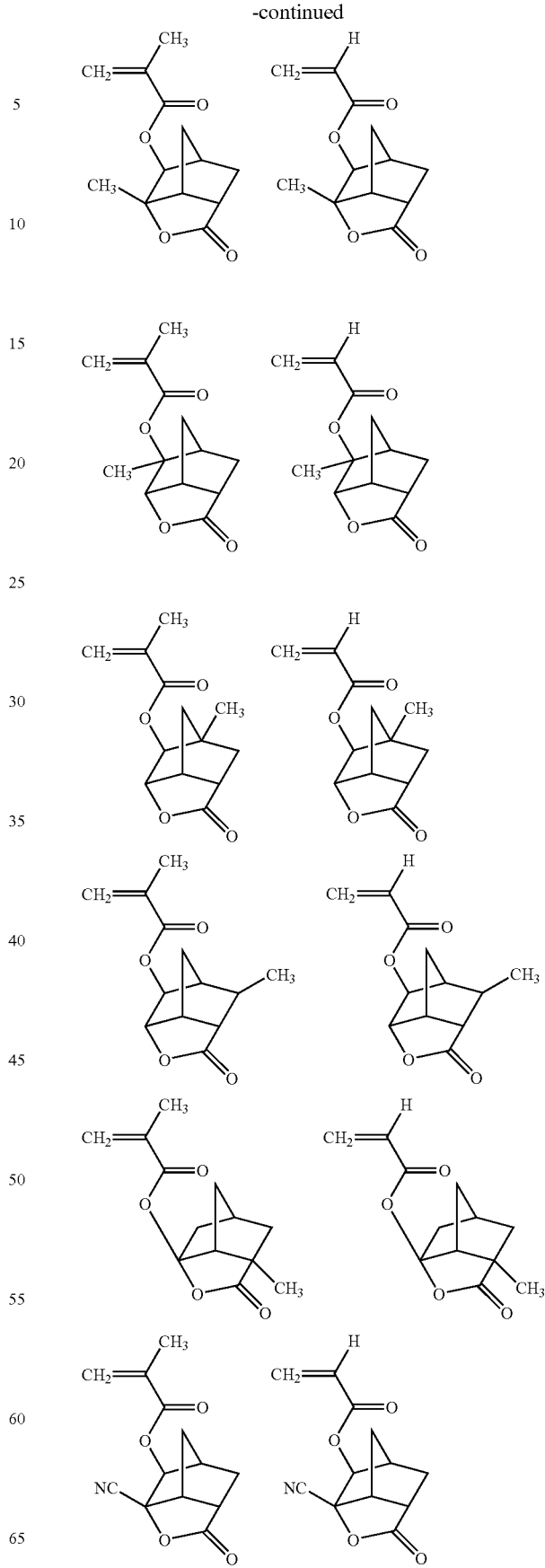

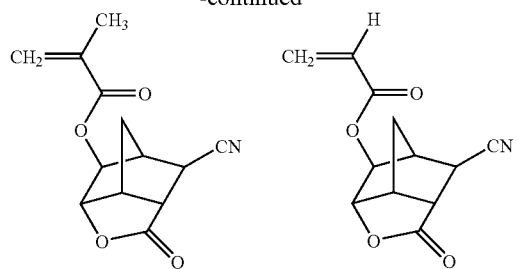
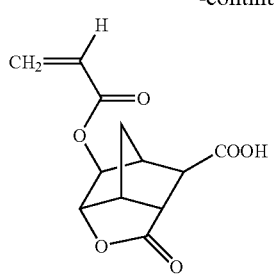
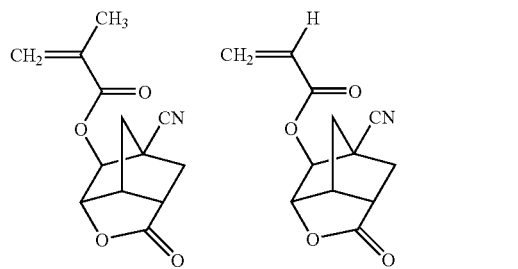
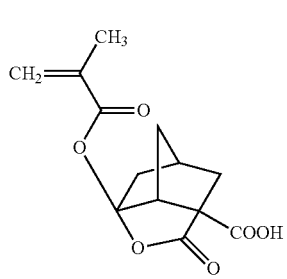
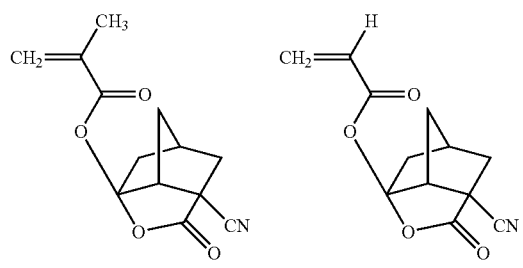
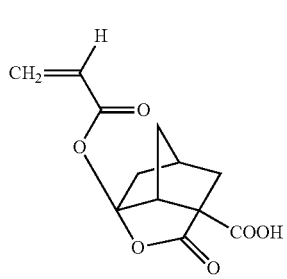
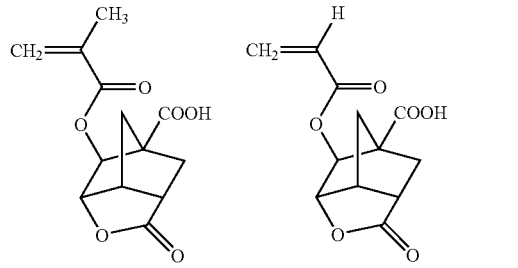
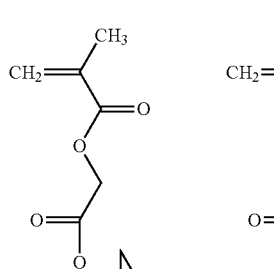
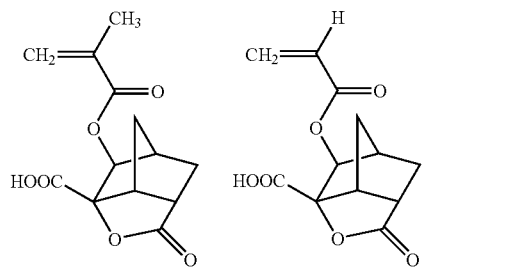
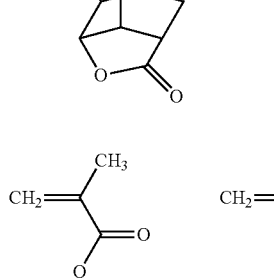
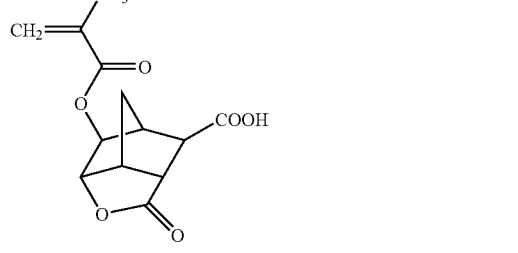
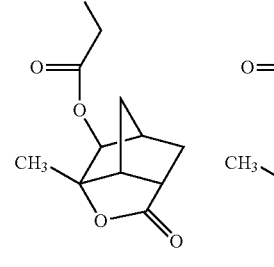

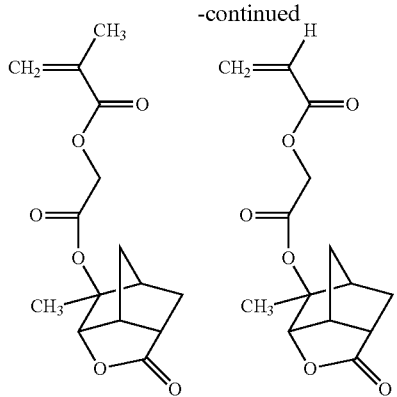
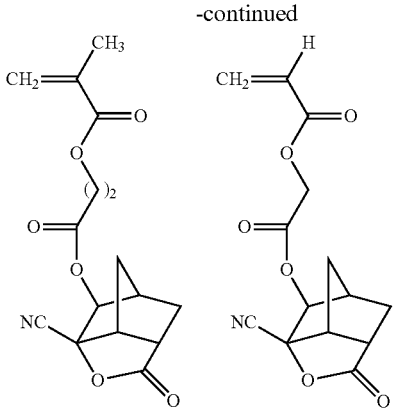
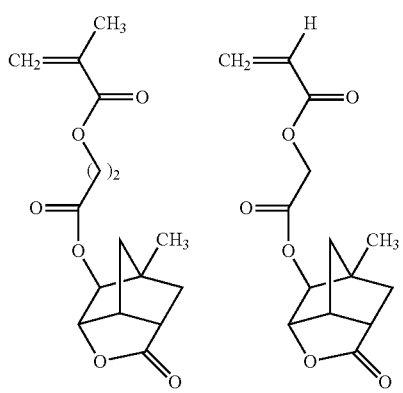
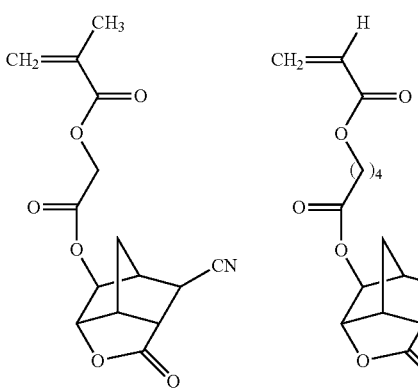
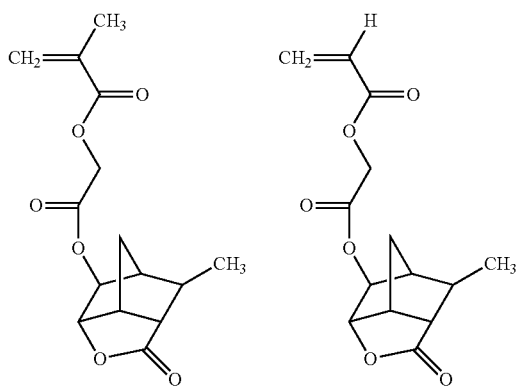
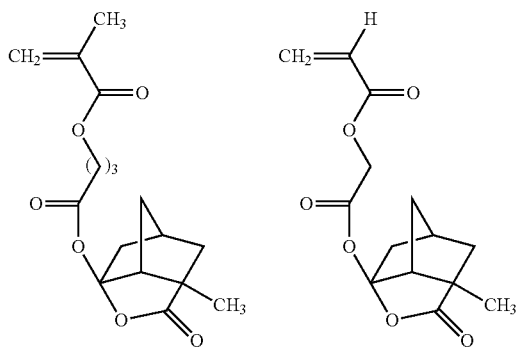
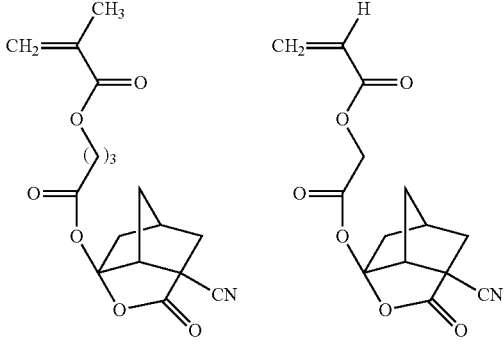

-continued
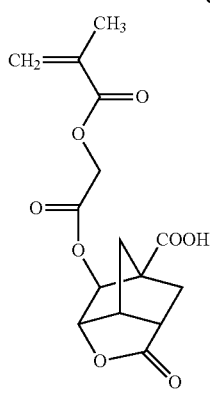 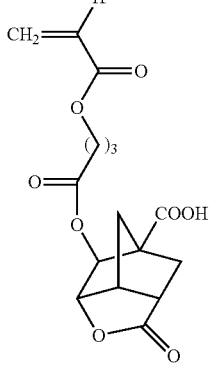
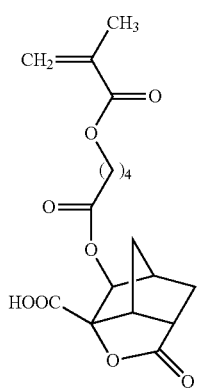 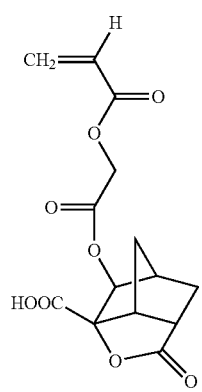
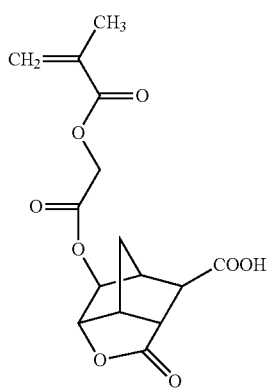
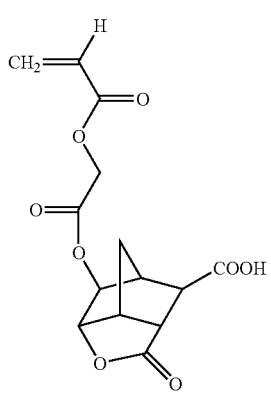
-continued
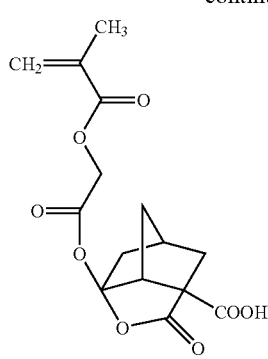
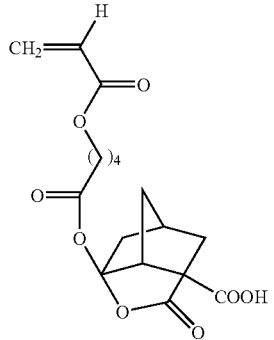
Examples of the structural unit represented by the formula (IVc) include the followings.
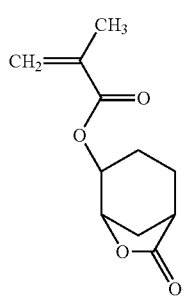 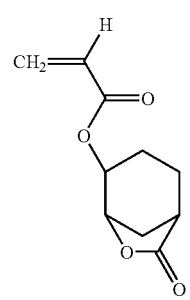
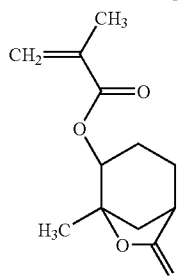 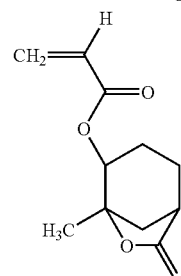
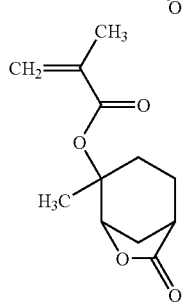 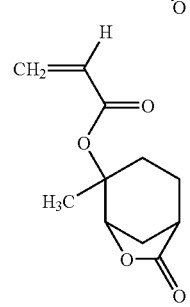

-continued
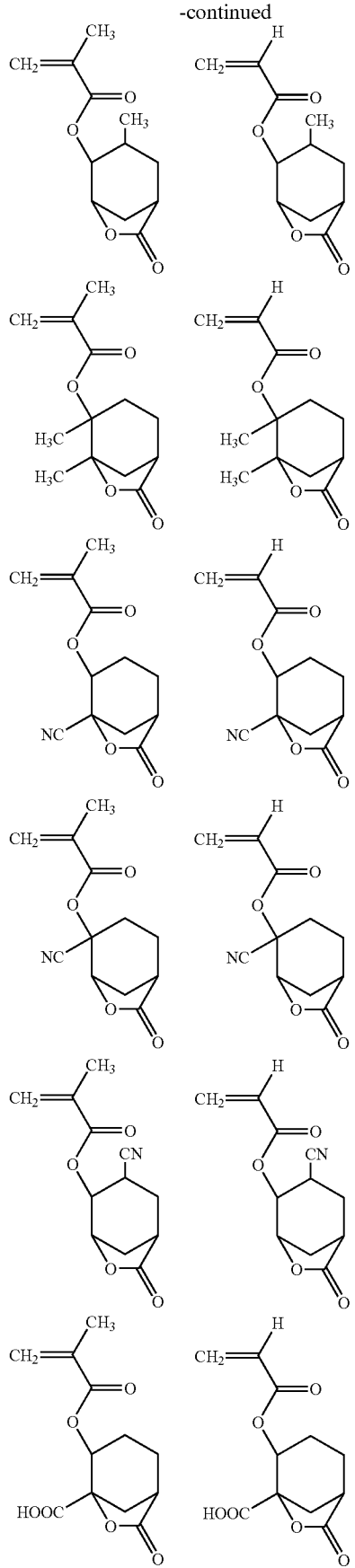
-continued
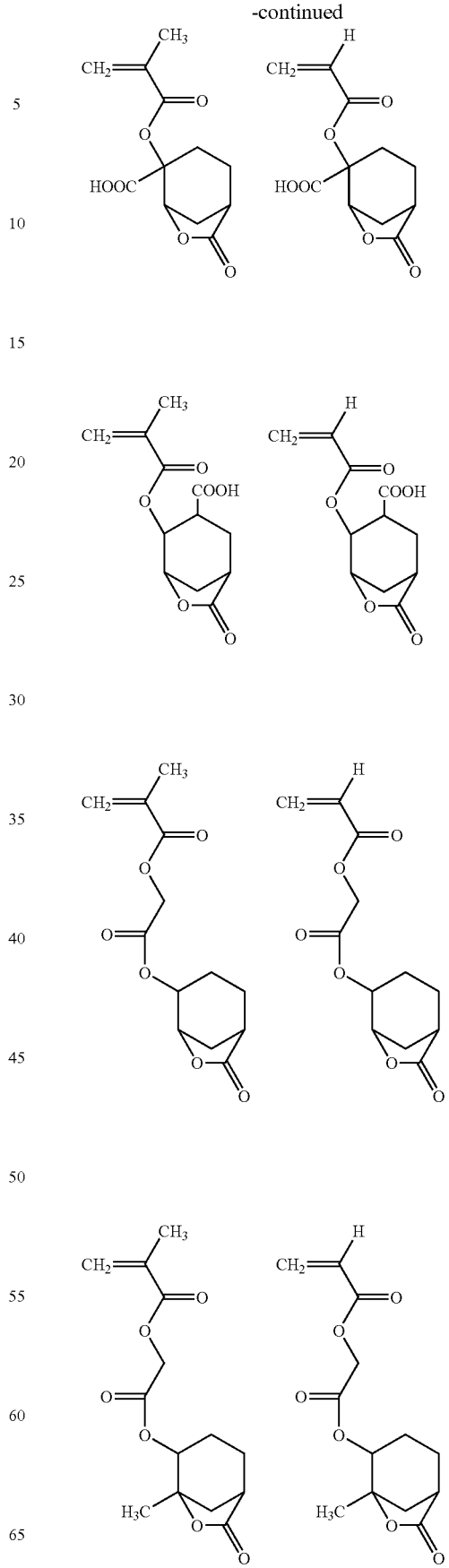

45
-continued
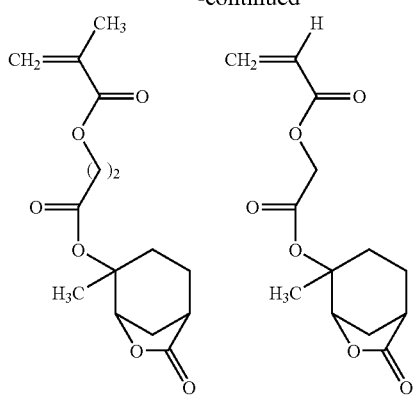
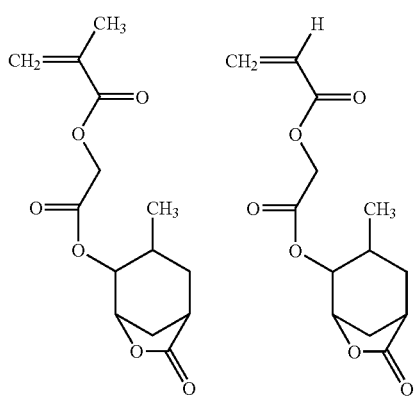
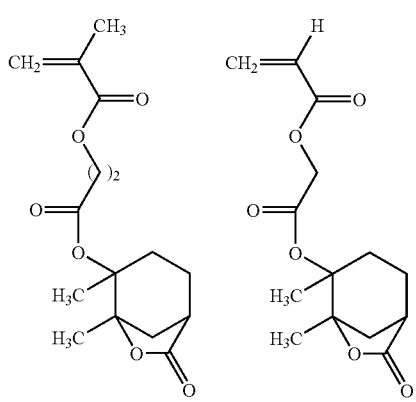
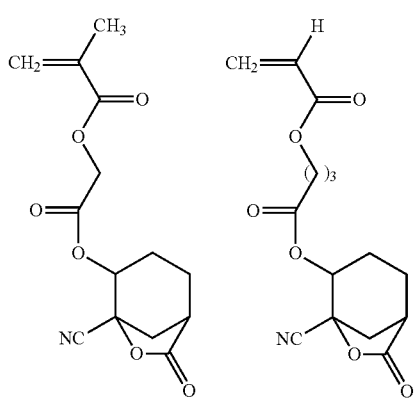
46
-continued
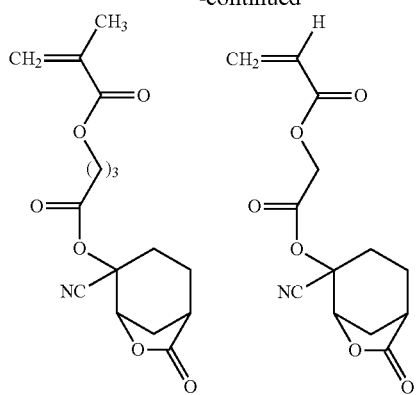
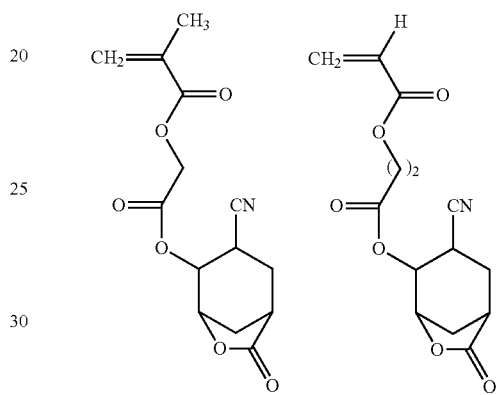
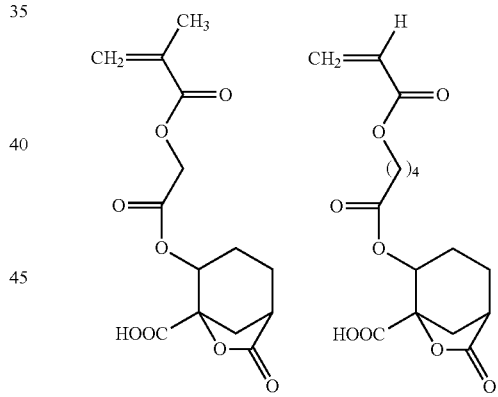
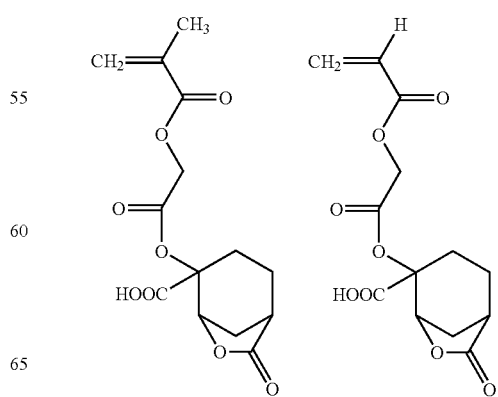

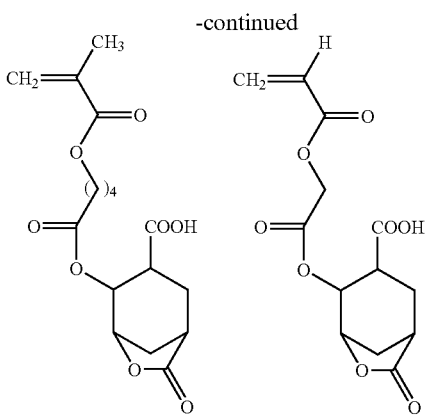

Among them, hexahydro-2-oxo-3,5-methano-2H-cyclopenta[b]furan-6-ylacrylate, hexahydro-2-oxo-3,5-methano-2H-cyclopenta[b]furan-6-yl methacrylate, tetrahydro-2-oxo-3-furyl acrylate, tetrahydro-2-oxo-3-furyl methacrylate, 2-(5-oxo-4-oxatricyclo[4.2.1.0$^{3,7}$]nonan-2-yloxy)-2-oxoethyl acrylate and 2-(5-oxo-4-oxatricyclo[4.2.1.0$^{3,7}$]nonan-2-yloxy)-2-oxoethyl methacrylate are preferable.

The monomers giving the structural units represented by the formulae (IVa), (IVb) and (IVc) can be produced by a reaction of the corresponding hydroxyl-containing lactone compound with an acrylic halide or methacrylic halide.

When the present polymer contains the structural unit having a lactone ring, the content of the structural unit having a lactone ring in the present polymer is usually 5 to 50 mol %, preferably 10 to 45 mol %, and more preferably 15 to 40 mol % based on the total molar of all of the structural units.

The polymer of the present invention may contain one or more structural units having an acid-labile group in addition to the structural units (I) and (II). In the present specification, "acid-labile group" means a group cleaved by contacting with an acid to be converted to a hydrophilic group such as a hydroxyl group and a carboxyl group.

Examples of the acid-labile group include a group represented by the formula (I):

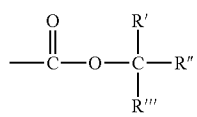

(1)

wherein R', R" and R'" each independently represents a linear or branched chain C1-C30 aliphatic hydrocarbon group and R' and R" may be bonded to form a ring (hereinafter, simply referred to as the acid-labile group (1)). Examples of the acid-labile group (1) include a 1,1-dialkylalkoxycarbonyl group such as a tert-butoxycarbonyl group; a 2-alkyl-2-adamantyloxycarbonyl group such as a 2-methyl-2-adamantyloxycarbonyl group, a 2-ethyl-2-adamantyloxycarbonyl group and a 2-isopropyl-2-adamantyloxycarbonyl group; a 1-alkylcycloalkoxycarbonyl group such as a 1-ethylcyclohexyloxycarbonyl group; and a 1-(1-adamantyl)-1-alkylalkoxycarbonyl group.

The structural units having an acid-labile group is derived from a monomer having a carbon-carbon double bond and an acid-labile group, and preferable examples of the monomer include an acrylate having an acid-labile group and a methacrylate having an acid-labile group. The monomer having an acid-labile group containing a C5-C20 alicyclic hydrocarbon group is preferable because excellent resolution is obtained when the resin obtained is used in the present composition. Examples of the C5-C20 alicyclic hydrocarbon group include a monocyclic saturated aliphatic hydrocarbon group having a cycloalkane ring such as a cyclopentane ring, a cyclohexane ring, a cycloheptane ring and a cyclooctane ring; and a polycyclic aliphatic hydrocarbon group having a bridged hydrocarbon ring such as an adamantane ring and a norbornane ring.

Examples of the structural unit having an acid-labile group include the structural unit represented by the formulae (a-1) and (a-2).

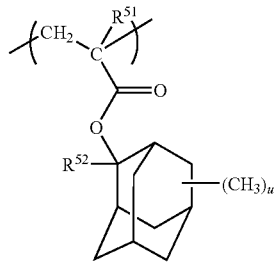

(a-1)

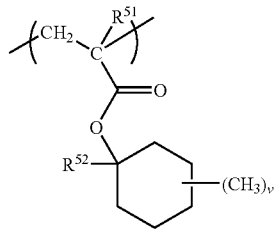

(a-2)

wherein R$^{51}$ represents a hydrogen atom or a methyl group, R$^{52}$ represents a linear or branched chain C1-C8 aliphatic hydrocarbon group or a C3-C10 saturated cyclic hydrocarbon group, u represents an integer of 0 to 14 and v represents an integer of 0 to 10.

In the formulae (a-1) and (a-2), R$^{51}$ is preferably a methyl group, and R$^{52}$ is preferably a linear or branched chain C1-C6 aliphatic hydrocarbon group or a C3-C8 saturated cyclic hydrocarbon group and more preferably a linear or branched chain C1-C6 aliphatic hydrocarbon group or a C3-C6 saturated cyclic hydrocarbon group. Examples of the linear or branched chain aliphatic hydrocarbon group include a methyl group, an ethyl group, an isopropyl group, a tert-butyl group, a 2,2-dimethylethlyl group, a propyl group, a 1-methylpropyl group, a 2,2-dimethylpropyl group, a 1-ethylpropyl group, a butyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the saturated cyclic hydrocarbon group include a cycloheptyl group, a methylcycloheptyl group, a cyclohexyl group, a methylcyclohexyl group, a dimethylcyclohexyl group, a norbornyl group and a methylnorbornyl group.

In the formulae (a-1) and (a-2), u is preferably an integer of 0 to 3 and more preferably 0 or 1, and v is preferably an integer of 0 to 3 and more preferably 0 or 1.

When the present polymer contains the structural unit having an acid-labile group, the content thereof in the present polymer is usually 10 to 95 mol %, preferably 15 to 90 mol %, and more preferably 20 to 85 mol % based on the total molar of all structural units.
Examples of the monomer giving the structural unit represented by the formula (a-1) include the followings.
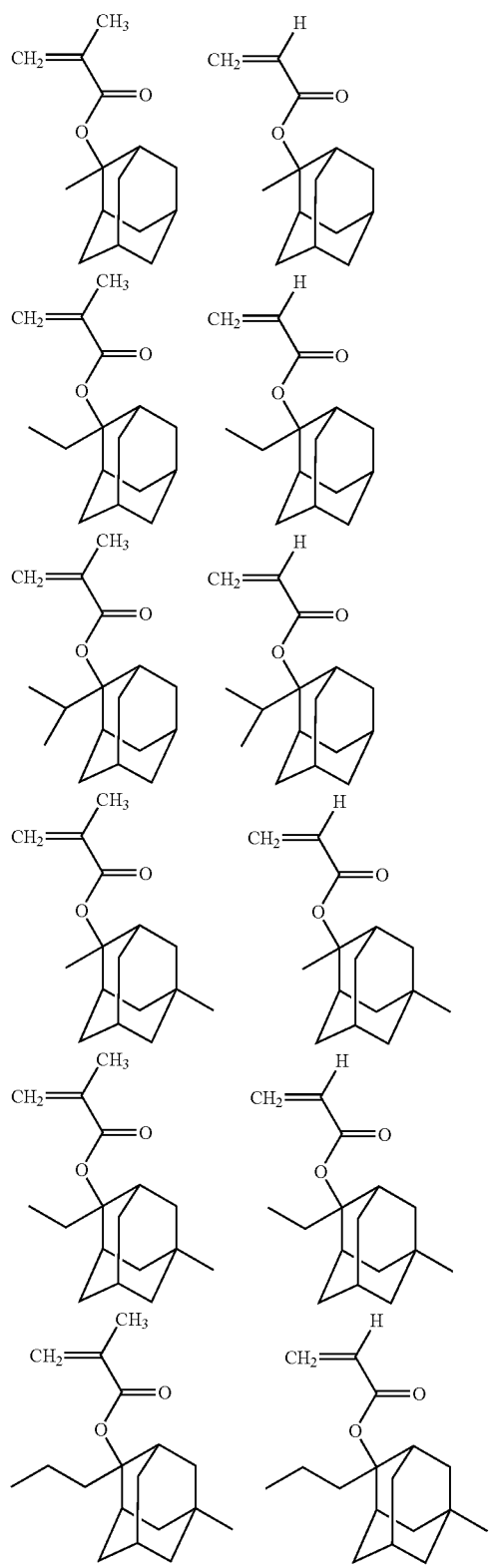
-continued
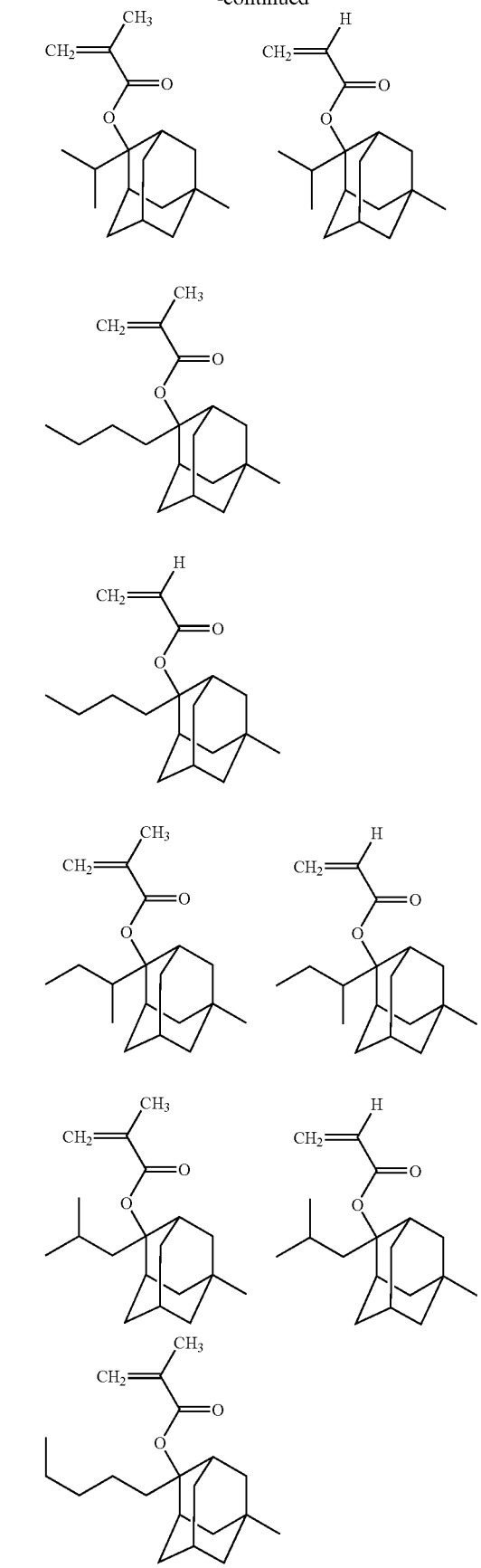

51
-continued
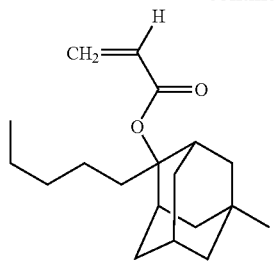
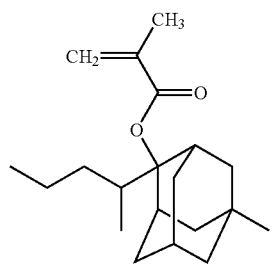
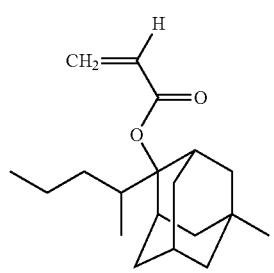
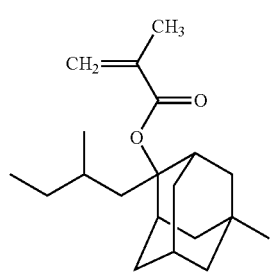
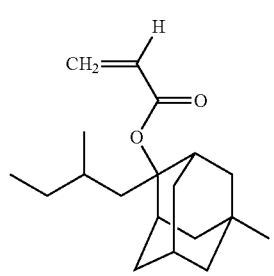
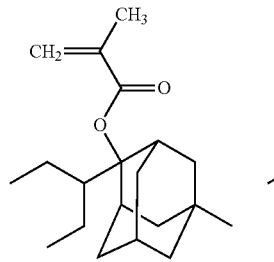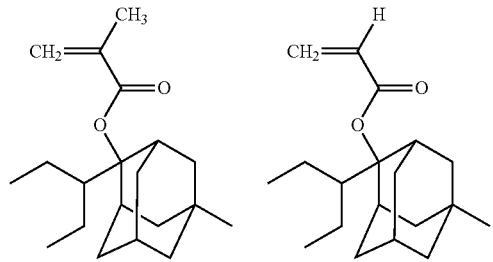
52
-continued
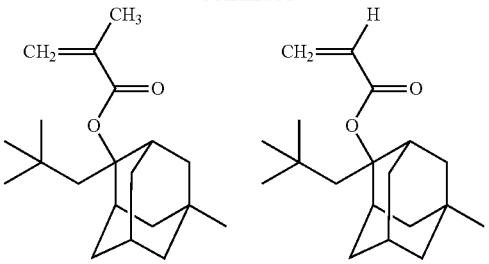
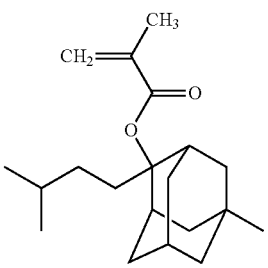
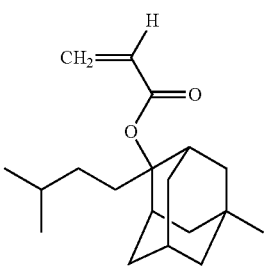
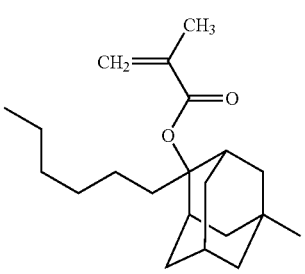
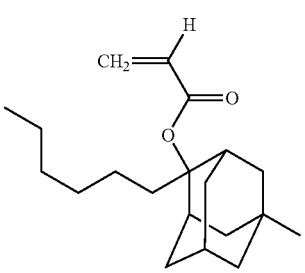
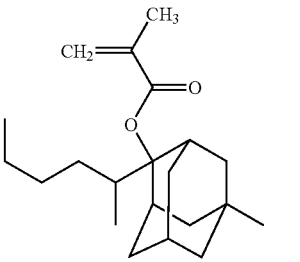

53
-continued
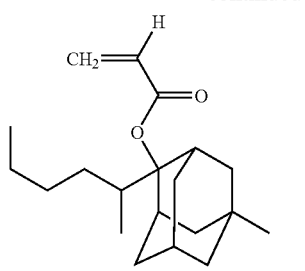
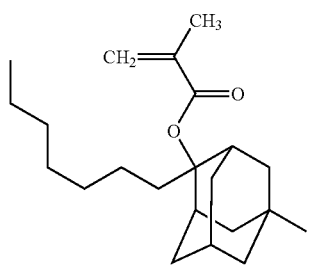
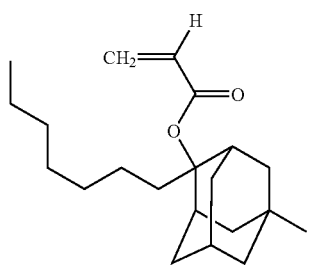
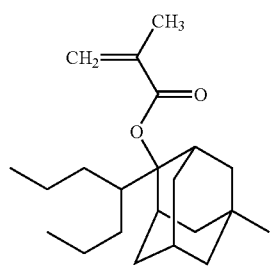
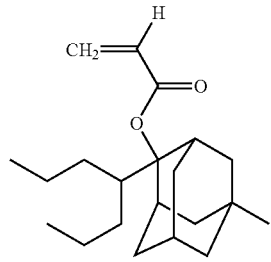
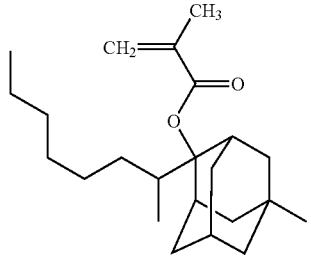
54
-continued
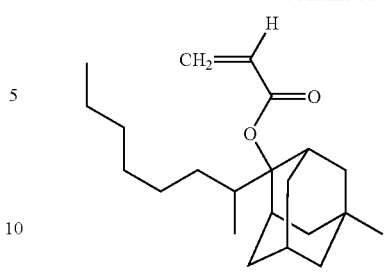
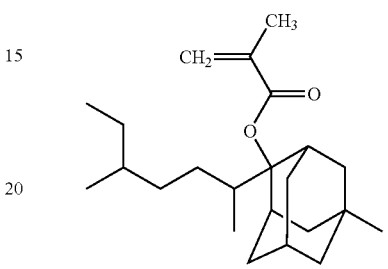
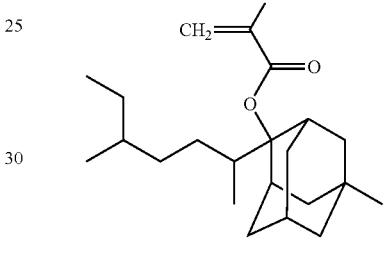
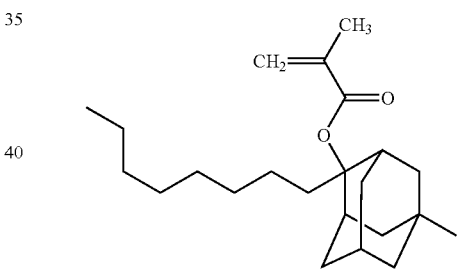
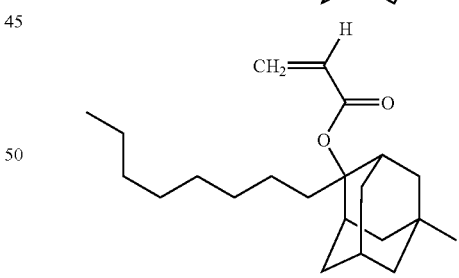
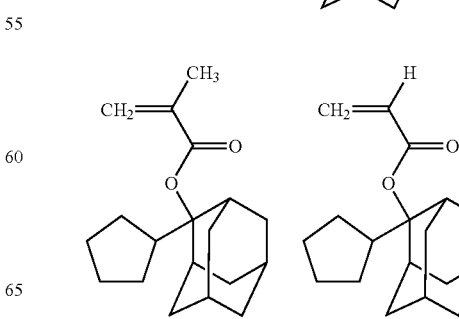

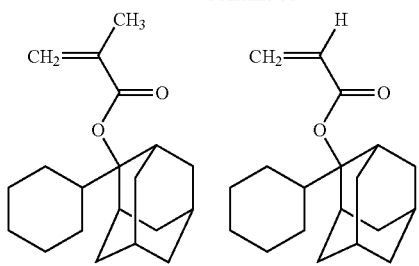
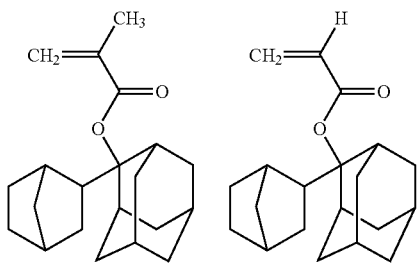
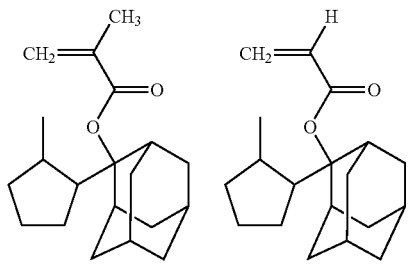
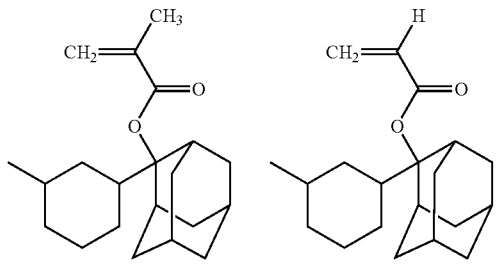
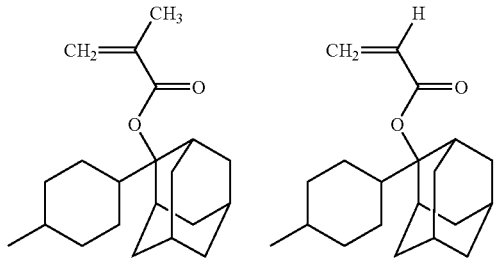
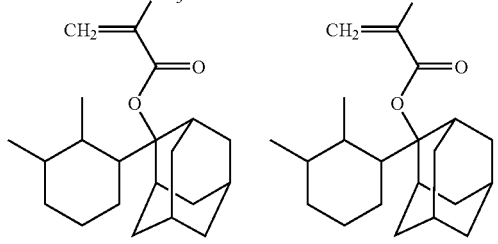
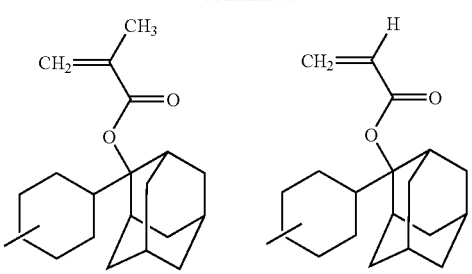
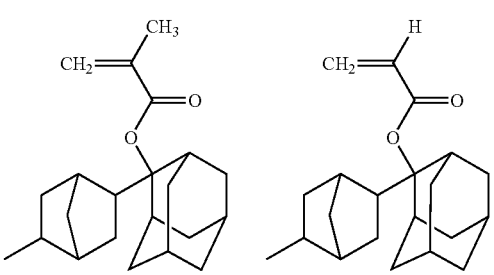
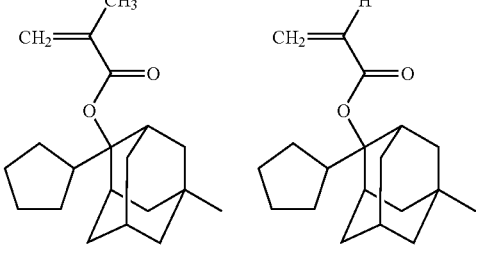
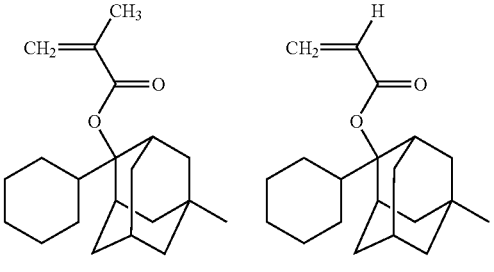
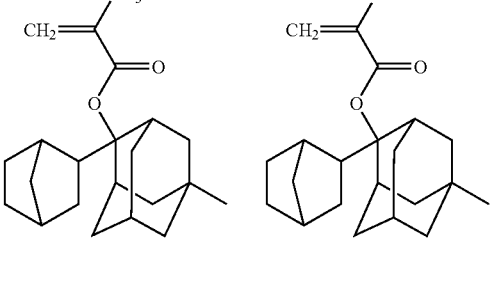
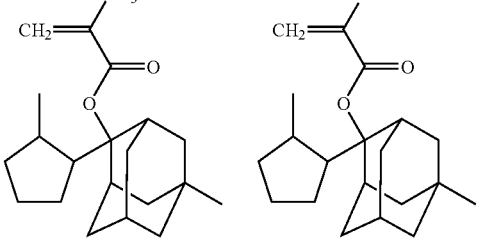

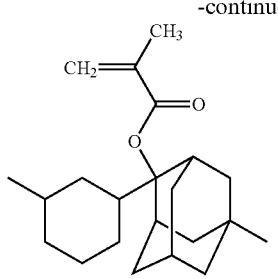
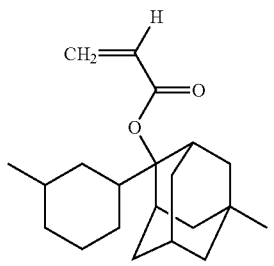
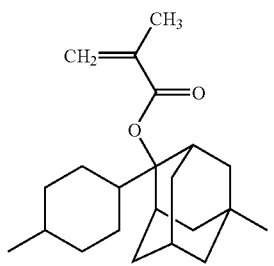
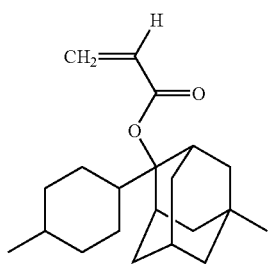
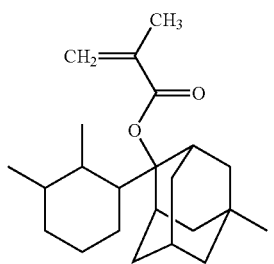
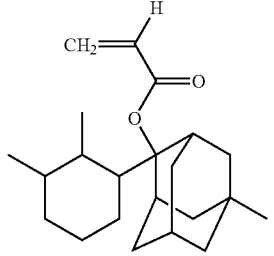

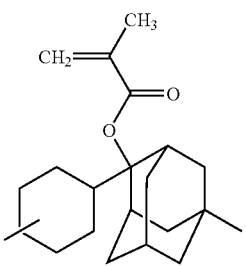
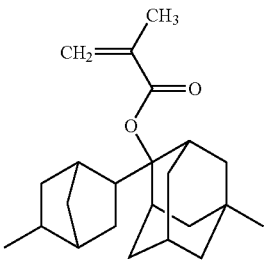
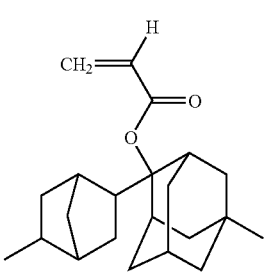

Among them, 2-methyl-2-adamantyl acrylate, 2-methyl-2-adamantyl methacrylate, 2-ethyl-2-adamantyl acrylate, 2-ethyl-2-adamantyl methacrylate, 2-isopropyl-2-adamantyl acrylate and 2-isopropyl-2-adamantyl methacrylate are preferable and 2-methyl-2-adamantyl methacrylate, 2-ethyl-2-adamantyl methacrylate and 2-isopropyl-2-adamantyl methacrylate are more preferable.

Examples of the monomer giving the structural unit represented by the formula (a-2) include the followings.

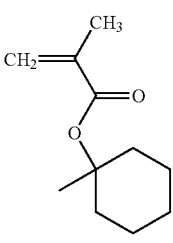 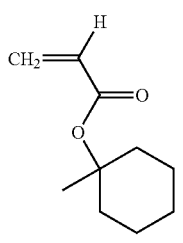

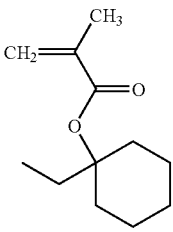 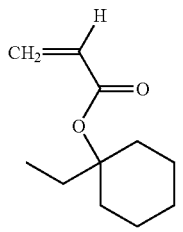

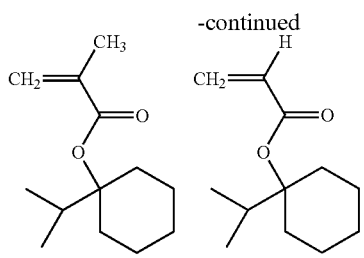

Among them, 1-ethyl-1-cyclohexyl acrylate and 1-ethyl-1-cyclohexyl methacrylate are preferable and 1-ethyl-1-cyclohexyl methacrylate is more preferable.

When the present polymer contains the structural unit represented by the formula (a-1) or (a-2), the content thereof in the present polymer is usually 10 to 95 mol %, preferably 15 to 90 mol %, and more preferably 20 to 85 mol % based on the total molar of all structural units.

The polymer of the present invention can be produced by conducting the polymerization reaction of the corresponding monomers. The polymer of the present invention can be also produced by conducting the oligomerization reaction of the corresponding monomers followed by polymerizing the obtained oligomer.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on all monomer or oligomer molar amounts.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the obtained polymer. Examples thereof include hydrocarbons such as toluene; ethers such as 1,4-dioxane and tetrahydrofuran; ketones such as methyl isobutyl ketone; alcohols such as isopropyl alcohol; cyclic esters such as γ-butyrolactone; glycol ether esters such as propylene glycol monomethyl ether acetate; and acyclic esters such as ethyl lactate. These solvents may be used alone and a mixture thereof may be used.

The amount of the solvent is not limited, and practically, it is preferably 1 to 5 parts by weight per 1 part of all monomers or oligomers.

After completion of the polymerization reaction, the produced polymer can be isolated, for example, by adding a solvent in which the present polymer is insoluble or poorly soluble to the reaction mixture obtained and filtering the precipitated resin. If necessary, the isolated polymer may be purified, for example, by washing with a suitable solvent.

Alternatively, the present polymer can be also produced by using a polyvinylphenol. Examples of the polyvinylphenol include a commercially available polyvinylphenol, a polyvinylphenol produced according to the methods described in JP 2000-178325 A or the like.

The polymer of the present invention is insoluble or poorly soluble in an alkali aqueous solution but becomes soluble in an alkali aqueous solution by the action of an acid.

The present resist composition comprises the polymer of the present invention and an acid generator.

The present resist composition may contain two or more kinds of the polymer of the present invention.

The acid generator is a substance which is decomposed to generate an acid by applying a radiation such as a light, an electron beam or the like on the substance itself or on a resist composition containing the substance. The acid generated from the acid generator acts on the present polymer resulting in dissolving the present polymer in an alkali aqueous solution.

Examples of the acid generator include an onium salt compound, an organo-halogen compound, a sulfone compound, a sulfonate compound, and the like. The onium salt compound is preferable.

Other examples of the acid generator include acid generators described in JP 2003-5374 A1 such as an acid generator represented by the following formula:

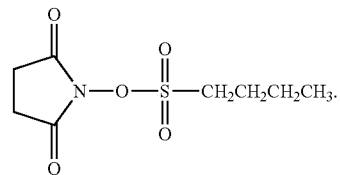

A compound represented by the formula:

A⁺B⁻ wherein A⁺ represents an organic counter cation and B⁻ represents a counter anion, are also used as an acid generator. Examples of the counter anion include $BF_4^-$, $AsF_6^-$, $PF_6^-$, $SbF_6^-$, $SiF_6^{2-}$, $ClO_4^-$, a perfluoroalkanesulfonic acid anion such as $CF_3SO_3^-$, pentafluorobenzenesulfonic acid anion, a condensed polynuclear aromatic sulfonic acid anion such as naphthalene-1-sulfonic acid anion, anthraquinonesulfonc acid anion, and a dye containing a sulfonic acid group. Additionally, anions described in JP 2003-5374 A1 such as an anion represented by the following formula:

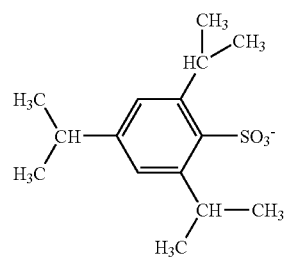

are also listed as the counter anion.

Examples of the preferable acid generator include a salt represented by the formula (V):

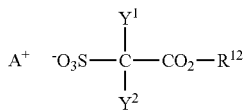

wherein $A^+$ represents an organic counter ion, $Y^1$ and $Y^2$ each independently represent a fluorine atom or a C1-C6 perfluoroalkyl group, $R^{12}$ represents a C1-C30 hydrocarbon group which may have one or more substituents selected from the group consisting of a C1-C6 alkoxy group, a C1-C4 perfluoroalkyl group, a C1-C6 hydroxyalkyl group, a hydroxyl group and a cyano group, and in which one or more —$CH_2$— may be replace by —CO— or —O— (hereinafter, simply referred to as Salt (V)).

Examples of the C1-C6 perfluoroalkyl group represented by $Y^1$ and $Y^2$ include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Y^1$ and $Y^2$ each independently is preferably a fluorine atom or a trifluoromethyl group, and $Y^1$ and $Y^2$ are more preferably fluorine atoms.

Examples of the C1-C30 hydrocarbon group include a linear or branched chain C1-C30 hydrocarbon group such as a methyl group, an ethyl group, a propyl group, an isopropyl group, a butyl group, an isobutyl group, a sec-butyl group, a tert-butyl group, a pentyl group and a hexyl group, and a C3-C30 monocyclic or polycyclic hydrocarbon group such as a hydrocarbon group having a cyclobutane ring, a hydrocarbon group having a cyclopentane ring, a hydrocarbon group having a cyclohexane ring, a hydrocarbon group having a cyclooctane ring, a hydrocarbon group having an adamantane ring, a hydrocarbon group having a benzene ring and a hydrocarbon group having a norbornane ring. The C3-C30 monocyclic or polycyclic hydrocarbon group may have an alicyclic structure or structures and may have an aromatic group or groups. The C3-C30 monocyclic or polycyclic hydrocarbon group may have a carbon-carbon double bond or bonds.

The C1-C30 hydrocarbon group may have one or more substituents selected from the group consisting of a C1-C6 alkoxy group, a C1-C4 perfluoroalkyl group, a C1-C6 hydroxyalkyl group, a hydroxyl group and a cyano group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group. Examples of the C1-C4 perfluoroalkyl group include a trifluoromethyl group, a pentafluoroethyl group, a heptafluoropropyl group and a nonafluorobutyl group. Examples of the C1-C6 hydroxyalkyl group include a hydroxymethyl group, a 2-hydroxyethyl group, a 3-hydroxypropyl group, a 4-hydroxybutyl group and a 6-hydroxyhexyl group.

Specific examples of the anion part of Salt (V) include the followings.

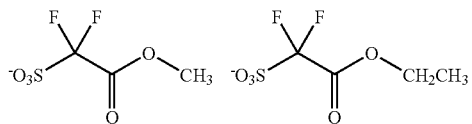

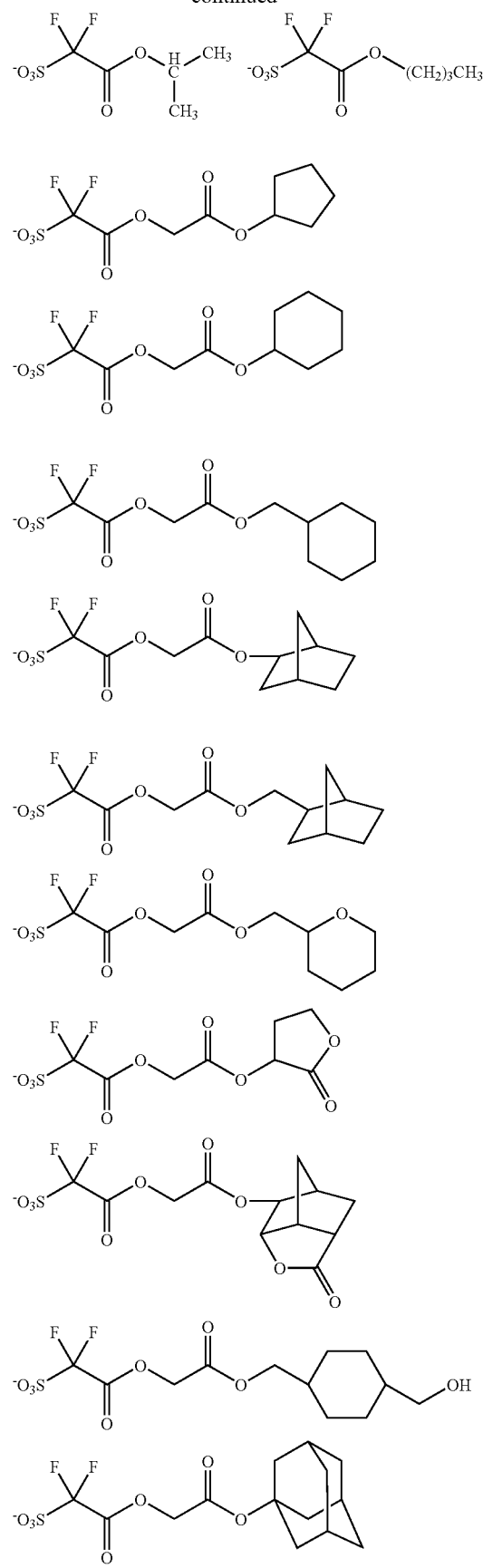

63
-continued
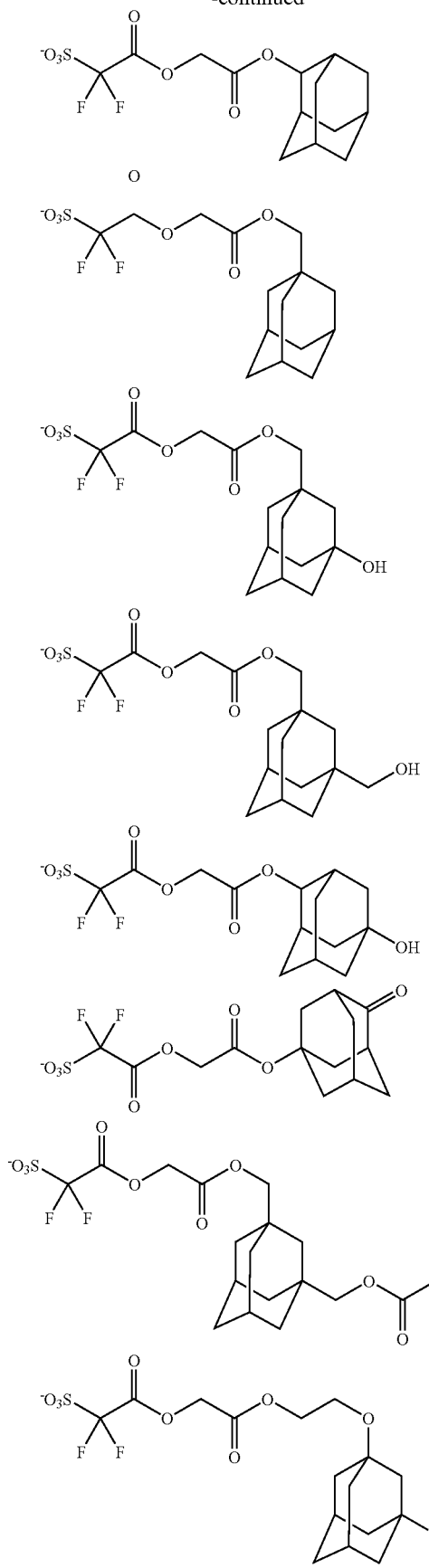
64
-continued
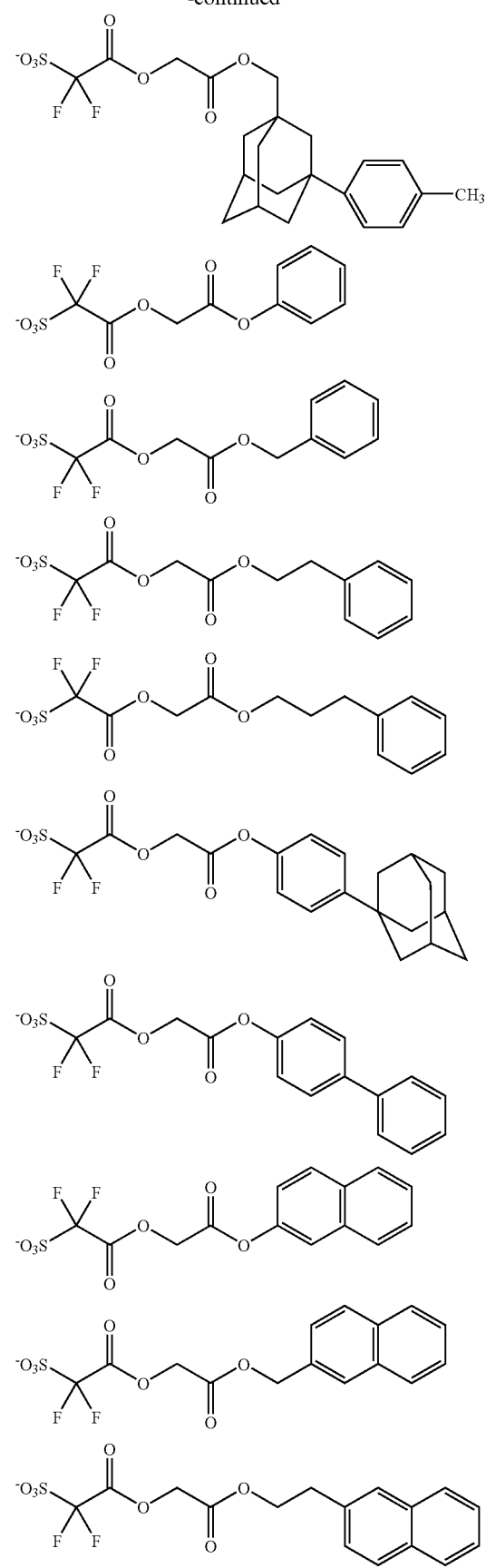

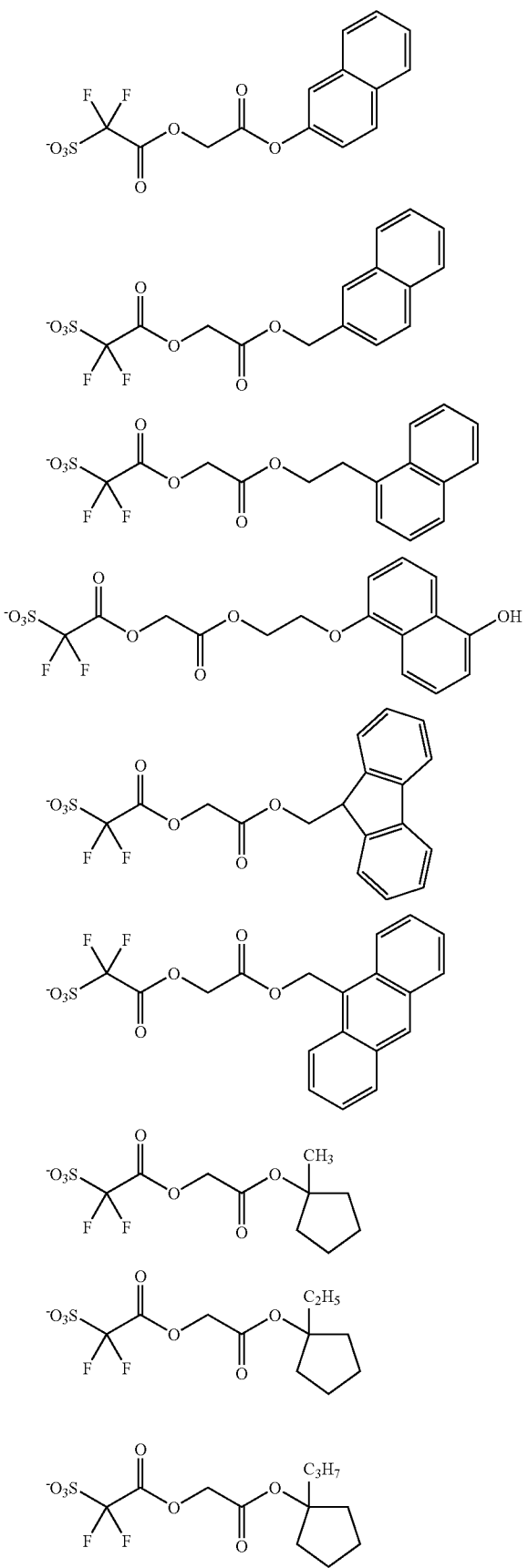
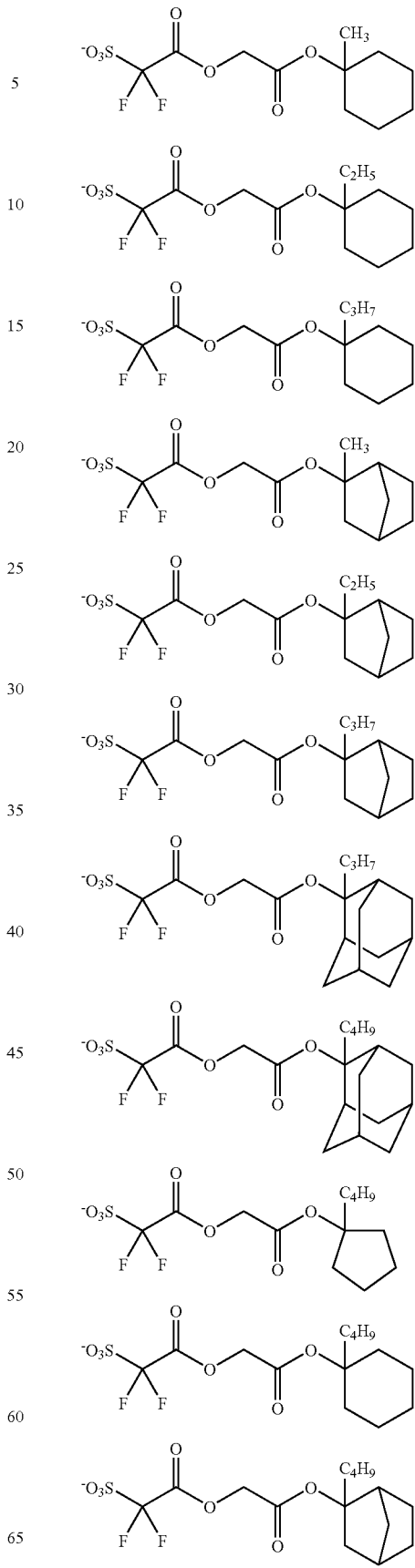

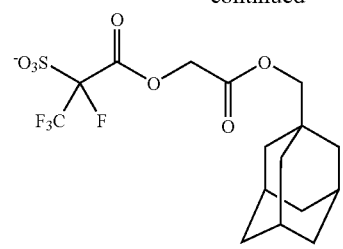
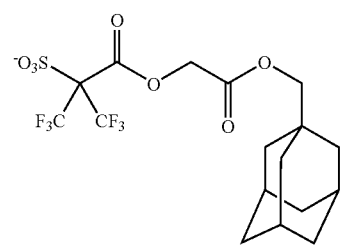
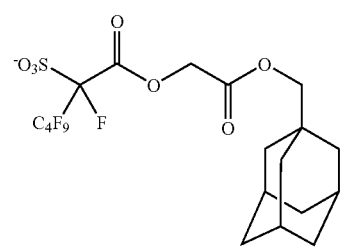
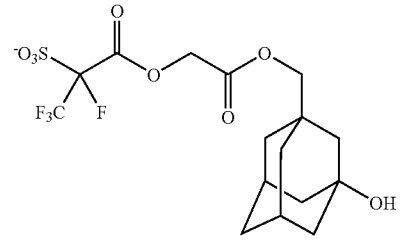
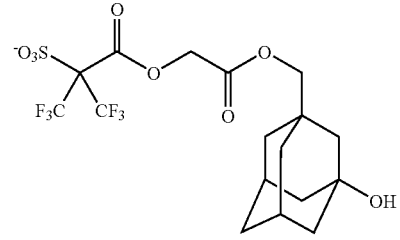
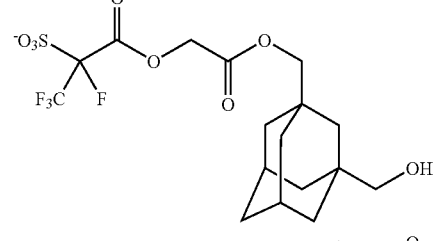
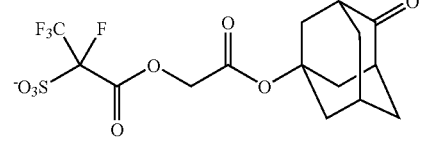
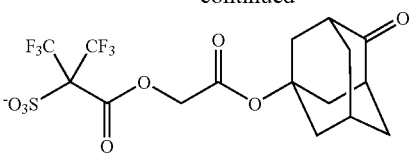
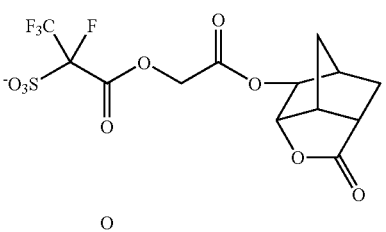
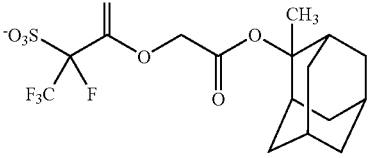
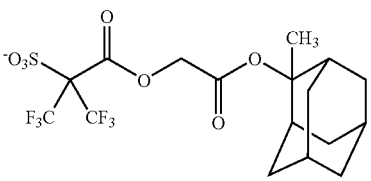
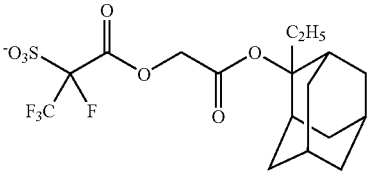
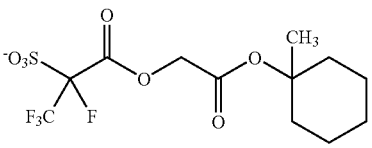
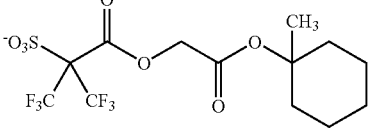
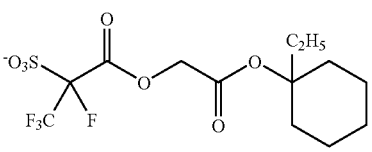
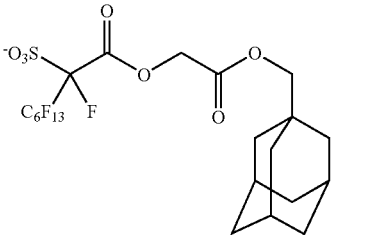

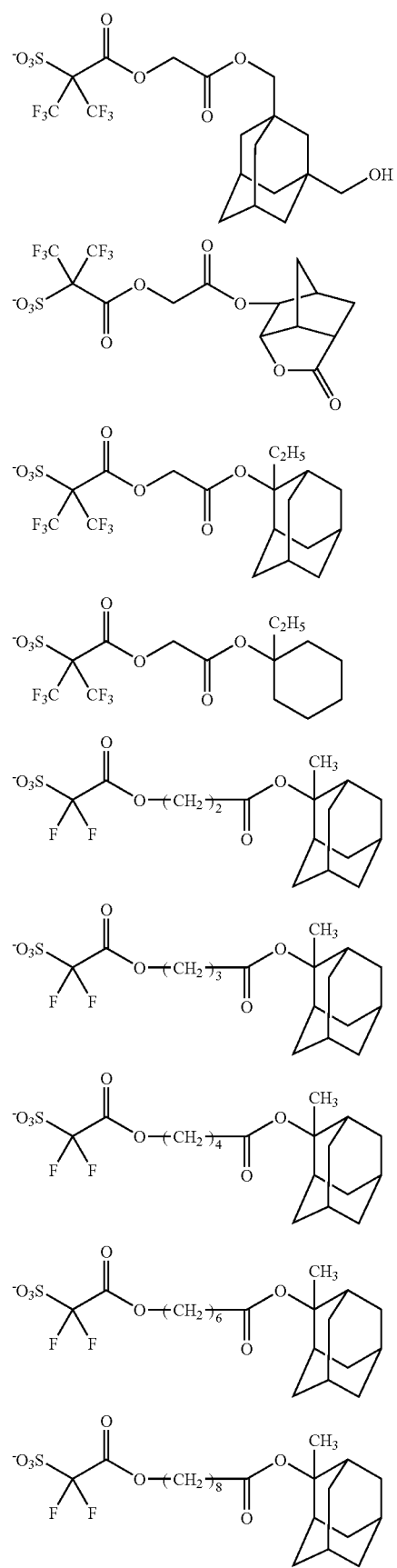
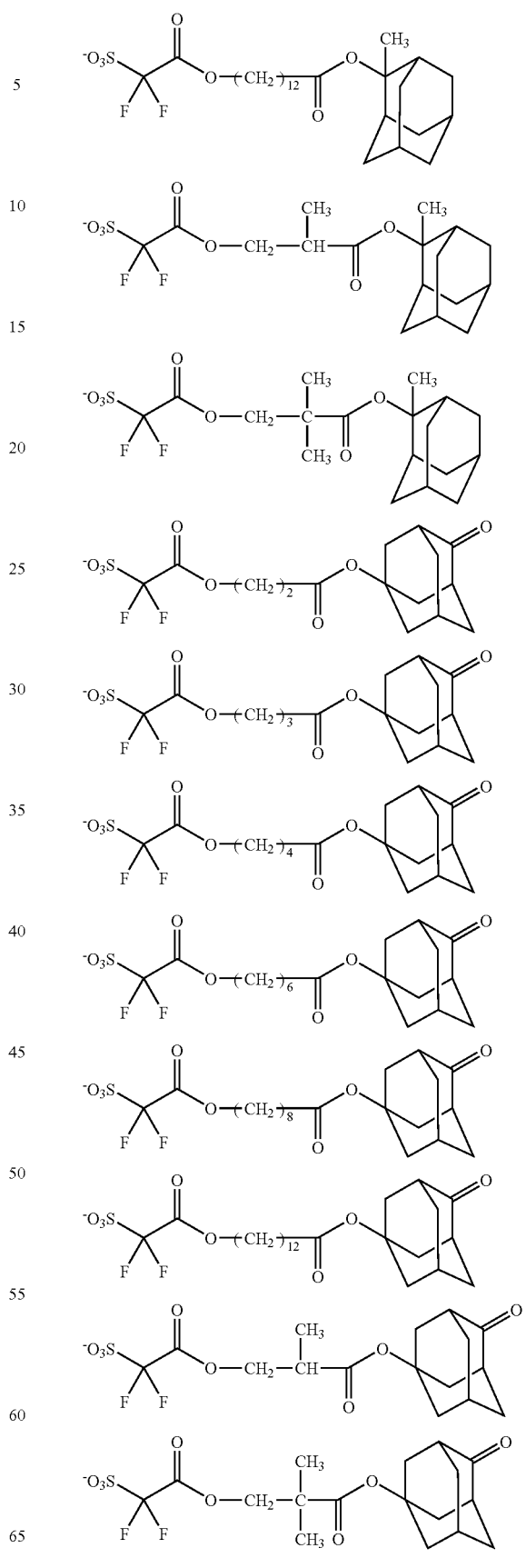

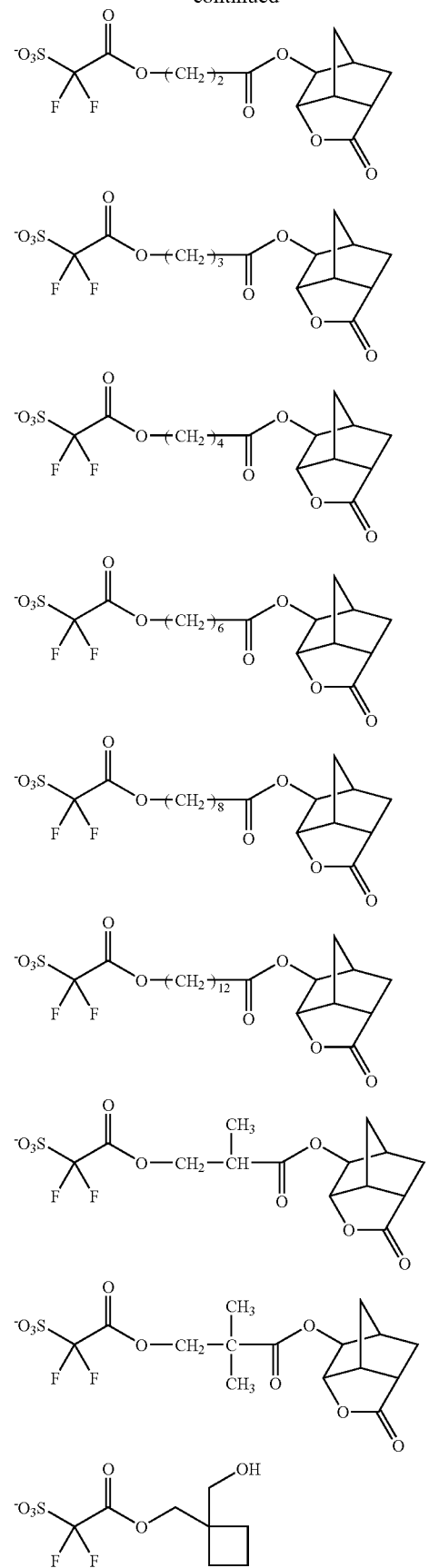

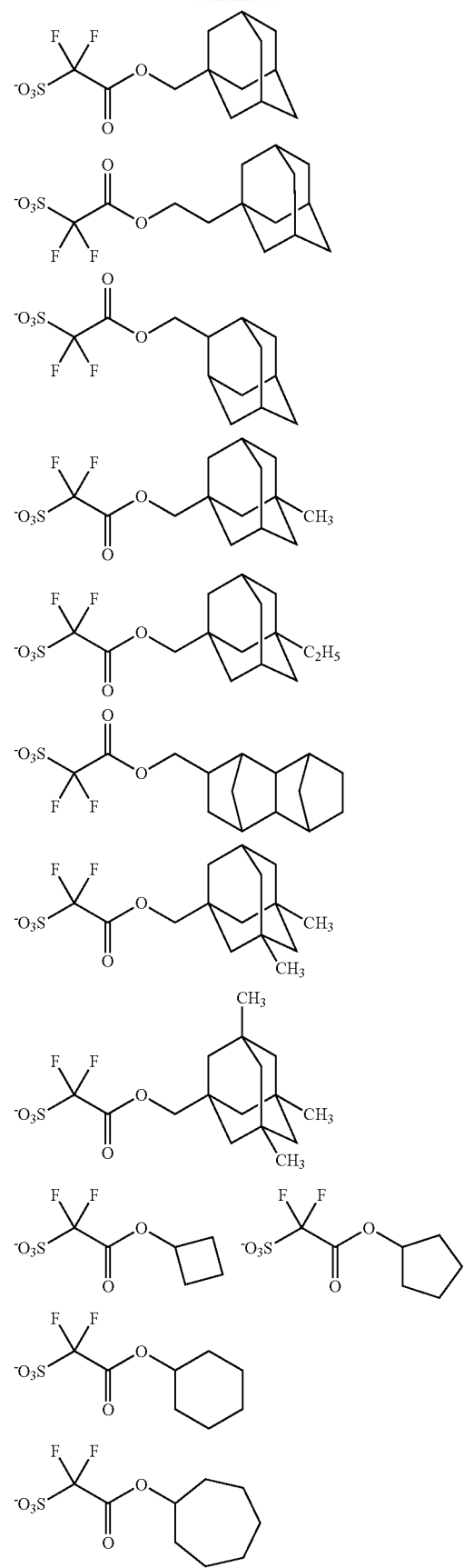
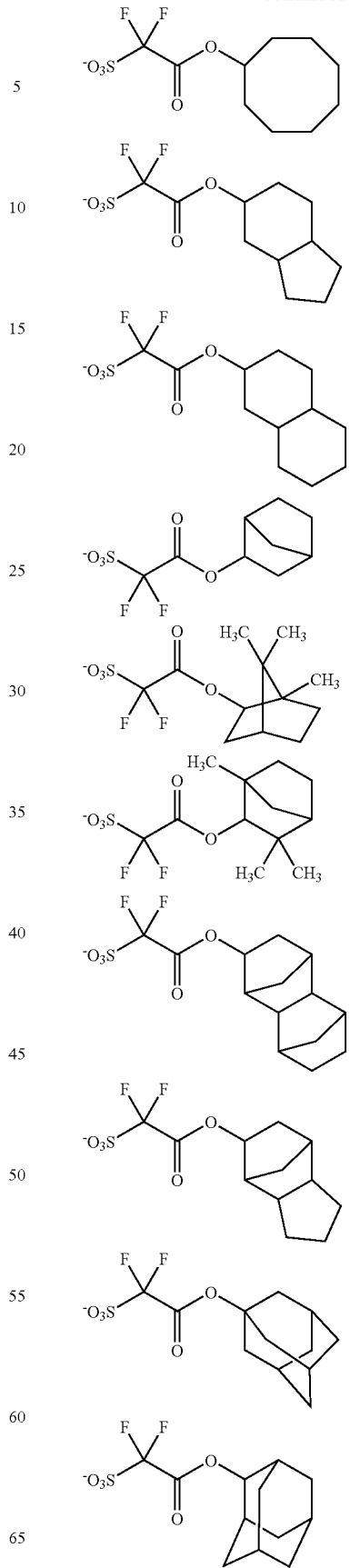

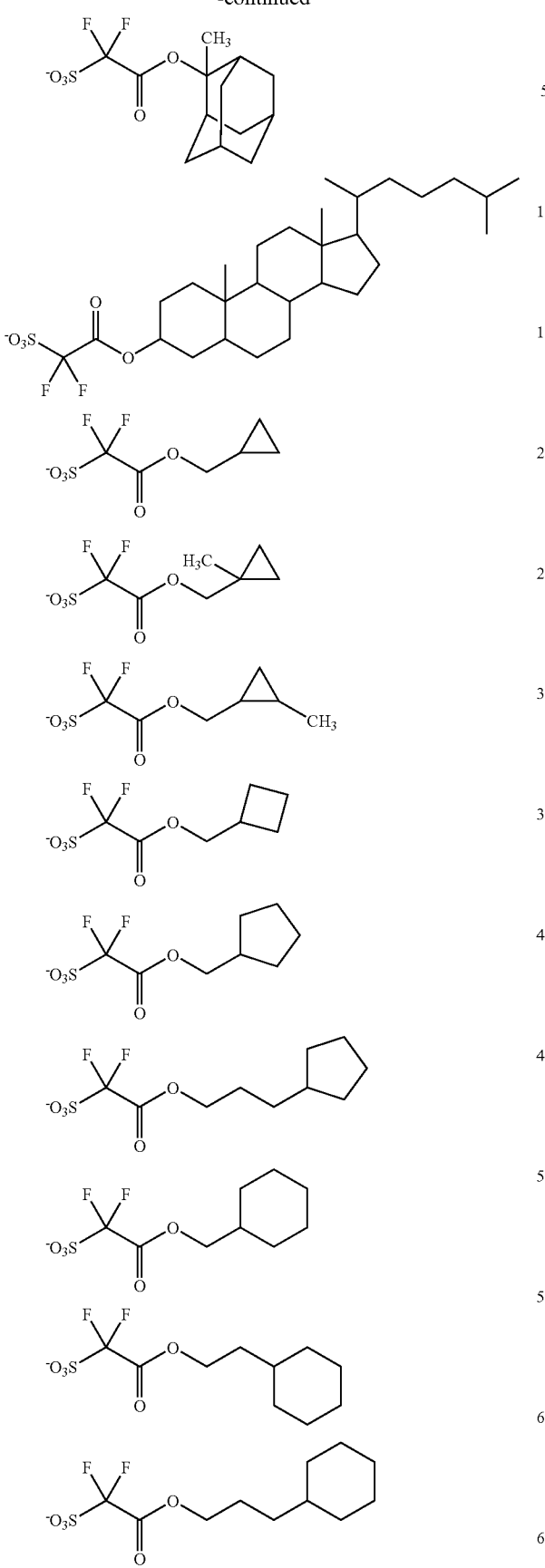
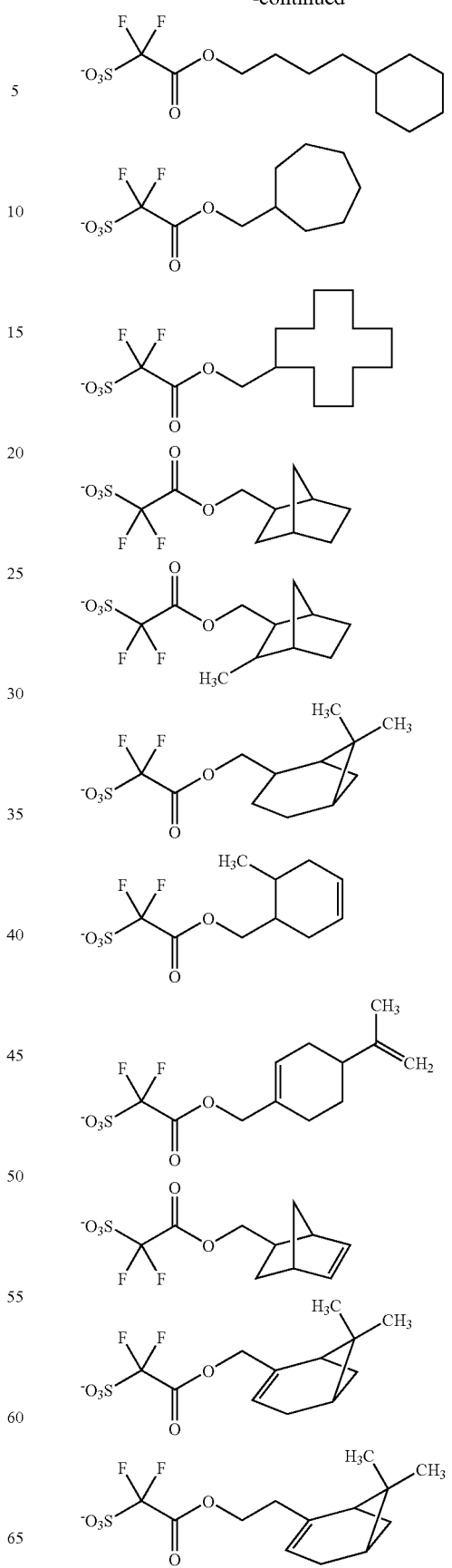

77
-continued
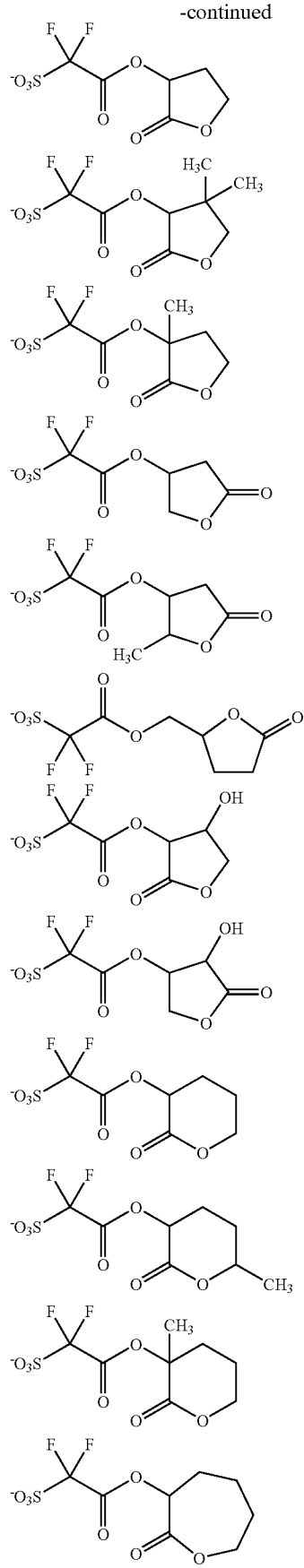
78
-continued
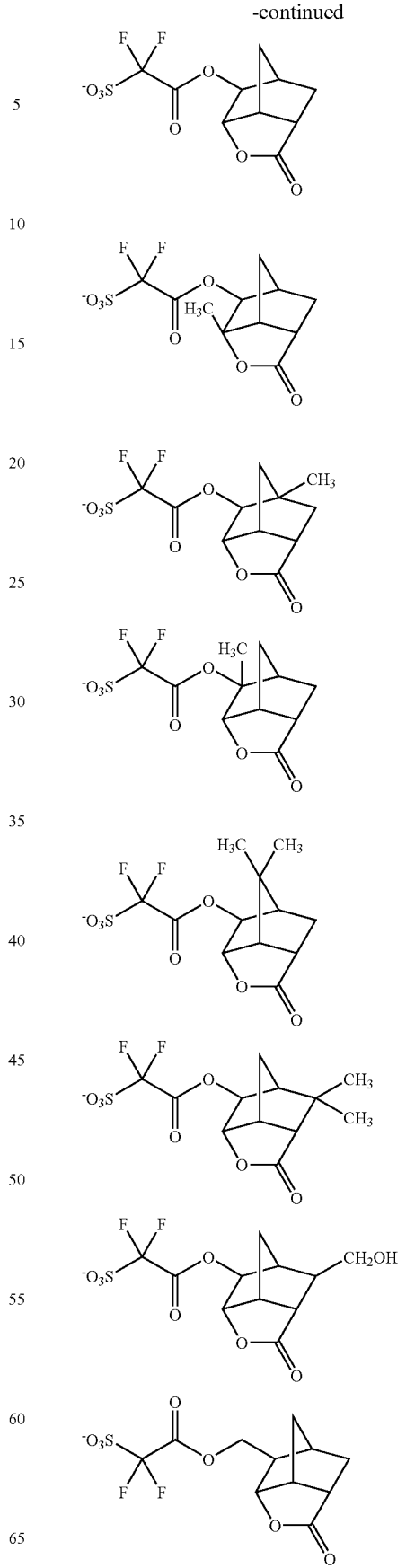

-continued
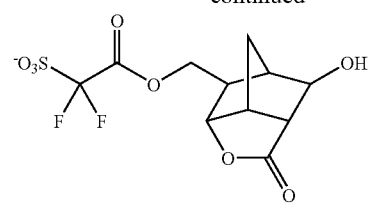
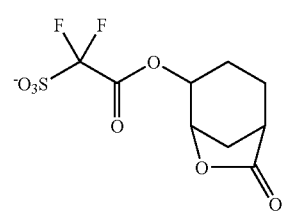
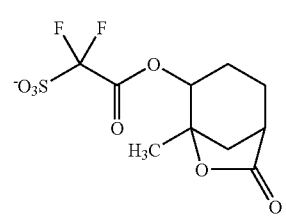
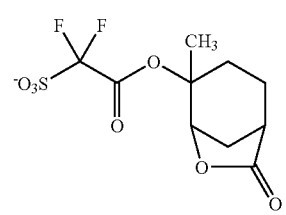
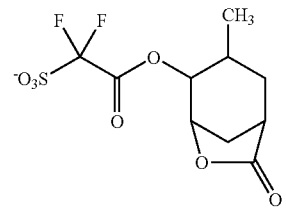
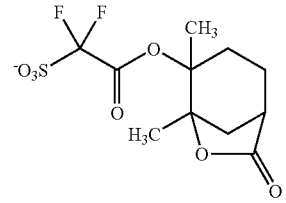
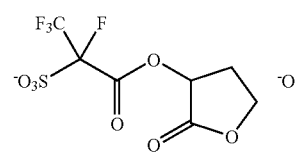
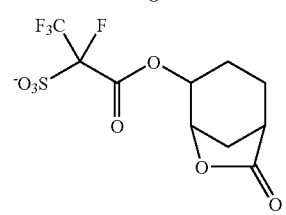
-continued
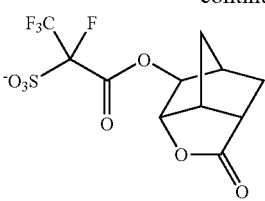
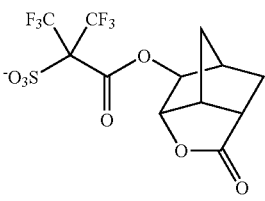
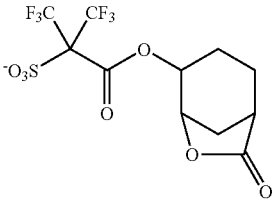
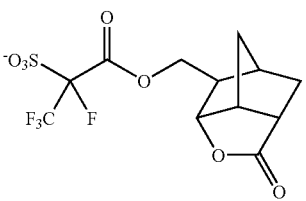
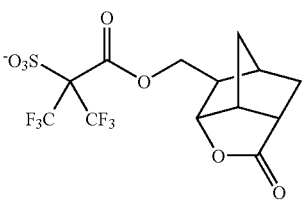
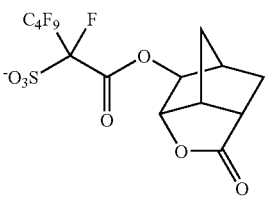
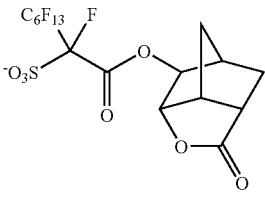
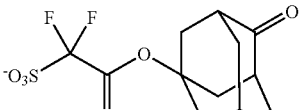
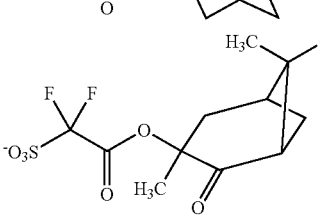

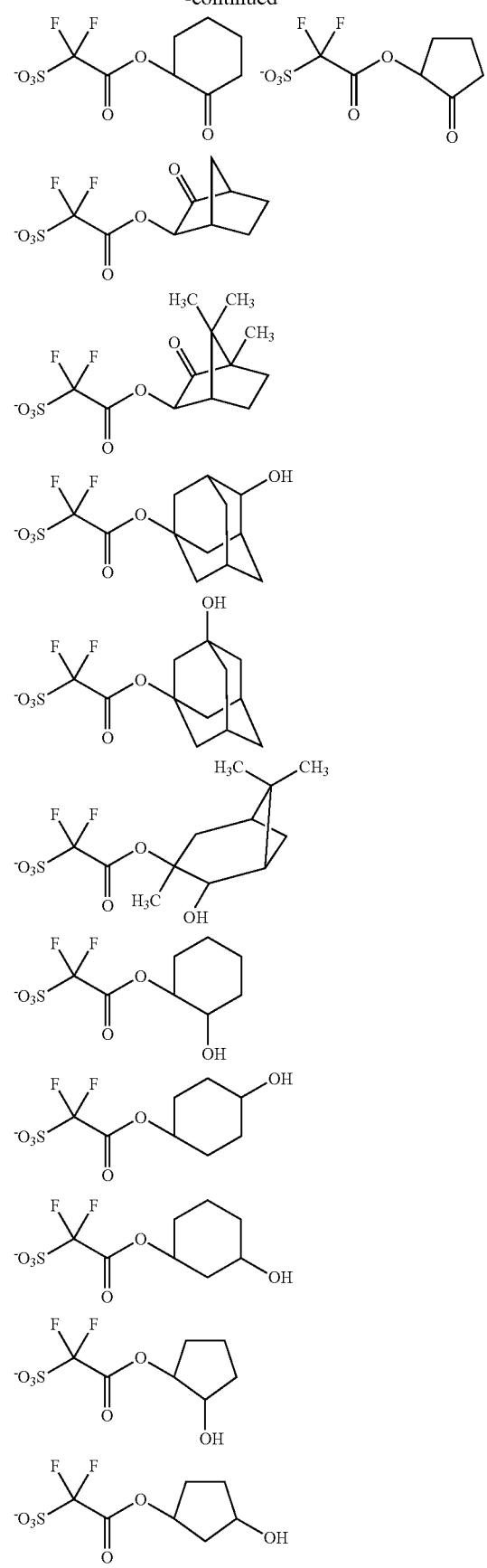
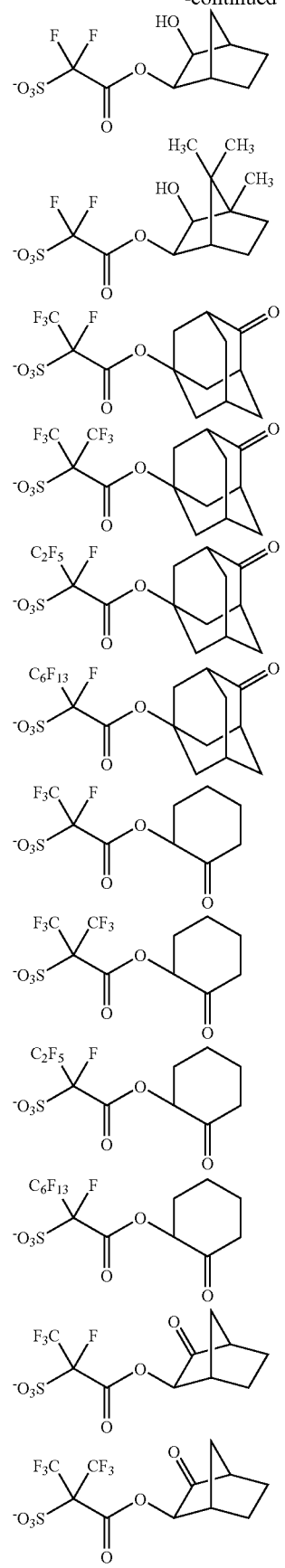

-continued
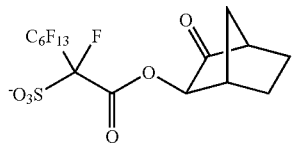
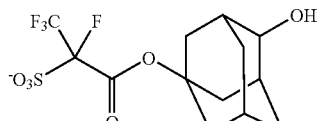
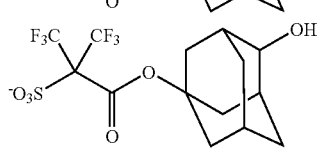
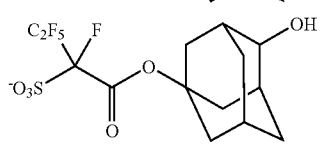
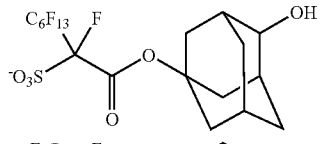
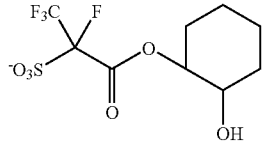
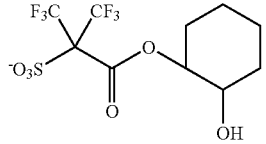
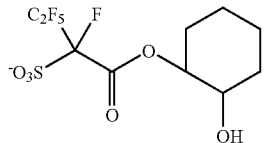
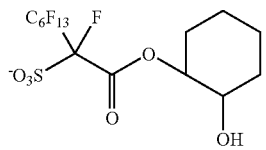
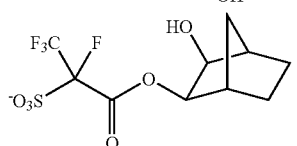
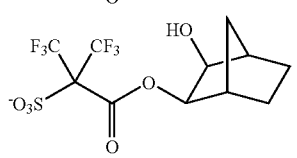
-continued
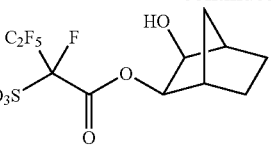
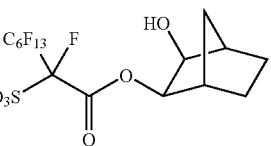
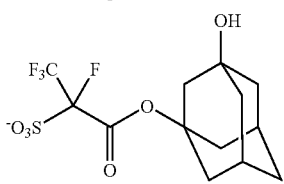
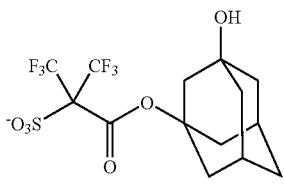
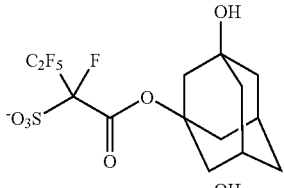
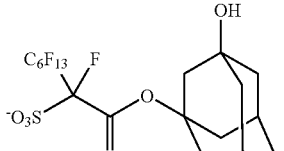
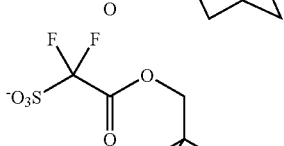
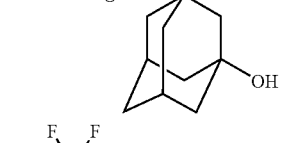
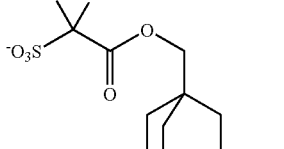
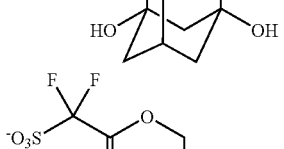
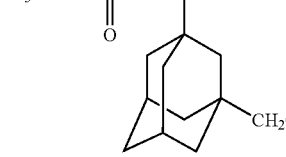

85
-continued
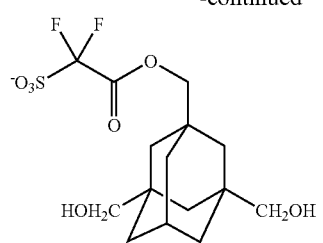
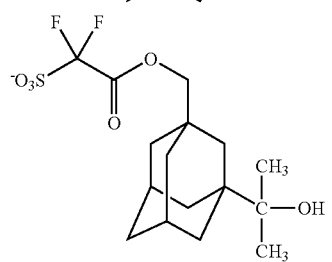
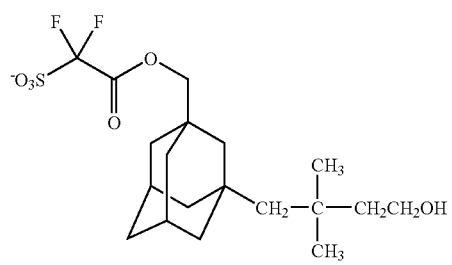
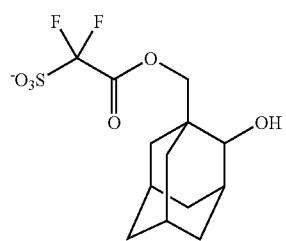
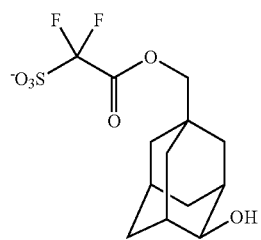
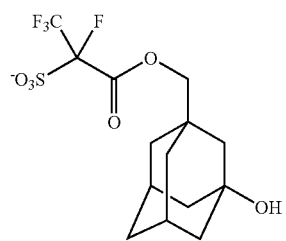
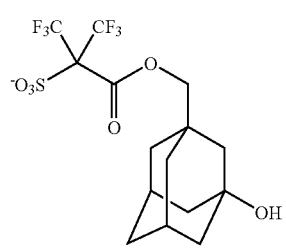
86
-continued
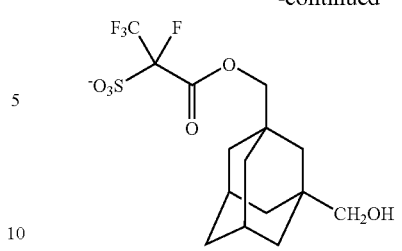
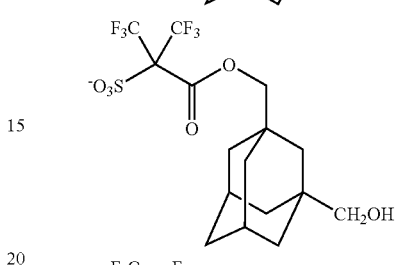
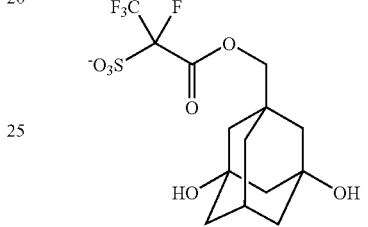
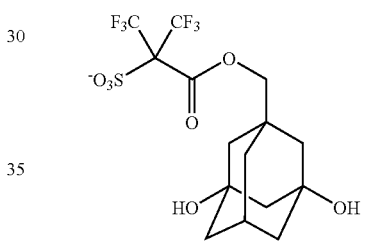
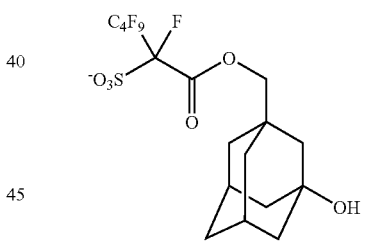
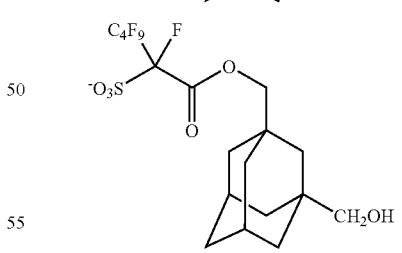
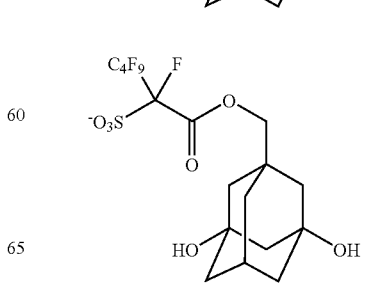

87
-continued
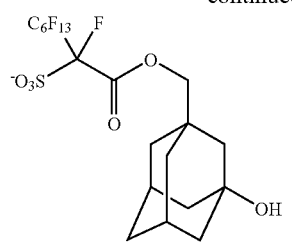
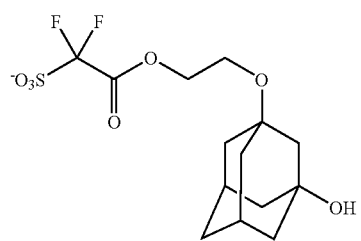
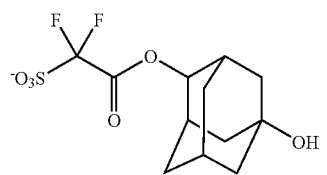
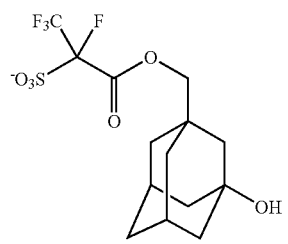
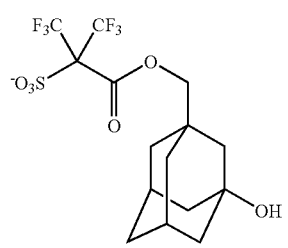
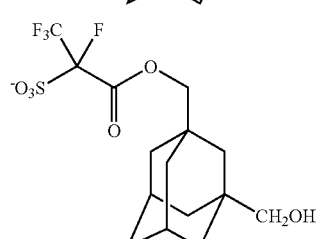
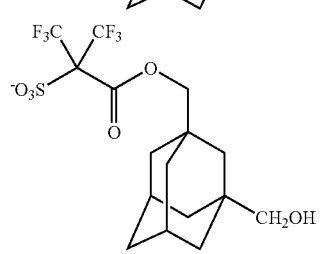
88
-continued
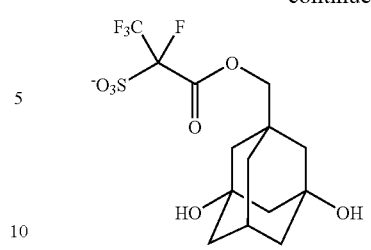
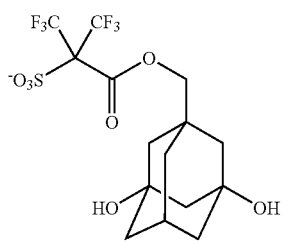
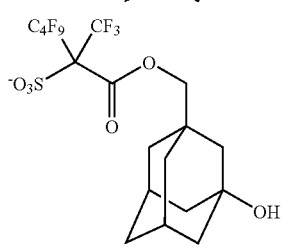
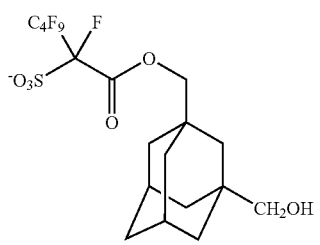
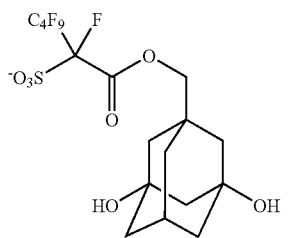
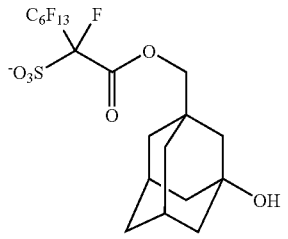
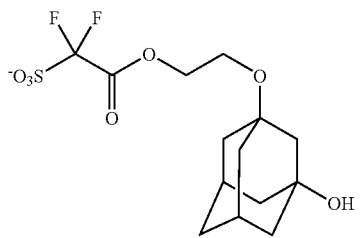

89
-continued
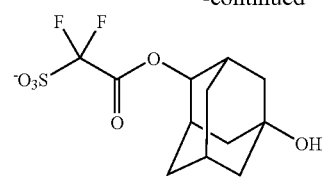
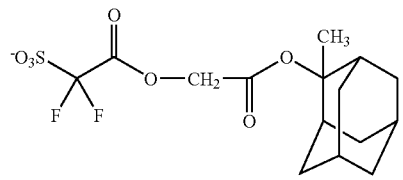
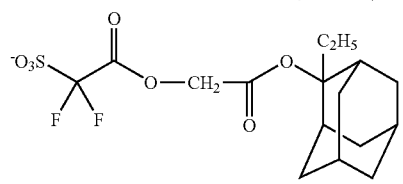
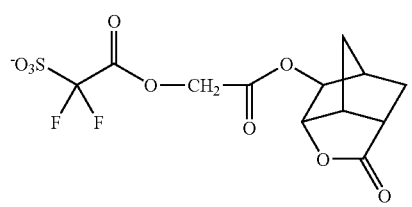
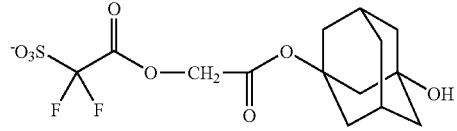
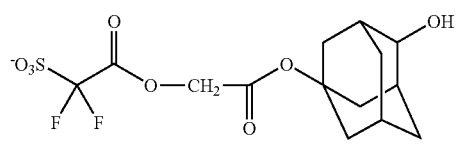
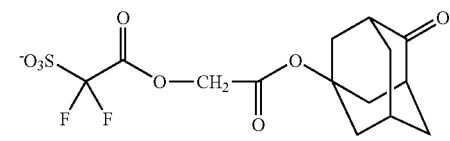
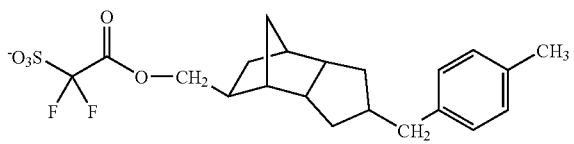
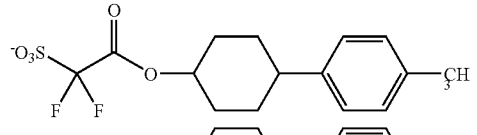
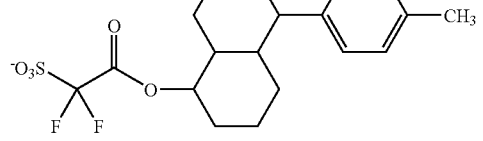
90
-continued
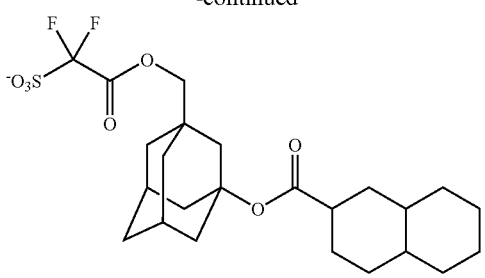
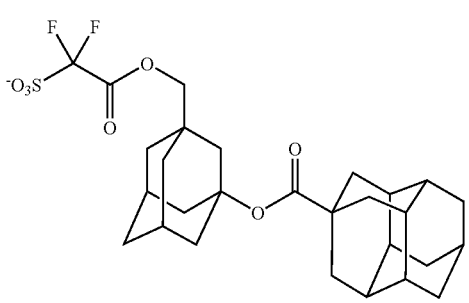
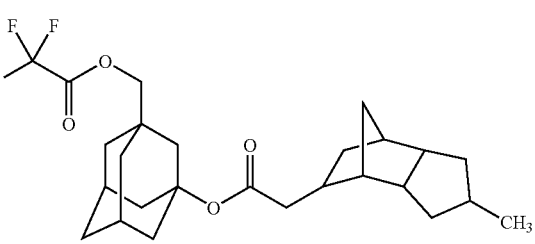
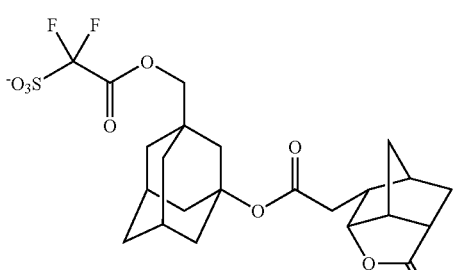
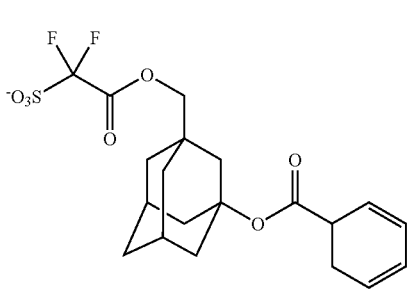
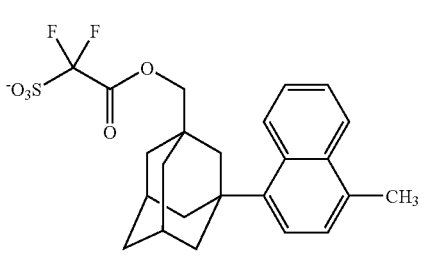

91
-continued
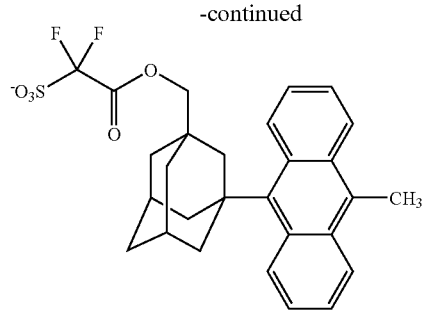
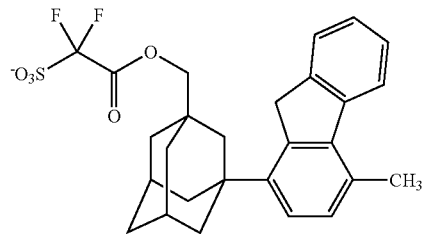
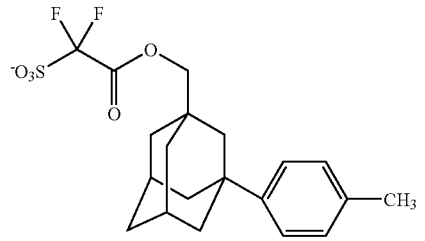
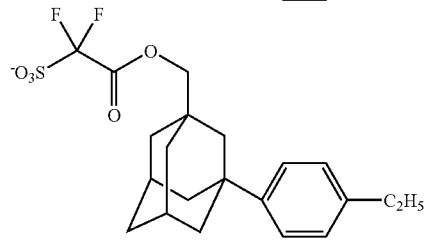
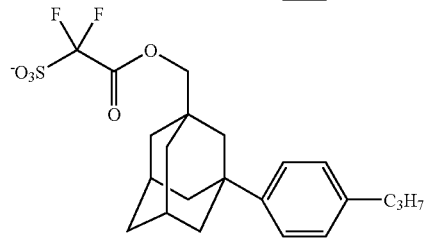
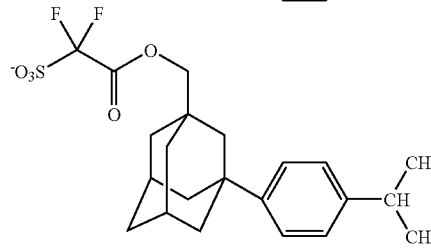
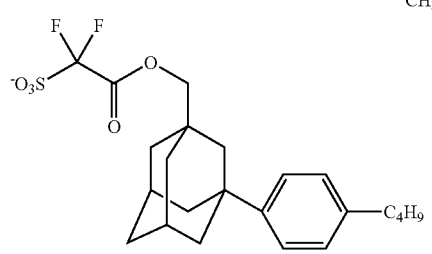
92
-continued
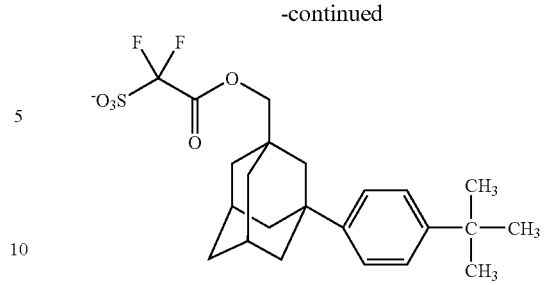
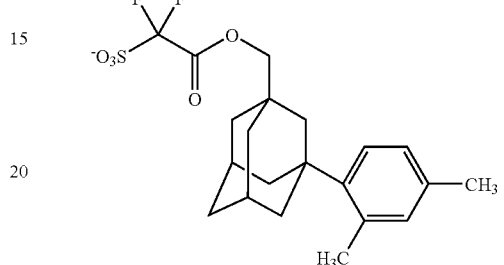
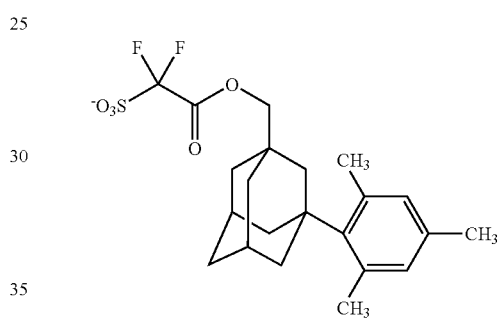
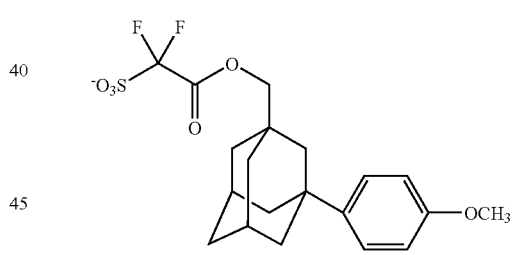
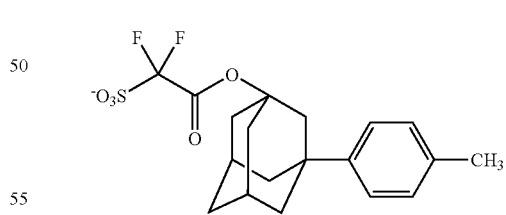
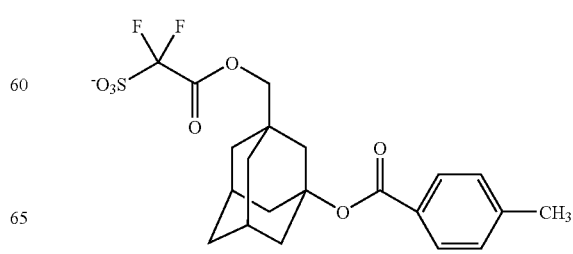

93
-continued
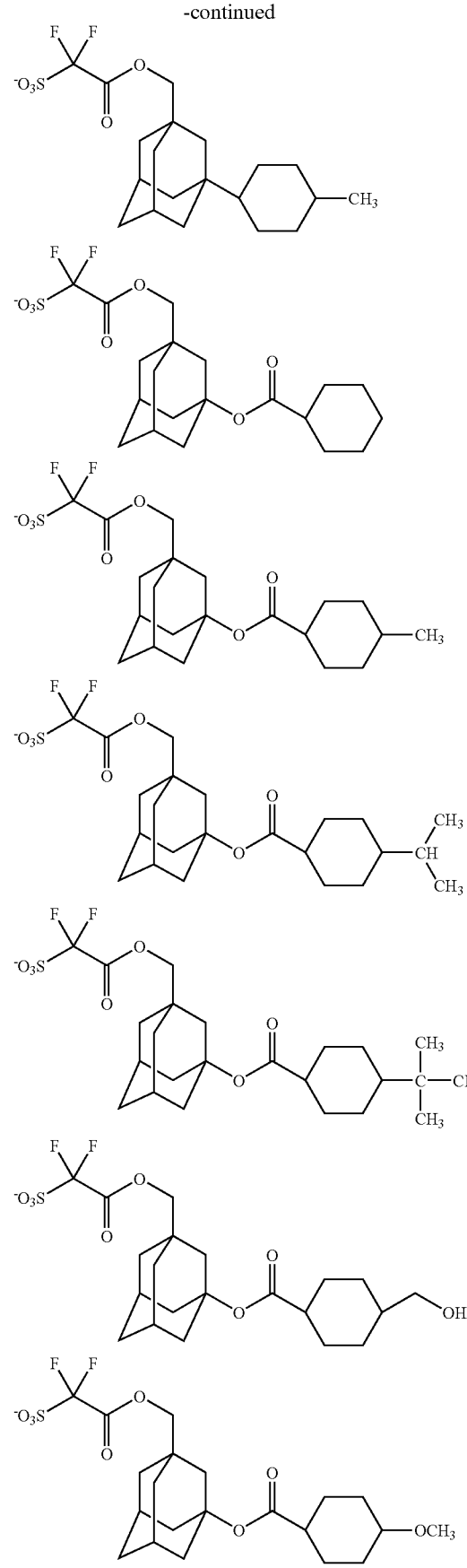
94
-continued
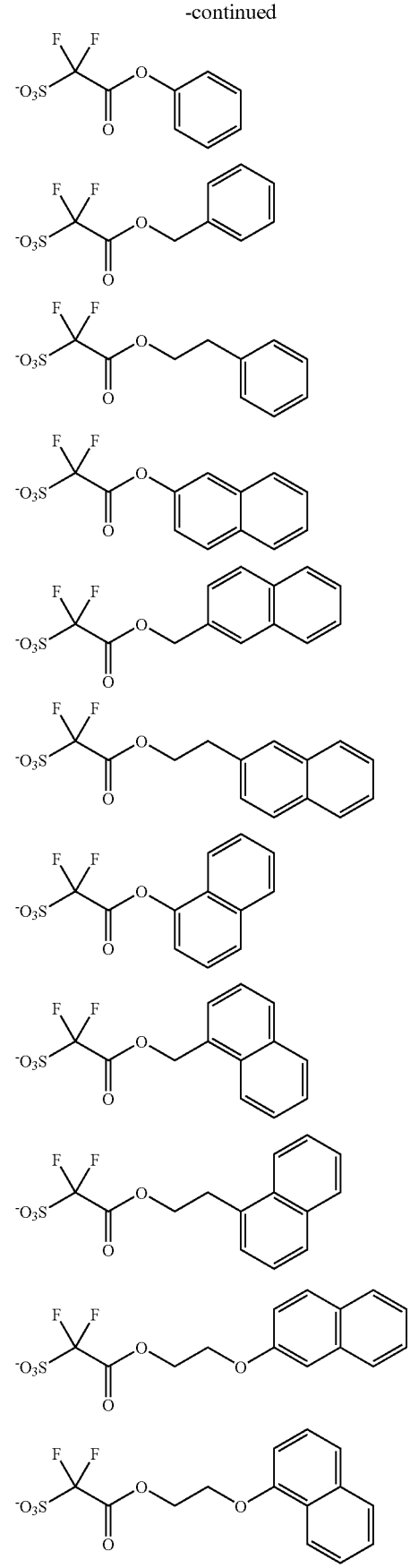

95
-continued
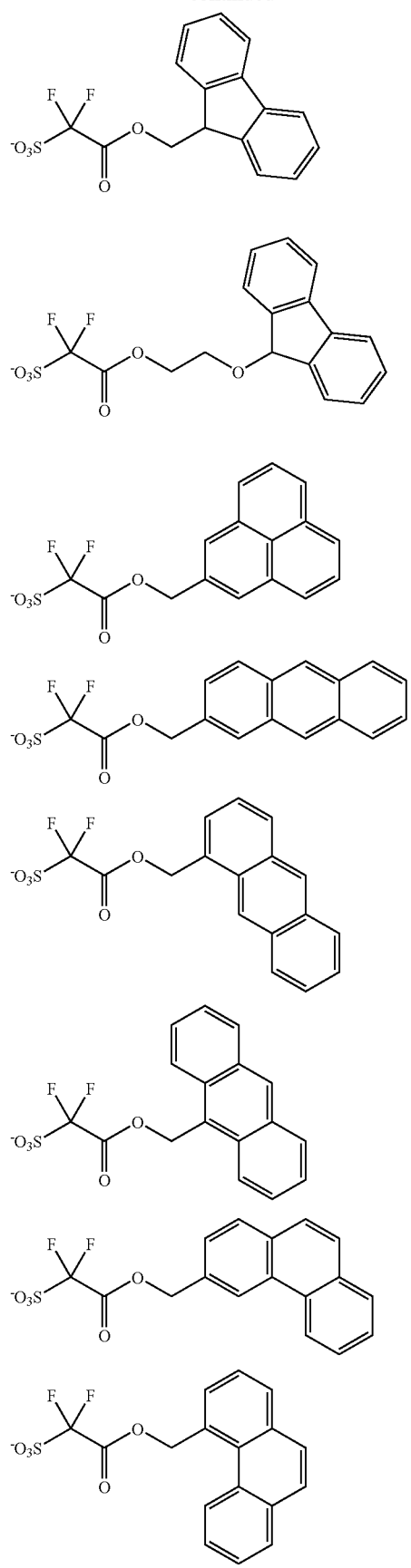
96
-continued
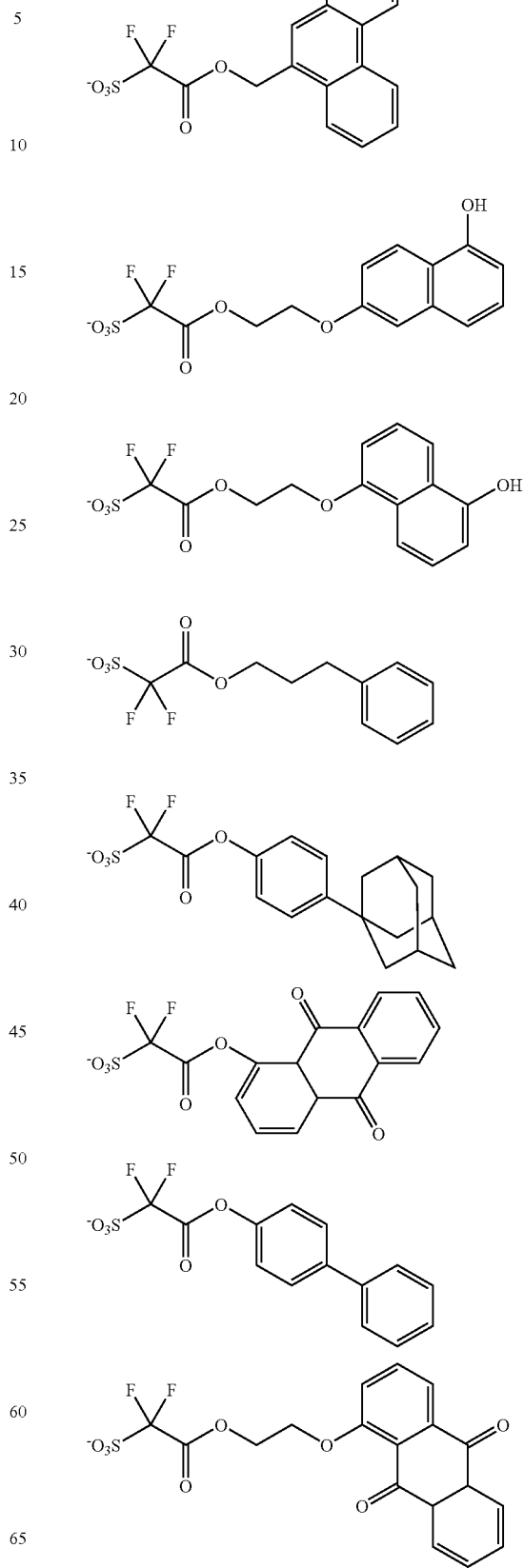

-continued

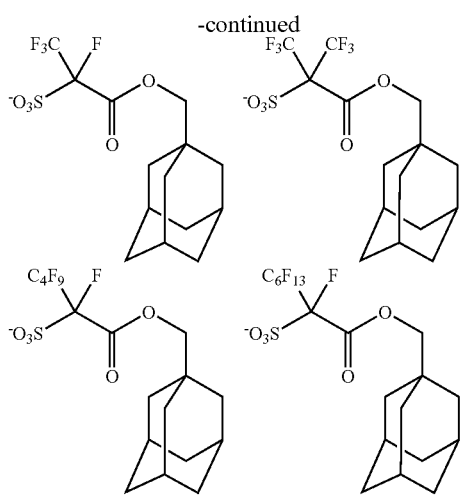

Among Salt (V), a salt represented by the formula (VI):

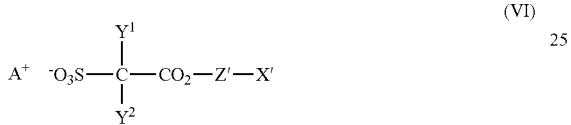

wherein $Y^1$, $Y^2$ and $A^+$ are the same meanings as defined above, Z' represents a single bond or a C1-C4 alkylene group, and X' represents a C3-C30 monocyclic or polycyclic hydrocarbon group having a hydroxyl group or a carbonyl group, and one or more hydrogen atoms in the monocyclic or polycyclic hydrocarbon group may be replaced by a C1-C6 alkoxy group, a C1-C4 perfluoroalkyl group, a C1-C6 hydroxyalkyl group, a hydroxyl group or a cyano group (hereinafter, simply referred to as Salt (VI)) is preferable.

Examples of the C1-C6 alkoxy group, the C1-C4 perfluoroalkyl group and the C1-C6 hydroxyalkyl group in X' include the same groups as described above, respectively.

Examples of the C1-C4 alkylene group in Z' include a methylene group, an ethylene group, a trimethylene group and a tetramethylene group. Z' is preferably a single bond, a methylene group or an ethylene group, and is more preferable a single bond or a methylene group.

Examples of X' include a C4-C8 cycloalkyl group such as a cyclobutyl group, a cyclopentyl group, a cyclohexyl group and a cyclooctyl group, an adamantyl group, and a norbornyl group, in all of which one or more hydrogen atoms may be replaced by the C1-C6 alkoxy group, the C1-C4 perfluoroalkyl group, the C1-C6 hydroxyalkyl group, a hydroxyl group or a cyano group.

Specific examples of X' include a 2-oxocyclopentyl group, a 2-oxocyclohexyl group, a 3-oxocyclopentyl group, a 3-oxocyclohexyl group, a 4-oxocyclohexyl group, a 2-hydroxycyclopentyl group, a 2-hydroxycyclohexyl group, a 3-hydroxycyclopentyl group, a 3-hydroxycyclohexyl group, a 4-hydroxycyclohexyl group, a 4-oxo-2-adamantyl group, a 3-hydroxy-1-adamantyl group, a 4-hydroxy-1-adamantyl group, a 5-oxonorbornan-2-yl group, a 1,7,7-trimethyl-2-oxonorbornan-2-yl group, a 3,6,6-trimethyl-2-oxo-bicyclo[3.1.1]heptan-3-yl group, a 2-hydroxy-norbornan-3-yl group, a 1,7,7-trimethyl-2-hydroxynorbornan-3-yl group, a 3,6,6-trimethyl-2-hydroxybicyclo[3.1.1]heptan-3-yl group, and the following groups (in the following formulae, straight line with an open end shows a bond which is extended from an adjacent group).

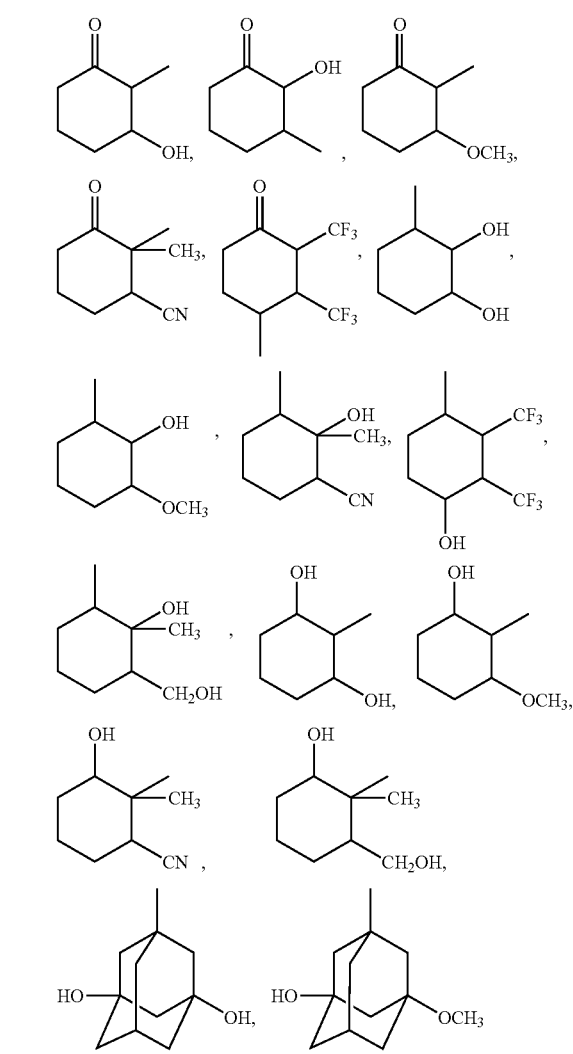

Specific examples of the anion part of Salt (VI) include the followings.

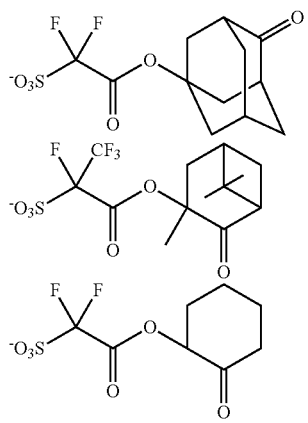

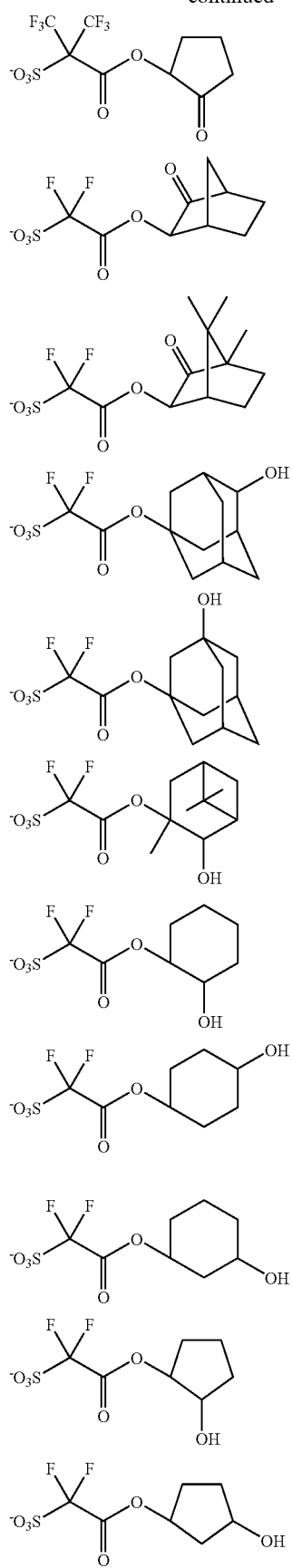
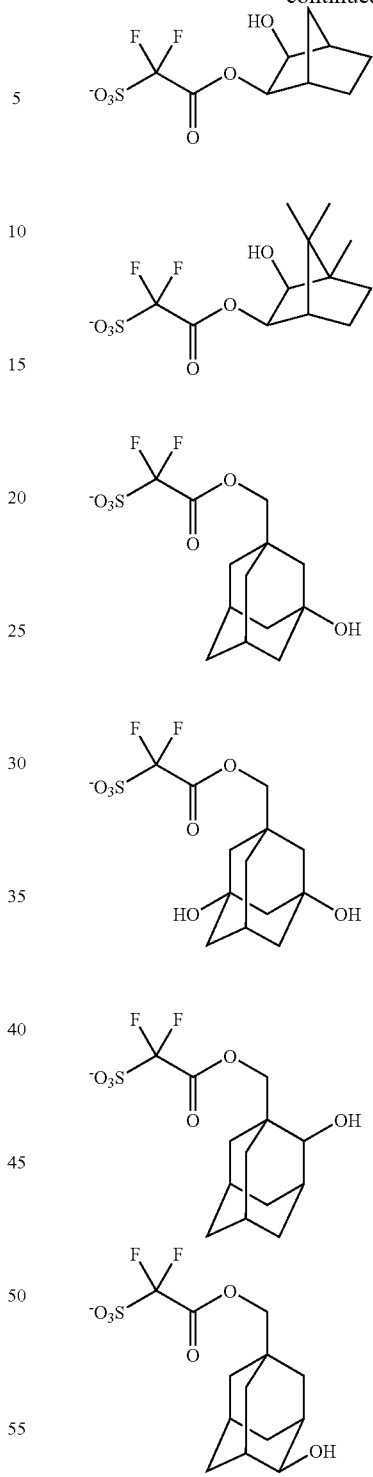

Other examples of the acid generator include a salt represented by the formula (VIII):

$$A^+{}^-O_3S-R^{13} \quad \text{(VIII)}$$

wherein $R^{13}$ represents a linear or branched chain C1-C6 perfluoroalkyl group and $A^+$ is the same as defined above (hereinafter, simply ref erred to as Salt (VIII)).

In Salt (VIII), examples of the linear or branched chain C1-C6 perfluoroalkyl group include a trifluoromethyl group, a pentafluoroethyl group, a heptafluoropropyl group, a nonafluorobutyl group and a tridecafluorohexyl group.

Specific examples of the anion part of Salt (VIII) include the followings.

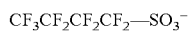

In Salt (V), Salt (VI) and Salt (VIII), $A^+$ represents an organic counter ion. Examples of the organic counter ion include a cation represented by the formula (IXz):

(IXz)

wherein $P^a$, $P^b$ and $P^c$ each independently represent a C1-C30 linear or branched chain alkyl group which may be have at least one substituent selected from the group consisting of a hydroxyl group, a C3-C12 cyclic hydrocarbon group and a C1-C12 alkoxy group, or a C3-C30 cyclic hydrocarbon group which may have at least one substituent selected from the group consisting of a hydroxyl group and a C1-C12 alkoxy group (hereinafter, simply referred to as the cation (IXz)), a cation represented by the formula (IXb):

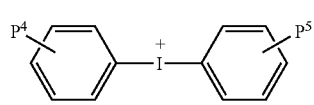

(IXb)

wherein $P^4$ and $P^5$ each independently represent a hydrogen atom, a hydroxyl group, a C1-C12 alkyl group or a C1-C12 alkoxy group (hereinafter, simply referred to as the cation (IXb)), a cation represented by the formula (IXc):

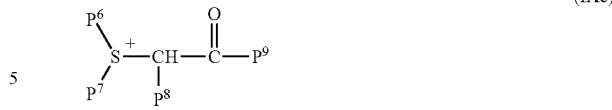

(IXc)

wherein $P^6$ and $P^7$ each independently represent a C1-C12 alkyl group or a C3-C12 cycloalkyl group, or $P^6$ and $P^7$ are bonded to form a C3-C12 divalent acyclic hydrocarbon group which forms a ring together with the adjacent $S^+$, and one or more —$CH_2$— in the divalent acyclic hydrocarbon group may be replaced by —CO—, —O— or —S—, $P^8$ represents a hydrogen atom, $P^9$ represents a C1-C12 alkyl group, a C3-C12 cycloalkyl group or an aromatic group which may have one or more substituents, or $P^8$ and $P^9$ are bonded to form a divalent acyclic hydrocarbon group which forms a 2-oxo-cycloalkyl group together with the adjacent —CHCO—, and one or more —$CH_2$— in the divalent acyclic hydrocarbon group may be replaced by —CO—, —O— or —S— (hereinafter, simply referred to as the cation (IXc)); and a cation represented by the formula (IXd):

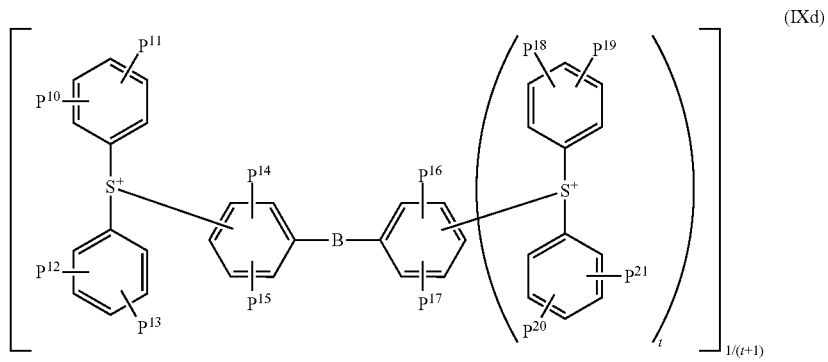

(IXd)

$P^{10}$, $P^{11}$, $P^{12}$, $P^{13}$, $P^{14}$, $P^{15}$, $P^{16}$, $P^{17}$, $P^{18}$, $P^{19}$, $P^{20}$ and $P^{21}$ each independently represent a hydrogen atom, a hydroxyl group, a C1-C12 alkyl group or a C1-C12 alkoxy group, B represents a sulfur or oxygen atom and t represents 0 or 1 (hereinafter, simply referred to as the cation (IXd)).

Examples of the C1-C12 alkoxy group in the cations (IXz), (IXb) and (IXd) include a methoxy group, an ethoxy group, a propoxy group, an isopropoxy group, a butoxy group, an isobutoxy group, a sec-butoxy group, a tert-butoxy group, a pentyloxy group, a hexyloxy group, a octyloxy group and a 2-ethylhexyloxy group.

Examples of the C3-C12 cyclic hydrocarbon group in the cation (IXz) include a cyclopentyl group, a cyclohexyl group, a 1-adamantyl group, a 2-adamantyl group, a phenyl group, a 2-methylphenyl group, a 4-methylphenyl group, a 1-naphthyl group and a 2-naphthyl group.

Examples of the C1-C30 alkyl group which may have at least one substituent selected from the group consisting of a hydroxyl group, a C3-C12 cyclic hydrocarbon group and a C1-C12 alkoxy group in the cation (IXz) include a methyl group, an ethyl group, a propyl group, an isopropyl group, a butyl group, an isobutyl group, a sec-butyl group, a tert-butyl group, a pentyl group, a hexyl group, a octyl group, a 2-ethylhexyl group and a benzyl group.

Examples of the C3-C30 cyclic hydrocarbon group which may have at least one substituent selected from the group consisting of a hydroxyl group and a C1-C12 alkoxy group in the cation (IXz) include a cyclopentyl group, a cyclohexyl group, a 1-adamantyl group, a 2-adamantyl group, a bicyclohexyl group, a phenyl group, a 2-methylphenyl group, a 4-methylphenyl group, a 4-ethylphenyl group, a 4-isopropylphenyl group, a 4-tert-butylphenyl group, a 2,4-dimethylphenyl group, a 2,4,6-trimethylphenyl group, a 4-hexylphenyl group, a 4-octylphenyl group, a 1-naphthyl group, a 2-naphthyl group, a fluorenyl group, a 4-phenylphenyl group, a 4-hydroxyphenyl group, a 4-methoxyphenyl group, a 4-tert-butoxyphenyl group and a 4-hexyloxyphenyl group.

Examples of the C1-C12 alkyl group in the cations (IXb), (IXc) and (IXd) include a methyl group, an ethyl group, a propyl group, an isopropyl group, a butyl group, an isobutyl group, a sec-butyl group, a tert-butyl group, a pentyl group, a hexyl group, a octyl group and a 2-ethylhexyl group.

Examples of the C3-C12 cycloalkyl group in the cation (IXc) include a cyclopropyl group, a cyclobutyl group, a cyclopentyl group, a cyclohexyl group, a cycloheptyl group, a cyclooctyl group and a cyclodecyl group. Examples of the C3-C12 divalent acyclic hydrocarbon group formed by bonding $P^6$ and $P^7$ include a trimethylene group, a tetramethylene group and a pentamethylene group. Examples of the ring group formed together with the adjacent $S^+$ and the divalent acyclic hydrocarbon group include a tetramethylenesulfonio group, a pentamethylenesulfonio group and oxybisethylenesulfonio group.

Examples of the aromatic group in the cation (IXc) include a phenyl group, a tolyl group, a xylyl group, a 4-butylphenyl group, a 4-isobutylphenyl group, a 4-tert-butylphenyl group, a 4-cyclohexylphenyl group, a 4-phenylphenyl group, a 1-naphthyl group and a 2-naphthyl group. The aromatic group may have one or more substituents, and examples of the substituents include a C1-C6 alkoxy group such as a methoxy group, an ethoxy group, a propoxy group, a butoxy group, a tert-butoxy group and a hexyloxy group; a C2-C12 acyloxy group such as an acetyloxy group and a 1-adamantylcarbonyloxy group; and a nitro group.

Examples of the divalent acyclic hydrocarbon group formed by bonding $P^8$ and $P^9$ include a methylene group, an ethylene group, a trimethylene group, a tetramethylene group and a pentamethylene group and examples of the 2-oxocycloalkyl group formed together with the adjacent —CHCO— and the divalent acyclic hydrocarbon group include a 2-oxocyclopentyl group and a 2-oxocyclohexyl group.

Examples of the cation (IXz) include the followings:

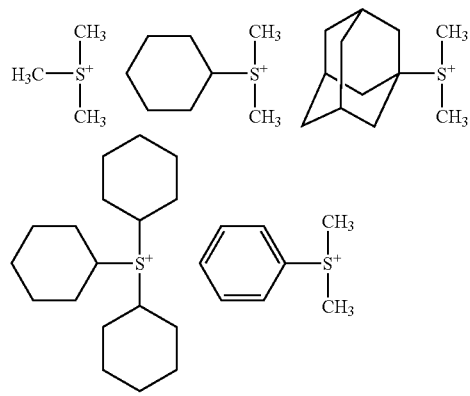

-continued

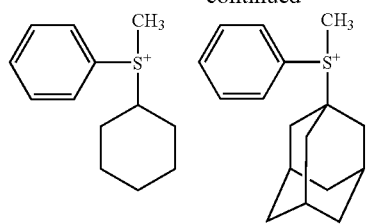

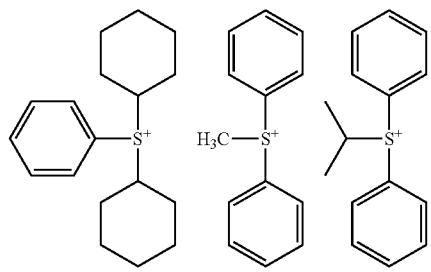

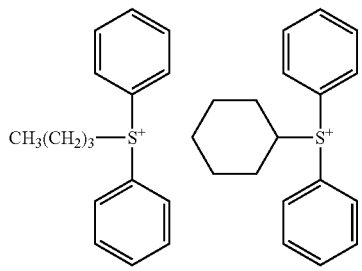

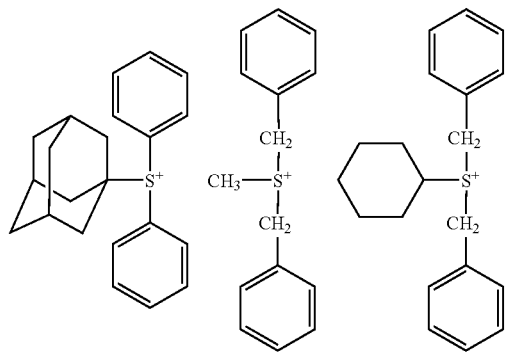

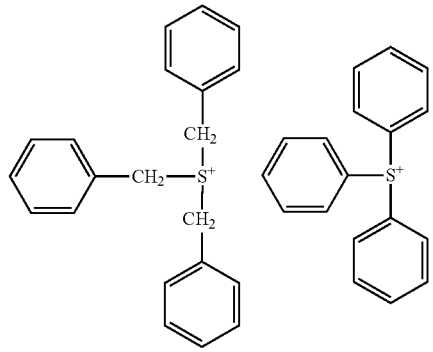

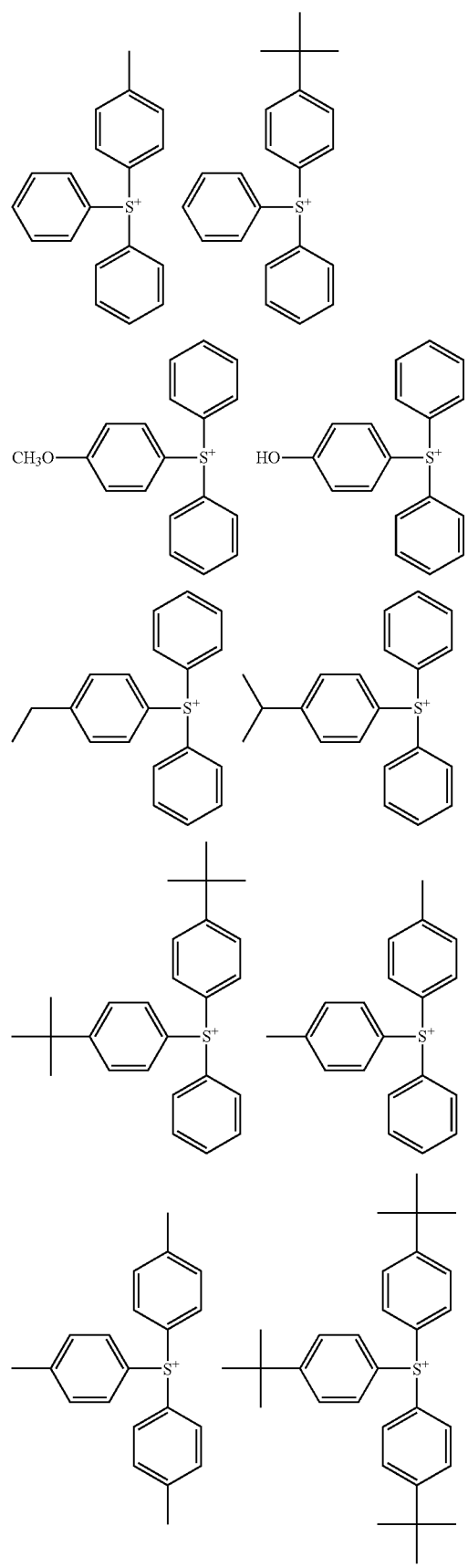
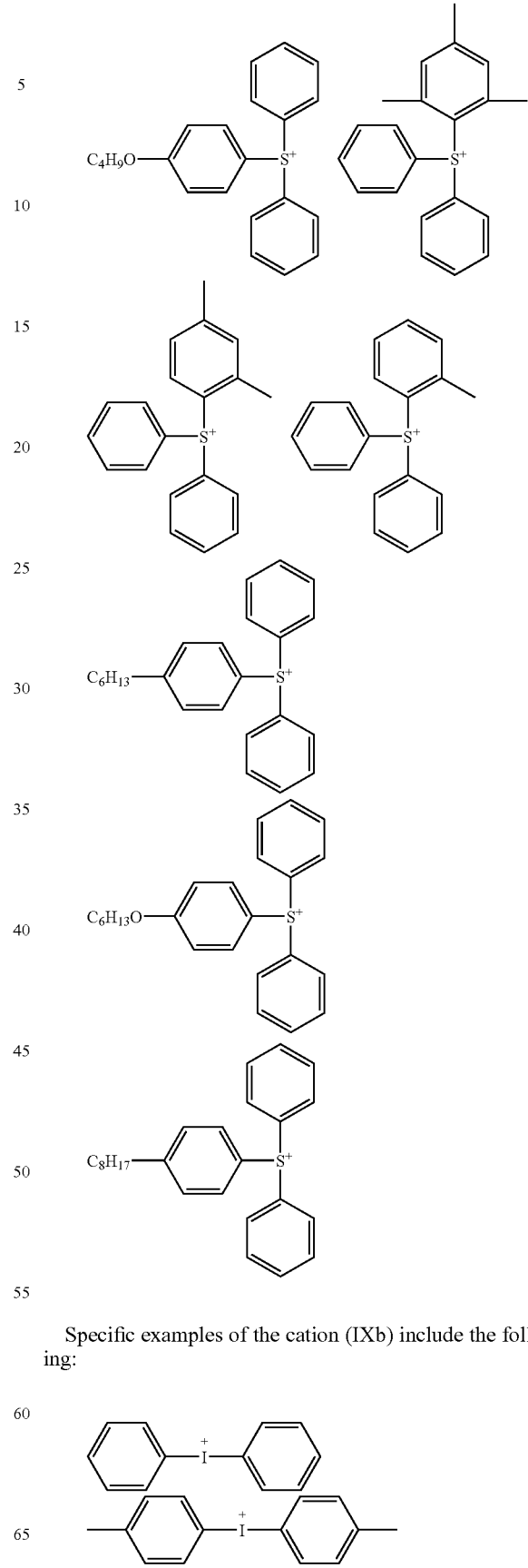
Specific examples of the cation (IXb) include the following:

Specific examples of the cation (IXc) include the following:
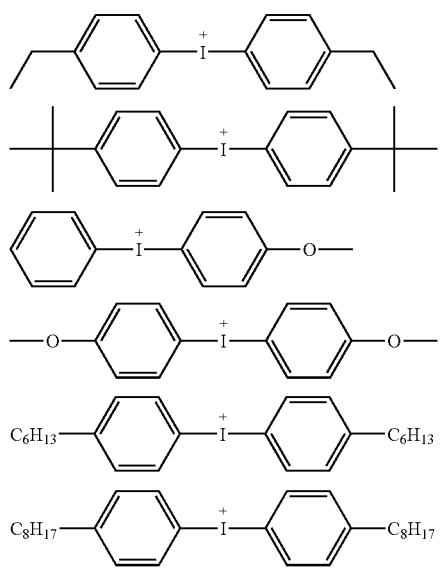
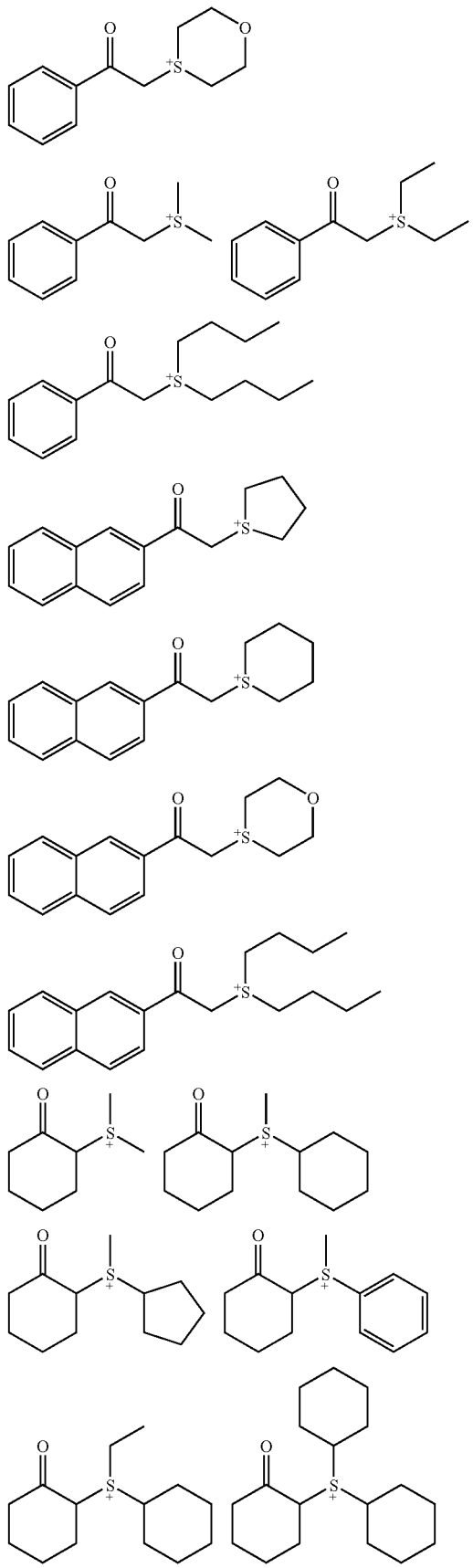

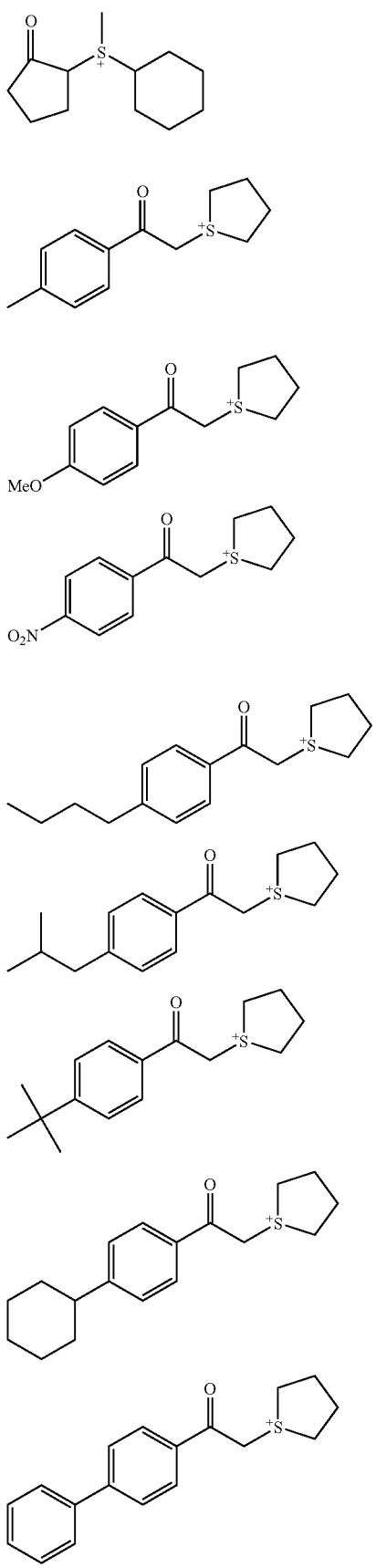
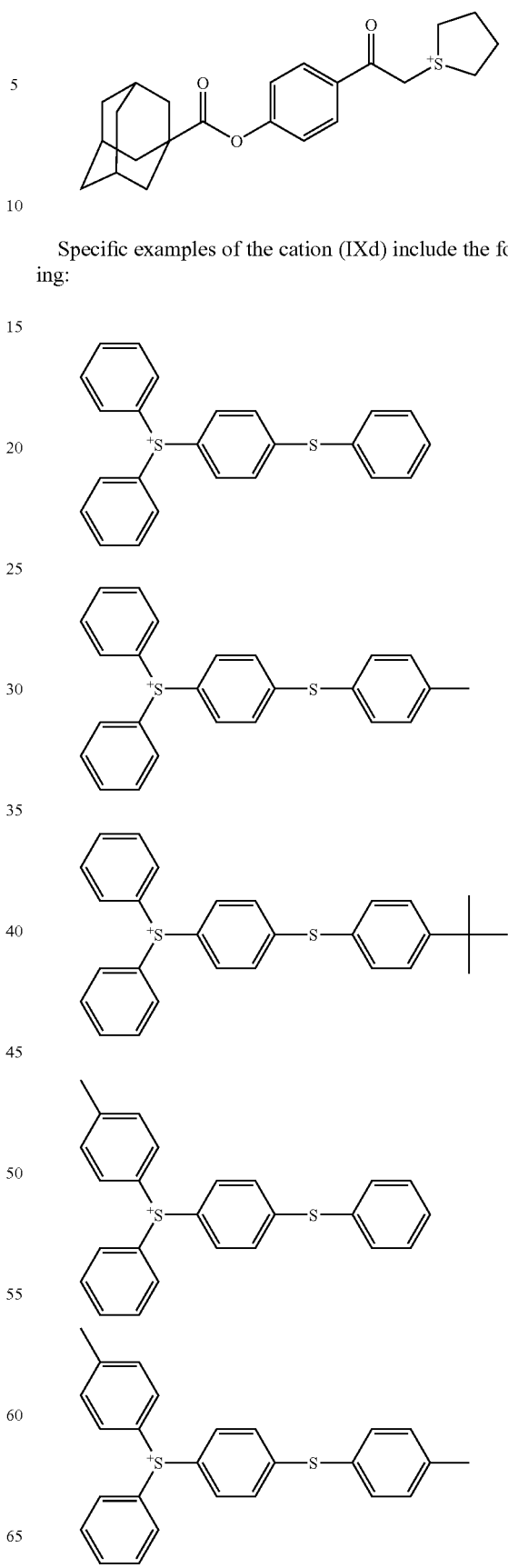
Specific examples of the cation (IXd) include the following:

111
-continued
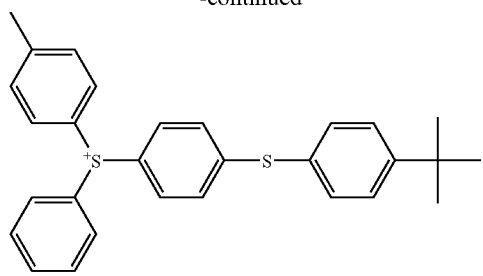
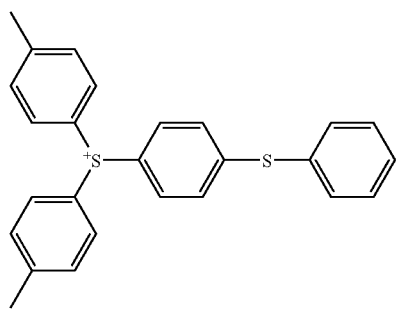
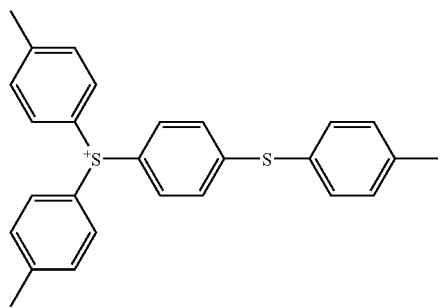
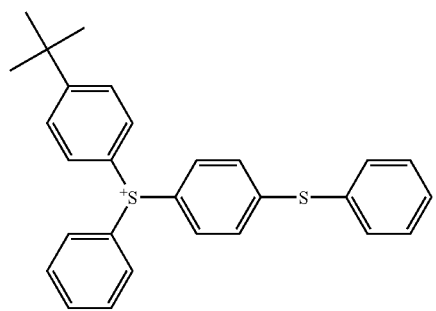
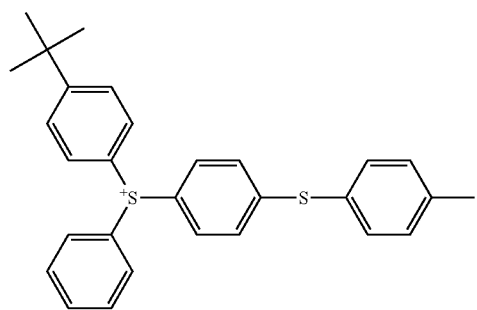
112
-continued
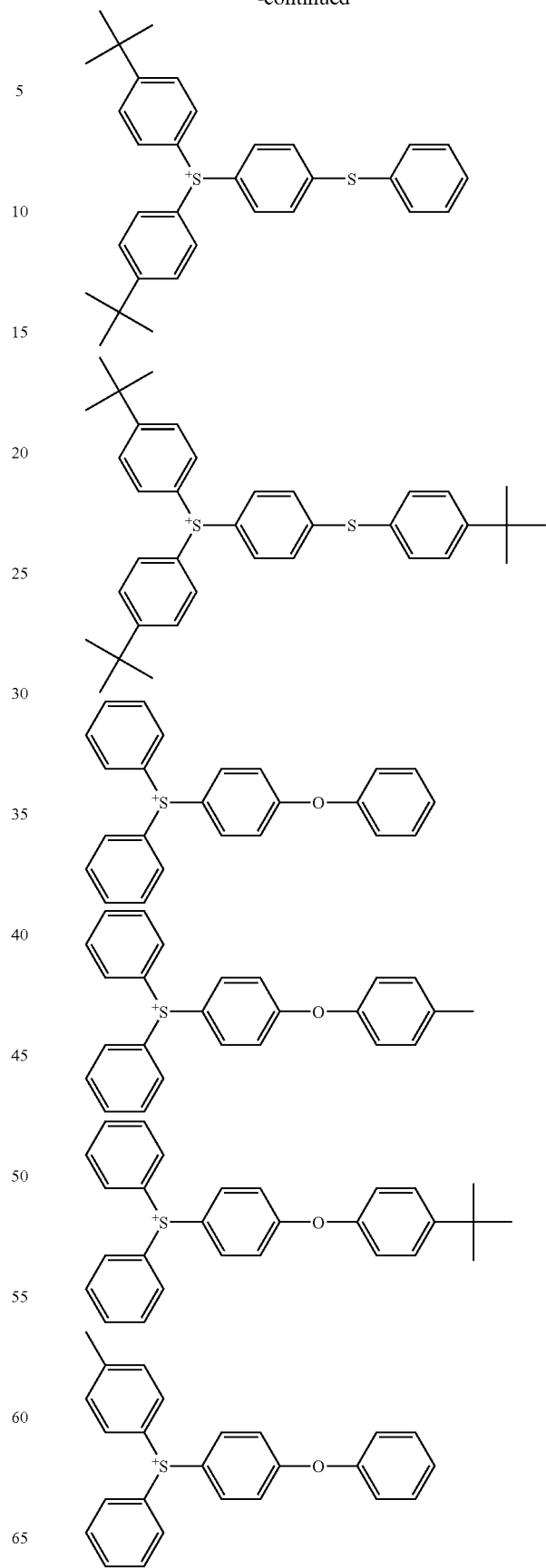

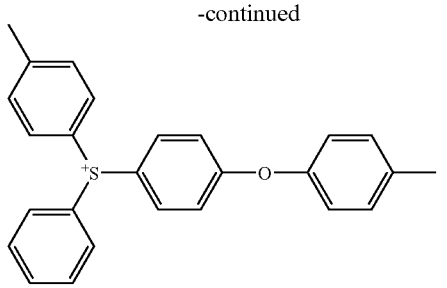
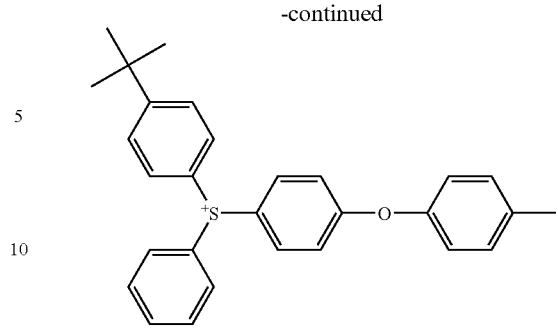
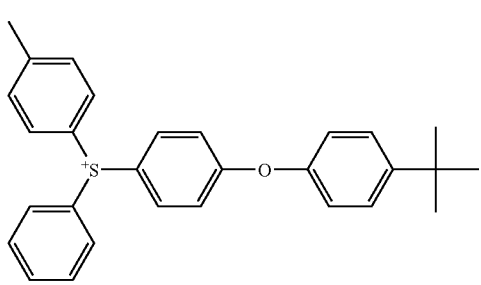
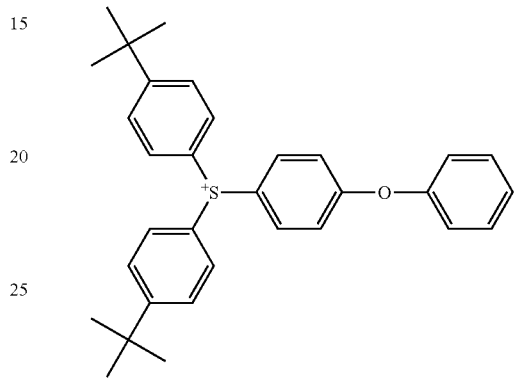
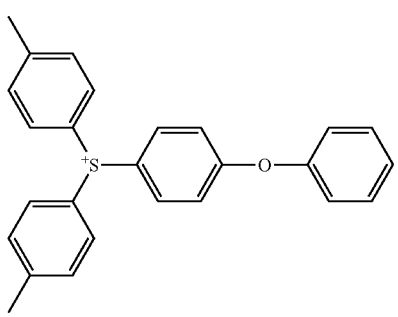
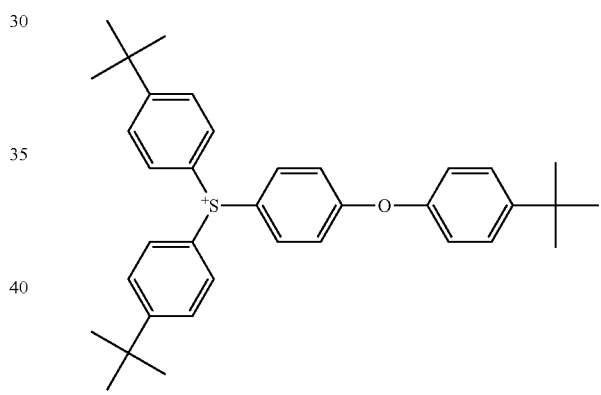
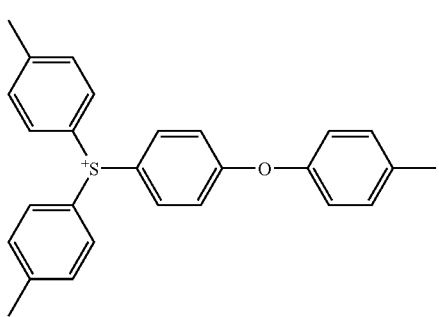
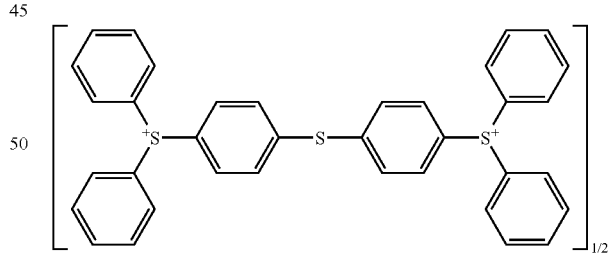
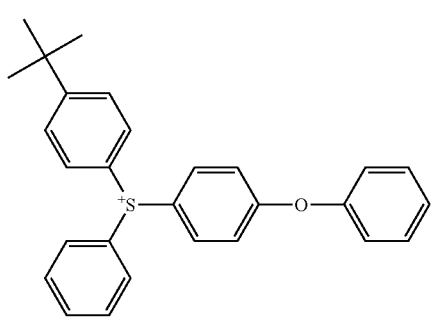
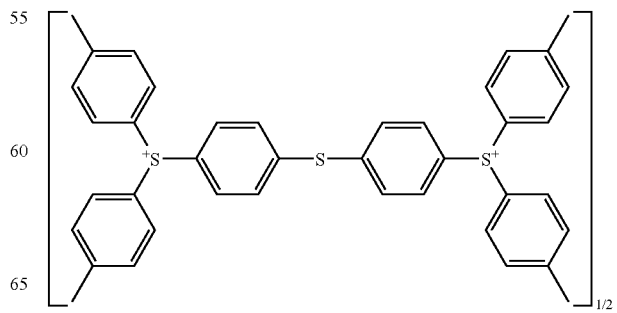

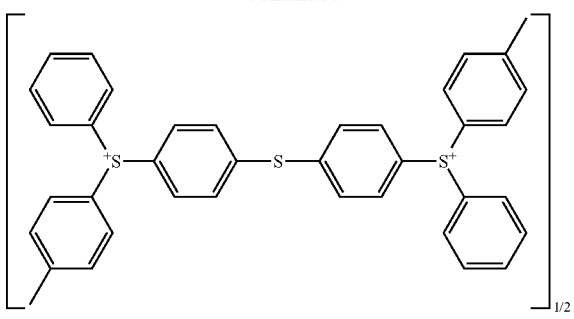

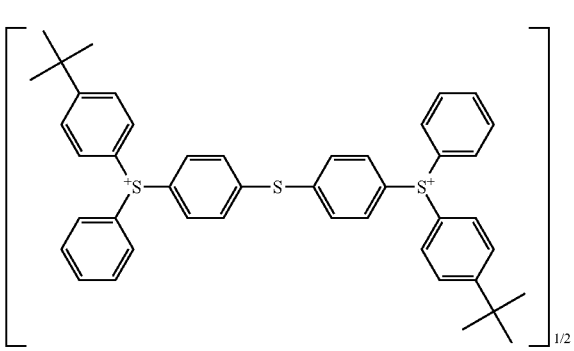

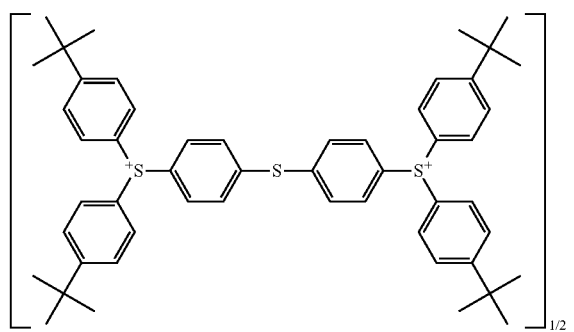

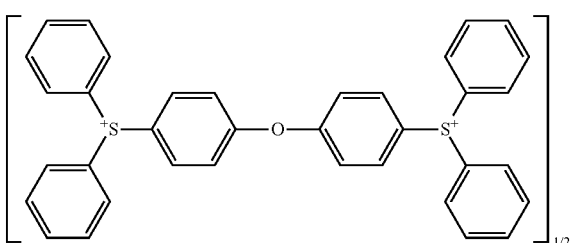

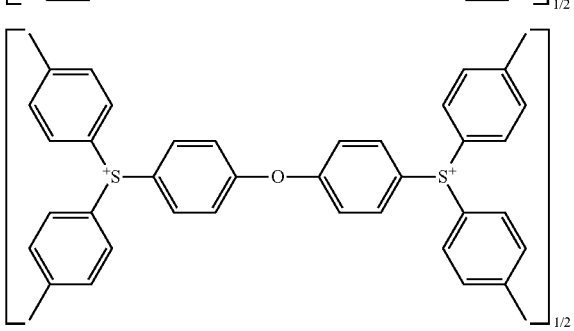

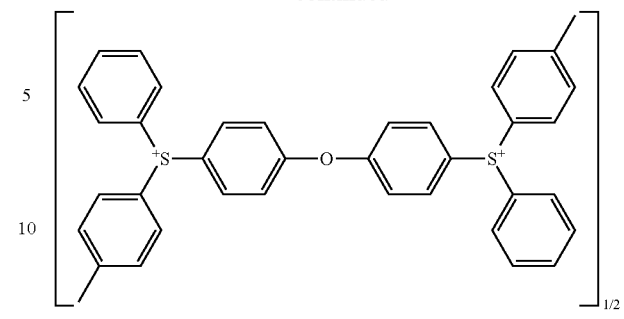

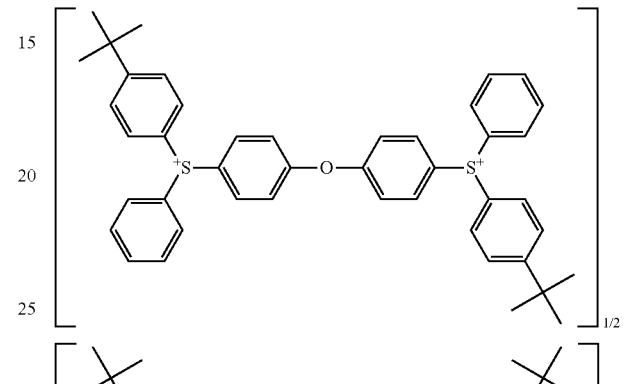

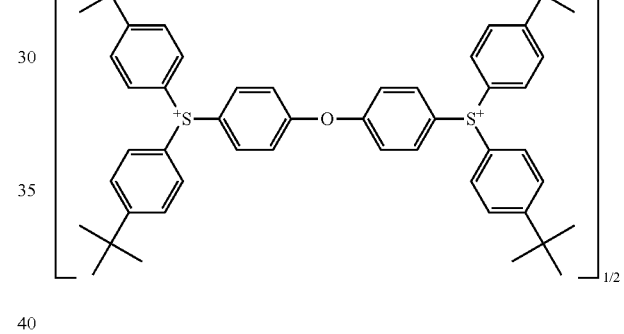

Among the cation (IXz), the cation represented by the formula (IXa):

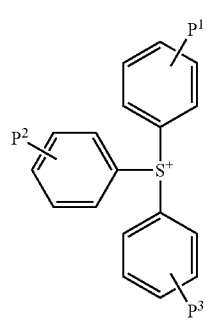

wherein $P^1$, $P^2$ and $P^3$ each independently represent a hydrogen atom, a hydroxyl group, a C1-C12 linear or branched chain alkyl group or a C1-C12 linear or branched chain alkoxy group, is preferable. Examples of the C1-C12 linear or branched chain alkyl group and the C1-C12 linear or branched chain alkoxy group include the same as described above.

As the organic counter ion represented by A⁺, a cation represented by the following formulae (IXe):

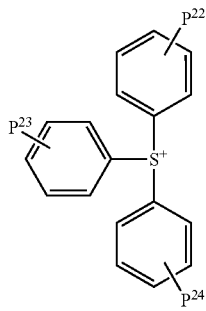

(IXe)

wherein $P^{22}$, $P^{23}$ and $P^{24}$ each independently represent a hydrogen atom or a C1-C4 alkyl group, is also preferable.

As the Salt (VI), a salt wherein A⁺ is the cation represented by the following formulae (IXe) and the anion part is the following:

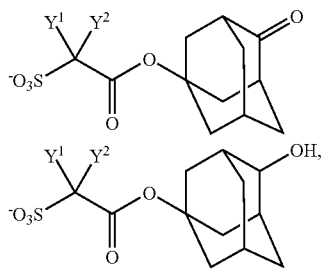

and a salt wherein A⁺ is the cation represented by the following formulae (IXc) and the anion part is the following:

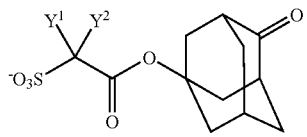

are preferable.

Salt (VI) can be produced according to known methods such as a method described in JP 2007-249192 A1.

Additionally, the acid generators represented by the formulae (Xd) and (Xe):

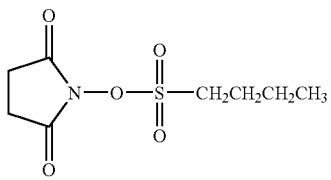

(Xd)

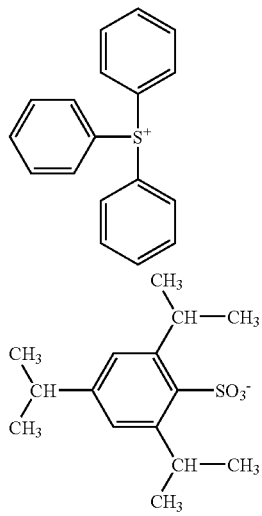

(Xe)

are also preferable.

The present resist composition may contain two or more kinds of acid generators.

The present resist composition preferably includes 50 to 99.9% by weight of the present polymer and 0.1 to 50% by weight of the acid generator, preferably 60 to 99% by weight of the present polymer and 1 to 40% by weight of the acid generator, and more preferably 60 to 97% by weight of the present polymer and 3 to 40% by weight of the acid generator based on the total amount of the present polymer and the acid generator.

The present resist composition may contain one or more resins in addition to the present polymer. The resin comprising a structural unit having an acid-labile group and being insoluble or poorly soluble in an aqueous alkali solution but becoming soluble in an aqueous alkali solution by the action of an acid (hereinafter, simply referred to as "RESIN") is preferable.

Examples of the acid-labile group of RESIN include the same as described above.

RESIN contains one or more structural units, and examples of the structural unit include the structural unit (II), the structural units represented by the formulae (III), (IVa), (IVb), (IVc), (a-1) and (a-2).

When RESIN contains the structural unit (II), the content thereof in RESIN is usually 1 to 99 mol %, preferably 10 to 95 mol %, and more preferably 20 to 85 mol % based on the total molar of all structural units.

When RESIN contains the structural unit represented by the formula (III), the content thereof in RESIN is usually 3 to 40 mol %, preferably 5 to 35 mol %, and more preferably 5 to 30 mol % based on the total molar of all structural units. When RESIN contains the structural unit represented by the formula (IVa), (IVb) or (IVc), the content thereof in RESIN is usually 5 to 50 mol %, preferably 10 to 45 mol %, and more preferably 15 to 40 mol based on the total molar of all structural units.

Among the above-mentioned monomers giving the structural unit having an acid-labile group, 1-ethyl-1-cyclohexyl acrylate and 1-ethyl-1-cyclohexyl methacrylate are preferable and 1-ethyl-1-cyclohexyl methacrylate is more preferable.

When RESIN contains the structural unit represented by the formula (a-1) or (a-2), the content thereof in RESIN is usually 10 to 95 mol %, preferably 15 to 90 mol %, and more preferably 20 to 85 mol % based on the total molar of all structural units.

RESIN preferably contains the structural unit (II) and the structural unit represented by the formula (a-1). When RESIN contains the structural unit (II) and the structural unit represented by the formula (a-1), the molar ratio of the structural unit (II) to the structural unit represented by the formula (a-1) in RESIN (the structural unit (II)/the structural unit represented by the formula (a-1)) is usually 95/5 to 5/95, preferably 90/10 to 20/80, and more preferably 85/15 to 50/50.

When the present resist composition contains RESIN, the content of RESIN is usually 1 to 95% by weight, preferably 2 to 80% by weight and more preferably 5 to 50% by weight based on the total amounts of the present polymer and RESIN.

In the present resist composition, performance deterioration caused by inactivation of acid which occurs due to post exposure delay can be diminished by adding an organic base compound, particularly a nitrogen-containing organic base compound as a quencher. The present resist composition may contain two or more kinds of organic base compounds.

Specific examples of the nitrogen-containing organic base compound include an amine compound represented by the following formulae:

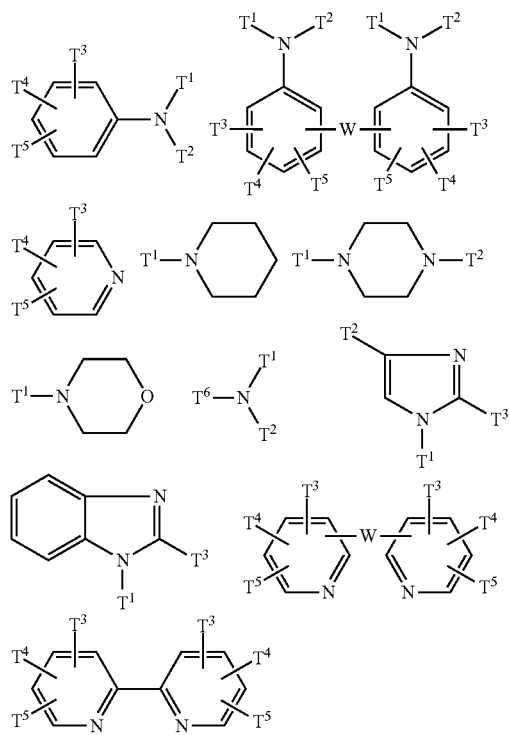

wherein $T^1$ and $T^2$ independently represent a hydrogen atom, an alkyl group, a cycloalkyl group or an aryl group, and one or more hydrogen atoms in the alkyl, cycloalkyl and aryl groups may be substituted with a hydroxyl group, an amino group which have one or two C1-C4 alkyl groups, or a C1-C6 alkoxy group, $T^3$ and $T^4$ independently represent a hydrogen atom, an alkyl group, a cycloalkyl group, an aryl group or an alkoxy group, and one or more hydrogen atoms of the alkyl, cycloalkyl, aryl and alkoxy groups may be substituted with a hydroxyl group, an amino group which may have one or more C1-C4 alkyl groups or a C1-C6 alkoxy group, or $T^3$ and $T^4$ bond together with the carbon atoms to which they bond to form an aromatic ring, $T^5$ represent a hydrogen atom, an alkyl group, a cycloalkyl group, an aryl group, an alkoxy group or a nitro group, and one or more hydrogen atoms of the alkyl, cycloalkyl, aryl and alkoxy groups may be substituted with a hydroxyl group, an amino group which may have one or two C1-C4 alkyl groups or a C1-C6 alkoxy group, $T^6$ represents an alkyl group or a cycloalkyl group, and one or more hydrogen atoms of the alkyl and cycloalkyl groups may be substituted with a hydroxyl group, an amino group which may have one or two C1-C4 alkyl groups or a C1-C6 alkoxy group, and W represents —CO—, —NH—, —S—, —S—S—, an alkylene group of which one or more —$CH_2$— may be replaced by —O—, or an alkenylene group of which one or more —$CH_2$— may be replaced by —O—, and a quaternary ammonium hydroxide represented by the following formula:

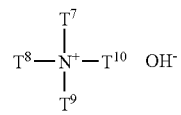

wherein $T^7$, $T^8$, $T^9$ and $T^{10}$ independently represent an alkyl group, a cycloalkyl group or an aryl group, and one or more hydrogen atoms of the alkyl, cycloalkyl and aryl groups may be substituted with a hydroxyl group, an amino group which may have one or two C1-C4 alkyl groups or a C1-C6 alkoxy group.

The alkyl group in $T^1$, $T^2$, $T^3$, $T^4$, $T^5$, $T^6$, $T^7$, $T^8$, $T^9$ and $T^{10}$ preferably has about 1 to 10 carbon atoms, and more preferably has about 1 to 6 carbon atoms.

Examples of the amino group which may have one or two C1-C4 alkyl groups include an amino group, a methylamino group, an ethylamino group, a butylamino group, a dimethylamino group and a diethylamino group. Examples of the C1-C6 alkoxy group of which one or more hydrogen atoms may be substituted with the C1-C6 alkoxy group include a methoxy group, an ethoxy group, a propoxy group, an isopropoxy group, a butoxy group, a tert-butoxy group, a pentyloxy group, a hexyloxy group and a 2-methoxyethoxy group.

Specific examples of the alkyl group of which one or more hydrogen atoms may be substituted with a hydroxyl group, an amino group which may have one or two C1-C4 alkyl groups, or a C1-C6 alkoxy group of which one or more hydrogen atoms may be substituted with a C1-C6 alkoxy group include a methyl group, an ethyl group, a propyl group, an isopropyl group, a butyl group, a tert-butyl group, a pentyl group, a hexyl group, an octyl group, a nonyl group, a decyl group, a 2-(2-methoxyethoxy)ethyl group, a 2-hydroxyethyl group, a 2-hydroxypropyl group, a 2-aminoethyl group, a 4-aminobutyl group and a 6-aminohexyl group.

The cycloalkyl group in $T^1$, $T^2$, $T^3$, $T^4$, $T^5$, $T^6$, $T^7$, $T^8$, $T^9$ and $T^{10}$ preferably has about 5 to 10 carbon atoms. Specific examples of the cycloalkyl group of which one or more hydrogen atoms may be substituted with a hydroxyl group, an amino group which may have one or two C1-C4 alkyl groups or a C1-C6 alkoxy group include a cyclopentyl group, a cyclohexyl group, a cycloheptyl group and a cyclooctyl group.

The aryl group in $T^1$, $T^2$, $T^3$, $T^4$, $T^5$, $T^6$, $T^7$, $T^8$, $T^9$ and $T^{10}$ preferably has about 6 to 10 carbon atoms. Specific examples of the aryl group of which one or more hydrogen atoms may be substituted with a hydroxyl group, an amino group which may have one or two C1-C4 alkyl groups or a C1-C6 alkoxy group include a phenyl group and a naphthyl group.

The alkoxy group in $T^3$, $T^4$ and $T^5$ preferably has about 1 to 6 carbon atoms and specific examples thereof include a methoxy group, an ethoxy group, a propoxy group, an isopropoxy group, a butoxy group, a tart-butoxy group, a pentyloxy group and a hexyloxy group.

The alkylene and alkenylene groups in W preferably have 2 to 6 carbon atoms. Specific examples of the alkylene group include an ethylene group, a trimethylene group, a tetramethylene group, a methylenedioxy group and an ethylene-1,2-dioxy group, and specific examples of the alkenylene group include an ethene-1,2-diyl group, a 1-propene-1,3-diyl group and a 2-butene-1,4-diyl group.

Specific examples of the amine compound include hexylamine, heptylamine, octylamine, nonylamine, decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane 4,4'-diamino-3,3-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetraisopropylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skeleton as disclosed in JP 11-52575 A1 can be also used as the quencher %

In the point of forming patterns having higher resolution, the quaternary ammonium hydroxide is preferably used as the quencher.

When the basic compound is used as the quencher, the present resist composition preferably includes 0.01 to 1% by weight of the basic compound based on the amount of resin component and the acid generator.

The present resist composition can contain, if necessary, a small amount of various additives such as a sensitizer, a dissolution inhibitor, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied onto the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by way of examples, which are not construed to limit the scope of the present invention. The "%" and "part(s)" used to represent the content of any component and the amount of any material used in the following examples and comparative examples are on a weight basis unless otherwise specifically noted. The weight-average molecular weight of any material used in the following examples is a value found by gel permeation chromatography using polystyrene as a standard reference material.

Monomers used in the following Examples 1 to 6 and Comparative Resin Synthesis Examples 1 to 2 are following monomers A, B, C, D and E.

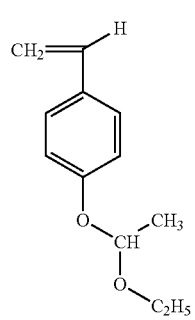

A

-continued

B
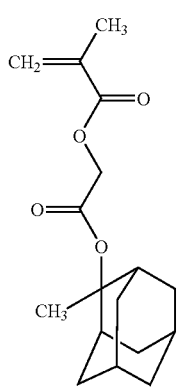

C
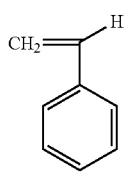

D
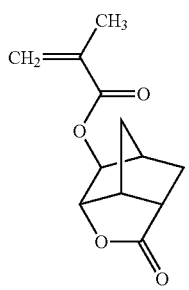

E
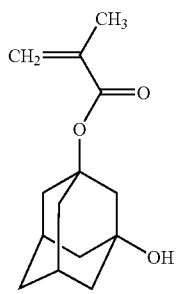

EXAMPLE 1

Into a four-necked flask equipped with a condenser, a thermometer and a stirrer, 29.1 g of 1,4-dioxane was charged followed by heating at 85° C. To this, a solution prepared by mixing 19.2 g of monomer A, 29.6 g of monomer B, 5.3 g of 2,2'-azobisisobutyronitrile and 43.6 g of 1,4-dioxane was added dropwise over 1 hour. The resultant mixture was stirred at 83° C. for 6 hours. The reaction mixture was diluted with 53.3 g of 1,4-diozane and the resultant mixture was poured into a methanol/water solution (methanol/water=7/3) to cause precipitation. The precipitate was isolated by decantation and dissolved in 145 g of methyl isobutyl ketone to obtain a solution and then, 100 g of 1% aqueous p-toluenesulfonic acid solution was added to the solution. The obtained mixture was stirred for 8 hours and washed with water. The solution was concentrated. To the obtained residue, propylene glycol monomethyl ether acetate was added. The resultant mixture was concentrated to obtain a solution containing a polymer having a weight-average molecular weight (Mw) of $4.6 \times 10^3$ and a dispersion degree (Mw/Mn) of 1.68 in a yield of 99%. This polymer had the following structural units. This is called as polymer A1.

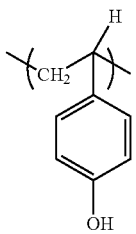 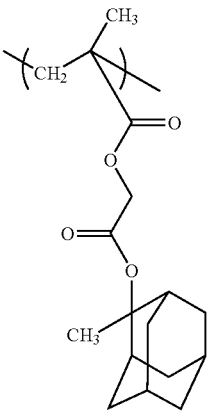

EXAMPLE 2

A solution containing a polymer having a weight-average molecular weight (Mw) of $4.6 \times 10^3$ and a dispersion degree (Mw/Mn) of 1.78 was obtained in a yield of 100% according to the same manner as that of Example 1, except that 19.2 g of monomer A, 17.9 g of monomer B, 4.2 g of monomer C and 4.6 g of 2,2'-azobisisobutyronitrile were used in place of 19.2 g of monomer A, 29.6 g of monomer B and 5.3 g of 2,2'-azobisisobutyronitrile. This polymer had the following structural units. This is called as polymer A2.

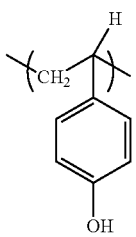 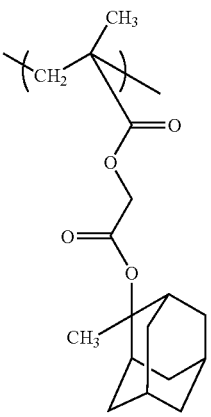

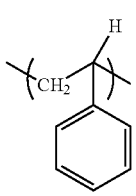

EXAMPLE 3

A solution containing a polymer having a weight-average molecular weight (Mw) of $6.4 \times 10^3$ and a dispersion degree (Mw/Mn) of 1.96 was obtained in a yield of 98% according to the same manner as that of Example 1, except that 19.2 g of monomer A, 17.9 g of monomer B, 8.9 g of monomer D and 4.6 g of 2,2'-azobisisobutyronitrile were used in place of 19.2 g of monomer A, 29.6 g of monomer B and 5.3 g of 2,2'-azobisisobutyronitrile. This polymer had the following structural units. This is called as polymer A3.

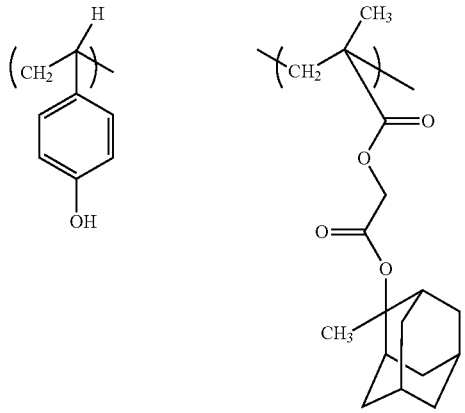

EXAMPLE 4

A solution containing a polymer having a weight-average molecular weight (Mw) of $4.9 \times 10^3$ and a dispersion degree (Mw/Mn) of 1.81 was obtained in a yield of 97% according to the same manner as that of Example 1, except that 23.1 g of monomer A, 17.9 g of monomer B, 4.7 g of monomer E and 4.6 g of 2,2'-azobisisobutyronitrile were used in place of 19.2 g of monomer A, 29.6 g of monomer B and 5.3 g of 2,2'-azobisisobutyronitrile. This polymer had the following structural units. This is called as polymer A4.

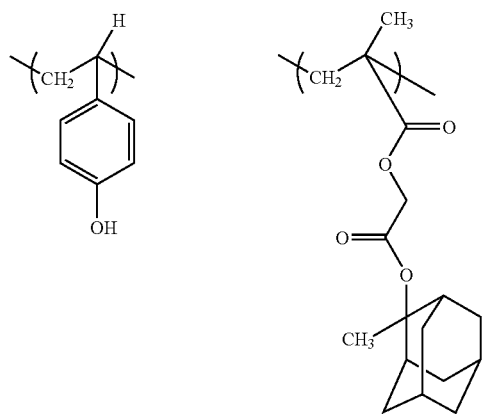

-continued

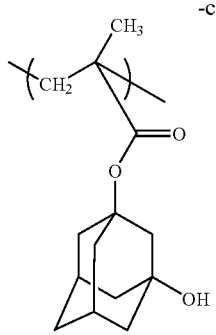

EXAMPLE 5

A solution containing a polymer having a weight-average molecular weight (Mw) of $4.3 \times 10^3$ and a dispersion degree (Mw/Mn) of 1.64 was obtained in a yield of 97% according to the same manner as that of Example 1, except that 11.5 g of monomer A, 17.5 g of monomer B, 7.1 g of monomer E and 3.5 g of 2,2'-azobisisobutyronitrile were used in place of 19.2 g of monomer A, 29.6 g of monomer B and 5.3 g of 2,2'-azobisisobutyronitrile. This polymer had the following structural units. This is called as polymer A5.

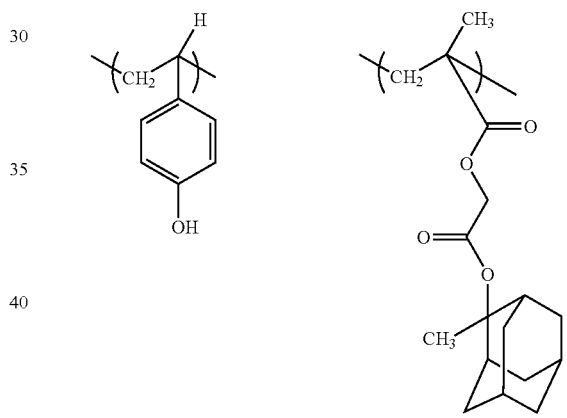

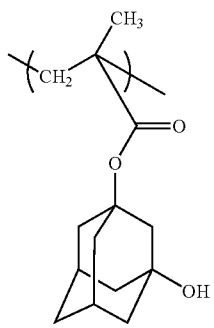

EXAMPLE 6

A solution containing a polymer having a weight-average molecular weight (Mw) of $4.2 \times 10^3$ and a dispersion degree (Mw/Mn) of 1.71 was obtained in a yield of 99% according to the same manner as that of Example 1, except that 15.4 g of monomer A, 17.5 g of monomer B, 6.3 g of monomer C and 4.6 g of 2,2'-azobisisobutyronitrile were used in place of 19.2 g of monomer A, 29.6 g of monomer B and 5.3 g of 2,2'- azobisisobutyronitrile. This polymer had the following structural units. This is called as polymer A6.

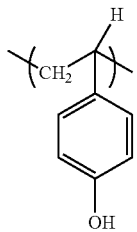
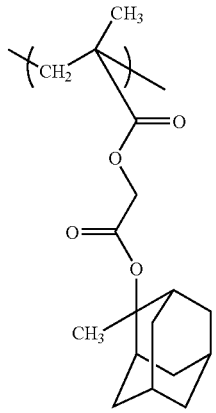

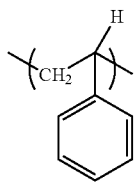

COMPARATIVE RESIN SYNTHESIS EXAMPLE 1

A copolymer of 2-ethyl-2-adamantyl methacrylate and p-hydroxystyrene was synthesized according to a method described in JP 2003-107708 A. This copolymer had the following structural units. This is called as Polymer B1.

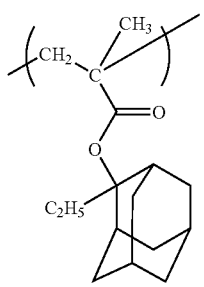
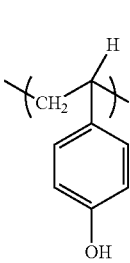

Molar ratio of the structural units in Polymer B1 was as followed:
structural unit derived from 2-ethyl-2-adamantyl methacrylate:
structural unit derived from p-hydroxystyrene 20:80

COMPARATIVE RESIN SYNTHESIS EXAMPLE 2

A copolymer of 2-ethyl-2-adamantyl methacrylate and p-hydroxystyrene was synthesized according to a method described in JP 2003-107708 A. This copolymer had the following structural units. This is called as Polymer B2.

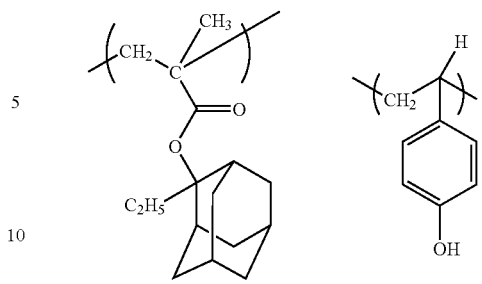

Molar ratio of the structural units in Polymer B2 was as followed:
structural unit derived from 2-ethyl-2-adamantyl methacrylate:
structural unit derived from p-hydroxystyrene=30:70

EXAMPLES 7 to 17 and COMPARATIVE EXAMPLES 1 and 2

<Acid Generator>
Acid Generator P1:
triphenylsulfonium 2,4,6-triisopropylbenzenesulfonate
Acid Generator P2:
N-(butylsulfonyloxy)succinimide
Acid Generator P3:
triphenylsulfonium 4-oxo-1-adamantyloxycarbonyldifluoromethanesulfonate
Acid Generator P4:
(4-methylphenyl)diphenylsulfonium perfluorobutanesulfonate
Acid Generator P5:
triphenylsulfonium [3-(4-tolyl)-1-adamantylmethoxycarbonyl]difluoromethanesulfonate
<Resin>
Polymer A1
Polymer A2
Polymer A3
Polymer A4
Polymer A5
Polymer A6
Polymer B1
Polymer B2
<Quencher>
Q1: 2,6-diisopropylaniline
Q2: tetrabutylammonium hydroxide
Q3: tris(2-hydroxy-3-propyl)amine
Q4: tris[2-(2-methoxyethoxy)ethyl]amine
<Solvent>

| S1: | propylene glycol monomethyl ether acetate | 420 parts |
| | propylene glycol monomethyl ether | 60 parts |
| S2: | propylene glycol monomethyl ether acetate | 450 parts |
| | propylene glycol monomethyl ether | 40 parts |
| | γ-butyrolactone | 5 parts |
| S3: | propylene glycol monomethyl ether acetate | 380 parts |
| | propylene glycol monomethyl ether | 150 parts |
| | γ-butyrolactone | 5 parts |

The following components were mixed and dissolved, further, filtrated through a fluorine resin filter having pore diameter of 0.2 µm, to prepare resist liquid.
Resin (kind and amount are described in Table 1)
Acid generator (kind and amount are described in Table 1)
Quencher (kind and amount are described in Table 1)
Solvent (kind is described in Table 1)

TABLE 1

| Ex. No. | Polymer (kind/amount (part)) | Acid generator (kind/amount (part)) | Quencher (kind/amount (part)) | Solvent |
|---|---|---|---|---|
| Ex. 7 | A1/10 | P1/1 P2/1 | Q1/0.055 | S1 |
| Ex. 8 | A2/10 | P1/1 P2/1 | Q1/0.055 | S1 |
| Ex. 9 | A1/10 | P3/1.5 | Q1/0.075 Q2/0.005 | S2 |
| Ex. 10 | A2/10 | P3/1.5 | Q1/0.075 Q2/0.005 | S2 |
| Ex. 11 | A3/10 | P3/1.5 | Q1/0.075 Q2/0.005 | S2 |
| Ex. 12 | A4/10 | P3/1.5 | Q1/0.075 Q2/0.005 | S2 |
| Ex. 13 | A1/5 A2/5 | P1/2 | Q1/0.07 | S3 |
| Ex. 14 | A1/5 A3/5 | P5/4 | Q3/0.2 | S3 |
| Ex. 15 | A1/5 A4/5 | P1/1 P2/1 P5/2 | Q4/0.15 | S3 |
| Ex. 16 | A2/5 B2/5 | P3/2 P4/2 | Q2/0.2 | S3 |
| Ex.17 | A1/3.75 A2/2.5 A3/1.25 A4/1.25 B2/1.25 | P1/0.75 P2/0.25 P3/0.5 P4/0.5 P5/1.5 | Q1/0.0175 Q2/0.05 Q3/0.05 Q4/0.0375 | S3 |
| Comp. Ex. 1 | B1/5 B2/5 | P1/1 P2/1 | Q1/0.055 | S1 |
| Comp. Ex. 2 | B1/5 B2/5 | P3/1.5 | Q1/0.075 Q2/0.005 | S2 |

Silicon wafers were each contacted with hexamethyldisilazane at 90° C. for 60 seconds on a direct hotplate. Each of the resist compositions prepared as above was spin-coated over the wafers so that the thickness of the resulting film became 0.06 µm after drying. The silicon wafers thus coated with the respective resist compositions were each prebaked on a direct hotplate at a temperature shown in column of "PB" of Table 2 for 60 seconds. Using a writing electron beam lithography system ("HL-800D" manufactured by Hitachi, Ltd., 50 KeV), each wafer on which the respective resist film had been thus formed was exposed to a line and space pattern, while changing stepwise the exposure quantity.

After the exposure, each wafer was subjected to post-exposure baking on a hotplate at a temperature shown in column of "PEB" of Table 2 for 60 seconds and then to paddle development for 60 seconds with an aqueous solution of 2.38 wt % tetramethylammonium hydroxide.

Each of a resist pattern developed on the organic anti-reflective coating substrate after the development was observed with a scanning electron microscope, the results of which are shown in Table 2.

Effective Sensitivity (ES): It was expressed as the amount of exposure that the line pattern and the space pattern become 1:1 after exposure through 0.08 µm line and space pattern mask and development.

Resolution: It is expressed as the minimum size of space pattern which gave the space pattern split by the line pattern at the exposure amount of the effective sensitivity.

Pattern Profile: The space pattern which gave the 0.10 µm line and space pattern at the exposure amount of the effective sensitivity after conducting a lithography process were observed by a scanning electron microscope. When the cross-section shape of the pattern is rectangle, the pattern profile is good and its evaluation is marked by "○", when the upper of the pattern was melted and the pattern became smaller, the pattern profile is bad and its evaluation is marked by "X" and when the upper of the pattern was melted, the pattern became smaller, the cross-section shape of the pattern is taper shape and an angle of the side wall of the patter was 70° or less, the pattern profile is very bad and its evaluation is marked by "XX".

Line Edge Roughness (LER): The space pattern which gave the 0.08 µm line and space (1:1) pattern after conducting a lithography process were observed by a scanning electron microscope from upper side. When the side wall surface of the pattern was smooth, LER is good and its evaluation is marked by "○", and when the side wall surface of the pattern was wavy, LER is bad and its evaluation is marked by "X".

TABLE 2

| Ex. No. | PB (° C.) | PEB (° C.) | ES (µC) | Resolution (nm) | Pattern Profile | LER |
|---|---|---|---|---|---|---|
| Ex. 7 | 125 | 110 | 44 | 70 | ○ | ○ |
| Ex. 8 | 125 | 110 | 46 | 70 | ○ | ○ |
| Ex. 9 | 100 | 100 | 46 | 50 | ○ | ○ |
| Ex. 10 | 100 | 100 | 50 | 50 | ○ | ○ |
| Ex. 11 | 100 | 100 | 44 | 50 | ○ | ○ |
| Ex. 12 | 95 | 100 | 42 | 50 | ○ | ○ |
| Ex. 13 | 100 | 100 | 96 | 60 | ○ | ○ |
| Ex. 14 | 100 | 100 | 40 | 50 | ○ | ○ |
| Ex. 15 | 100 | 100 | 64 | 60 | ○ | ○ |
| Ex. 16 | 100 | 100 | 36 | 50 | ○ | ○ |
| Ex. 17 | 100 | 100 | 48 | 60 | ○ | ○ |
| Comp. Ex. 1 | 125 | 110 | 10 | 70 | X | X |
| Comp. Ex. 2 | 100 | 100 | 20 | 90 | XX | X |

EXAMPLES 18 to 20

The following components were mixed and dissolved, further, filtrated through a fluorine resin filter having pore diameter of 0.2 µm, to prepare resist liquid.
Resin (kind and amount are described in Table 3)
Acid generator (kind and amount are described in Table 3)
Quencher (kind and amount are described in Table 3)
Solvent (kind is described in Table 3)

TABLE 3

| Ex. No. | Polymer (kind/amount (part)) | Acid generator (kind/amount (part)) | Quencher (kind/amount (part)) | Solvent |
|---|---|---|---|---|
| Ex. 18 | A5/10 | P1/1.5 | Q1/0.04 Q2/0.005 | S2 |
| Ex. 19 | A6/10 | P1/1.5 | Q1/0.05 Q2/0.005 | S2 |
| Ex. 20 | A5/10 | P1/3 | Q1/0.08 Q2/0.005 | S2 |

Silicon wafers were each contacted with hexamethyldisilazane at 90° C. for 60 seconds on a direct hotplate. Each of the resist compositions prepared as above was spin-coated over the wafers so that the thickness of the resulting film became 0.06 µm after drying. The silicon wafers thus coated with the respective resist compositions were each prebaked on a direct hotplate at a temperature shown in column of "PB" of Table 4 for 60 seconds. Using an EUV exposure system, each wafer on which the respective resist film had been thus formed was exposed to a line and space pattern, while changing stepwise the exposure quantity.

After the exposure, each wafer was subjected to post-exposure baking on a hotplate at a temperature shown in column of "PEB" of Table 4 for 60 seconds and then to paddle development for 60 seconds with an aqueous solution of 2.38 wt % tetramethylammonium hydroxide.

Each of a resist pattern developed on the organic anti-reflective coating substrate after the development was observed with a scanning electron microscope, the results of which are shown in Table 4.

Effective Sensitivity (ES): It was expressed as the amount of exposure that the line pattern and the space pattern become 1:1 after exposure through 0.03 µm line and space pattern mask and development.

Resolution: It is expressed as the minimum size of space pattern which gave the space pattern split by the line pattern at the exposure amount of the effective sensitivity.

Pattern Profile: The space pattern which gave the 0.04 µm line and space pattern at the exposure amount of the effective sensitivity after conducting a lithography process were observed by a scanning electron microscope. When the cross-section shape of the pattern is rectangle, the pattern profile is good and its evaluation is marked by "○", when the upper of the pattern was melted and the pattern became smaller, the pattern profile is bad and its evaluation is marked by "X" and when the upper of the pattern was melted, the pattern became smaller, the cross-section shape of the pattern is taper shape and an angle of the side wall of the patter was 70° or less, the pattern profile is very bad and its evaluation is marked by "XX".

Line Edge Roughness (LER): The space pattern which gave the 0.04 µm line and space (1:1) pattern after conducting a lithography process were observed by a scanning electron microscope from upper side. When the side wall surface of the pattern was smooth, LER is good and its evaluation is marked by "○", and when the side wall surface of the pattern was wavy, LER is bad and its evaluation is marked by "X".

TABLE 4

| Ex. No. | PB (° C.) | PEB (° C.) | ES (mJ/cm²) | Resolution (nm) | Pattern Profile | LER |
| --- | --- | --- | --- | --- | --- | --- |
| Ex. 18 | 100 | 100 | 15 | 26 | ○ | ○ |
| Ex. 19 | 100 | 110 | 10 | 28 | ○ | ○ |
| Ex. 20 | 100 | 100 | 8 | 28 | ○ | ○ |

The present polymer is a novel polymer and a resist composition comprising the same provides good resist pattern in resolution, pattern profile and line edge roughness, and is especially suitable for extreme ultraviolet (EUV) lithography, X-ray lithography and electron beam lithography.

What is claimed is:

1. A polymer comprising a structural unit represented by the formula (I):

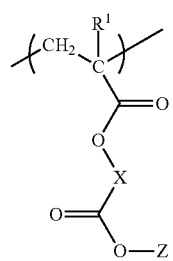

wherein $R^1$ represents a hydrogen atom or a methyl group, X represents a linear or branched chain C1-C6 alkylene group, Z represents a group represented by the formula (Ia):

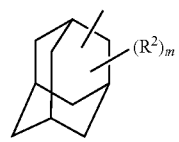

wherein $R^2$ is independently in each occurrence a linear or branched chain C1-C6 alkyl group and m represents an integer of 0 to 15, and a structural unit represented by the formula (II):

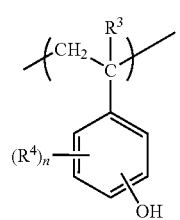

wherein $R^3$ represents a hydrogen atom or a methyl group, $R^4$ is independently in each occurrence a linear or branched chain C1-C6 alkyl group and n represents an integer of 0 to 4.

2. The polymer according to claim 1, wherein the polymer further contains at least one structural unit selected from the group consisting of a structural unit derived from styrene, a structural units having one or more hydroxyl groups in its side chain other than the structural unit represented by the formula (II) and a structural unit having a lactone ring.

3. The polymer according to claim 2, wherein the structural units having one or more hydroxyl groups in its side chain other than the structural unit represented by the formula (II) is a structural unit represented by the formula (III):

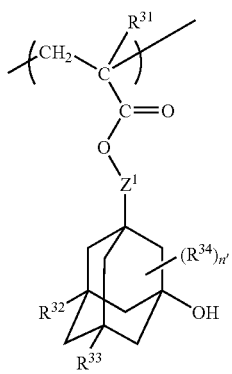

(III)

wherein R³¹ represents a hydrogen atom or a methyl group, R³² and R³³ each independently represents a hydrogen atom, a methyl group or a hydroxyl group, R³⁴ represents a methyl group, n' represents an integer of 0 to 10, Z¹ represents a single bond or —(CH$_2$)$_y$—CO—O— and y represents an integer of 1 to 4.

4. The polymer according to claim 2, wherein the structural unit having a lactone ring is a structural unit represented by the formula (IVa), (IVb) or (IVc):

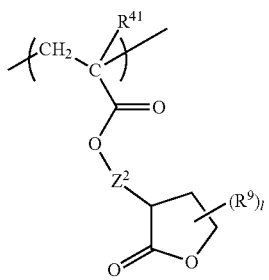

(IVa)

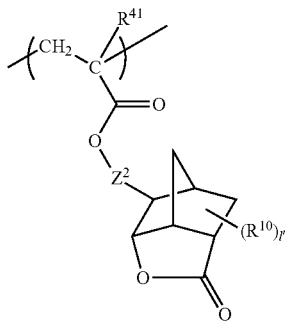

(IVb)

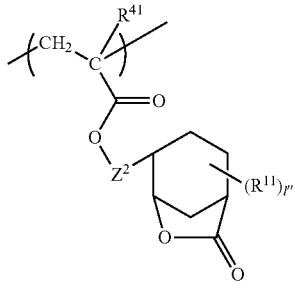

(IVc)

wherein R⁴¹ represents a hydrogen atom or a methyl group, R⁹ represents a methyl group, Z² represents a single bond or —(CH$_2$)$_z$—CO—O—, z represents an integer of 1 to 4, R¹⁰ is independently in each occurrence a carboxyl group, a cyano group, or a C1-C4 aliphatic hydrocarbon group, l represents an integer of 0 to 5, l' represents an integer of 0 to 9 and l" represents an integer of 0 to 9.

5. The polymer according to claim 2, wherein the structural unit having a lactone ring is a structural unit represented by the formula (IVb):

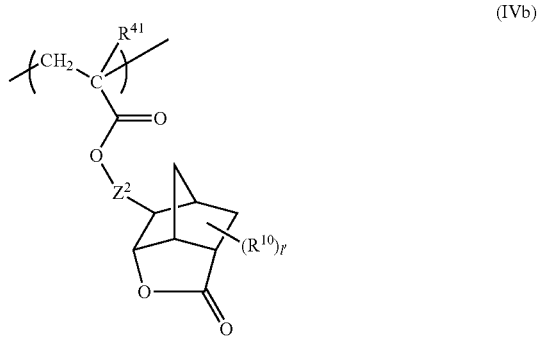

(IVb)

wherein R⁴¹ represents a hydrogen atom or a methyl group, Z² represents a single bond or —(CH$_2$)$_z$—CO—O—, z represents an integer of 1 to 4, R¹⁰ is independently in each occurrence a carboxyl group, a cyano group, or a C1-C4 aliphatic hydrocarbon group, and l' represents an integer of 0 to 9.

6. A resist composition comprising the polymer according to any one of claims 1 to 5 and an acid generator.

7. The resist composition according to claim 6, wherein the acid generator is a salt represented by the formula (V):

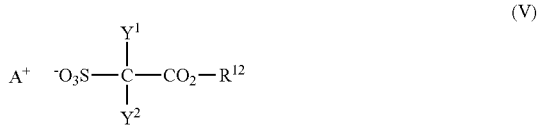

(V)

wherein A⁺ represents an organic counter ion, Y¹ and Y² each independently represent a fluorine atom or a C1-C6 perfluoroalkyl group, R¹² represents a C1-C30 hydrocarbon group which may have one or more substituents selected from the group consisting of a C1-C6 alkoxy group, a C1-C4 perfluoroalkyl group, a C1-C6 hydroxyalkyl group, a hydroxyl group and a cyano group, and in which one or more —CH$_2$— may be replace by —CO— or —O—.

8. A method of producing a resist composition for extreme ultraviolet lithography or electron beam lithography comprising the steps of:
  a) mixing the polymer according to any one of claims 1 to 5 with a solvent, and
  b) producing a resist composition.

9. A method of producing a resist composition for extreme ultraviolet lithography or electron beam lithography comprising the steps of:
  a) mixing the polymer of claim 1 with an acid generator and a solvent; and
  b) producing a resist composition.

* * * * *